(12) United States Patent
Komoto et al.

(10) Patent No.: US 6,864,627 B2
(45) Date of Patent: Mar. 8, 2005

(54) IMAGE DISPLAY DEVICE AND LIGHT EMISSION DEVICE

(75) Inventors: Satoshi Komoto, Tokyo-To (JP); Masayuki Ishikawa, Yokohama (JP); Tadashi Umeji, Kitakyushu (JP); Kuniaki Konno, Kitakyushu (JP); Koichi Nitta, Yokohama (JP); Haruhiko Okazaki, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 10/436,157

(22) Filed: May 13, 2003

(65) Prior Publication Data

US 2003/0214616 A1 Nov. 20, 2003

Related U.S. Application Data

(62) Division of application No. 09/080,300, filed on May 18, 1998, now Pat. No. 6,586,874.

(30) Foreign Application Priority Data

May 16, 1997 (JP) .............................................. 9-127426

(51) Int. Cl.[7] .............................. H01J 1/62; H01L 33/00
(52) U.S. Cl. ....................... 313/503; 313/512; 257/100; 257/103

(58) Field of Search ................................. 313/501, 502, 313/503, 504, 505, 506, 512; 257/99, 100, 102, 103, 89, 98; 349/61, 69, 70

(56) References Cited

U.S. PATENT DOCUMENTS

| | | | |
|---|---|---|---|
| 5,453,405 A | * | 9/1995 | Fan et al. .................... 438/34 |
| 5,847,507 A | | 12/1998 | Butterworth et al. |
| 5,895,932 A | * | 4/1999 | Bojarczuk et al. .......... 257/103 |
| 5,900,647 A | | 5/1999 | Inoguchi |
| 5,965,907 A | * | 10/1999 | Huang et al. ................. 257/89 |
| 5,998,925 A | | 12/1999 | Shimizu et al. |
| 5,999,237 A | * | 12/1999 | Miyawaki .................... 349/57 |
| 6,222,203 B1 | * | 4/2001 | Ishibashi et al. .............. 257/88 |

* cited by examiner

*Primary Examiner*—Toan Ton
*Assistant Examiner*—Tai Duong
(74) *Attorney, Agent, or Firm*—Oblon, Spivak, McClelland, Maier & Neustadt, P.C.

(57) ABSTRACT

An image display device including a light emission section which emits light to an intensity adjusting section and a wavelength conversion section which change the intensity and wavelength of the emitted light. Phosphors and phosphor like materials are employed in wavelength conversion and a liquid crystal is employed for the light adjustment. The light emission device may include plural semiconductor light emitting elements having a different wavelength ranges such as diodes stacked in a compact and predetermined order such that wavelengths of light from each diode are emitted from the light emitting elements.

3 Claims, 44 Drawing Sheets

IMAGE DISPLAY DEVICE AND LIGHT EMISSION DEVICE

CROSS-REFERENCE TO RELATED APPLICATIONS

This is a Divisional Application of application Ser. No. 09/080,300, filed May 18, 1998 now U.S. Pat. No. 6,586,874. This application is based upon and claims the benefit of priority from Japanese Patent Application No. 127426/1997, filed May 16, 1997, the entire contents of which are incorporated herein by reference.

BACKGROUND OF THE INVENTION

The present invention relates to an image display device and a light emission device, more particularly to an image display device of a small size with high performance and high reliability and a light emission device which is suitable for various kinds of uses including a light source of the image display device.

An image display device plays a role as an interface that visually connect various kinds of electrical equipment and human beings. In the present information society, the role of image display devices is essential, and the image display device is a key component in a wide field that includes television sets, computers, information terminals, game machines and household electronic appliances. At the same time, development of new high performance image display devices is desired to meet the needs of the present information society as it rapidly develops and increases in diversity.

For such image displaying devices, a Braun tube and a liquid crystal display device have been mainly used. The Braun tube scans an electron beam in a glass tube sealed to produce a vacuum and excites fluorescent bodies arranged on a shadow mask, thereby displaying an image. The Braun tube can be manufactured relatively low in cost, and is capable of displaying high quality images. Therefore, in general, the Braun tube is widely used as an image display device for television sets, computer monitors, etc.

On the other hand, a liquid crystal display device applies a designated electric field to a liquid crystal layer held between two substrates, thereby changing an optical property of the liquid crystal layer to display changes of intensities of transmitted light and reflected light in the form of a predetermined image. When the liquid crystal display device is compared with the Braun tube, the liquid crystal display device has an advantage that it is thin in thickness and light in weight. Liquid crystal display devices are used in electronic equipment such as notebook computers and various kinds of portable information console units.

With the development of the foregoing electronic equipment and the advancement of the information society, image display devices must be made smaller in size, lighter in weight, and display an image with higher quality and reliability.

However, the Braun tube has structural problems because it is large in length in its tube direction, heavy in weight, and since it is a vacuum glass tube, it has an insufficient durability against vibrations and shocks.

On the other hand, a conventional liquid crystal display device uses a cathode fluorescent tube as its light source, which meets manufacturers needs for a small-sized, thin cathode fluorescent tube having long life, in addition to having display luminance. However, there is a problem in liquid crystal display devices, that the visual field angle is narrower than that of the Braun tube, so that image recognition from an oblique direction is significantly poor.

The present invention was made from the viewpoint of the above described circumstances. Specifically, the object of the present invention is to provide an image display device which is easy to manufacture, small in size, light in weight, having has a wide visual filed angle, capable of displaying a high quality image, and having a high reliability, and to provide a light emission device which is suitably used for a light source of such image display device and for other various kinds of uses.

SUMMARY OF THE INVENTION

Accordingly, one object of the present invention is to provide a novel image display device that comprises a light source section which includes a semiconductor light emitting element as a light source, a light adjustment section which adjusts an intensity of a light emitted from the light source section for each of pixels, and transmits the pixels as a transmission light. The image display device also includes a wavelength change section which receives the transmission light transmitted from the light adjustment section and emits light having an intensity spectrum different from that of the transmission light.

The light adjustment section in the image display device adjusts the intensity of the transmission light by a liquid crystal cell, and the wavelength change section comprises a phosphor.

The semiconductor light emitting element of the light source section is the one which emits a light exhibiting a light emission spectrum having a peak wavelength in a ultraviolet region. The wavelength change section comprises three kinds of phosphors arranged according to a predetermined pixel pattern. The three kinds of the phosphors are the ones which convert the said transmission light into visible rays of lights of red, green and blue wavelength zones, respectively, whereby the image display device can display a clear and bright image with a low power consumption.

Moreover, the semiconductor light emitting element comprises a gallium nitride type semiconductor as a light emitting layer, in which a peak wavelength of a light emission spectrum is set to be at a range of 360 nanometer to 380 nanometer. The wavelength change section uses a phosphor exhibiting an absorption excitation peak in a wavelength region which is substantially the same as that of the said peak wavelength of the foregoing phosphors, whereby an image display device of a high efficiency can be provided.

Moreover, a light transmitting substrate of the light adjustment section is formed of a low alkali glass, a no-alkali glass or a quartz glass, whereby the absorption of a ultra violet ray is reduced so that a luminance is increased.

Moreover, by providing an ultra violet absorption filter in the wavelength change section, it is possible to suppress the entry of a ultra violet ray from the outside as well as the leakage of a ultra violet ray emitted from the semiconductor light emitting element to the outside.

Moreover, the semiconductor light emitting element exhibits a light emission spectrum, in which the peak wavelength is at a blue range. The wavelength conversion section comprises two kinds of phosphors and one kind of filters, arranged according to a predetermined pixel pattern. The two kinds of phosphors are organic phosphors which convert the foregoing transmission light to a visual light in a wavelength zone such as red or green zone and one kind of filter transmit the foregoing transmission light, so that the image display device with a high efficiency can be provided.

On the other hand, the image display of the present invention may be alternatively constituted in such a manner that a light source section including a semiconductor light emitting element as a light source, a wavelength change section which receives light emitted from the semiconductor light emitting element and emits a light exhibiting a different intensity spectrum from that of the received light, and a light adjustment section which adjusts the intensity of the light emitted from said wavelength change section, corresponding to each pixel of an image to be displayed, and transmits it as a transmission light.

Moreover, the semiconductor light emitting element as the light source of the image display device emits a light exhibiting a light emission spectrum, a peak wavelength of which is in an ultraviolet ray range, and the phosphors convert the lights emitted from the said light conduction plate to visible lights having respective peaks in wavelengths zones of red, green and blue thereof.

Moreover, the light adjustment section comprises either a guest-host type liquid crystal or a high polymer diversion type liquid crystal. To keep balance of luminance for every color, the pixel pattern has different pixel area depending on each color, and the light source sections may be constructed in various types, whereby it will make it possible to display a clear image with a high efficiency.

Moreover, the image display device of the present invention comprises a light source section having a semiconductor light emitting element and a movable reflection mirror in the light source section, and a wavelength change section which receives a light emitted from said light source section to emit it after changing its intensity spectrum, wherein the light from the semiconductor light emitting element is reflected by moving the movable reflection mirror and the reflected light is incident onto a predetermined position of said wavelength change section.

Moreover, the image display device of the present invention may comprise a variable lens instead of the movable reflection mirror.

On the other hand, the light emitting element of the present invention comprises a light emitting diode which includes a gallium nitride type compound semiconductor as a light emitting layer and a phosphor which is deposited in at least one portion of a surface of the light emitting diode, wherein the light emitted from the light emitting diode is subjected to a wavelength change by said phosphor and is emitted to an outside of the light emitting diode.

Moreover, the light emitting element of the present invention comprises a mounting material, the light emitting diode which includes a gallium nitride type compound semiconductor as a light emitting layer mounted on the mounting material, and resin molding the light emitting diode, wherein a phosphor is deposited on a surface of the resin and the light emitted from the light emitting diode is subjected to a wavelength change by the phosphor and is emitted to the outside.

Alternatively, the light emitting element of the present invention comprises a mounting member, the light emitting diode mounted on the mounting member, and resin which molds the light emitting diode, wherein said mounting member comprises a reflection plate provided around the mounting member of the light emitting diode and a phosphor deposited on a surface of the reflection plate, and wherein a light emitted from the light emitting diode is subjected to a wavelength change by the phosphor and is emitted to the outside.

Alternatively, the light emitting element of the present invention comprises a light transmission substrate, a layer formed of a phosphor stacked on the light transmission substrate, and a light emitting diode which includes a gallium nitride type compound semiconductor as a light emitting layer, being mounted on the phosphor layer, wherein a light emitted from the light emitting diode is subjected to a wavelength change by the phosphor layer, and is emitted to the outside after transmitting through the light transmission substrate.

Or, the light emitting element of the present invention comprises a light emitting diode having a multi-layered structure composed of a plurality of semiconductor layers including at least one gallium nitride type compound semiconductor, wherein at least one of said semiconductor layers includes a phosphor which performs a wavelength change for a light emitted from said light emitting diode and emits it to the outside.

Or, the light emitting element of the present invention comprises a plurality of light emitting diodes, each of which emits a light of a wavelength different from those emitted from other light emitting diodes and is stacked so as not to shade the light emitted from other diodes when viewed from a light exiting direction, wherein the light emitted from each of the light emitting diodes can be taken from the light exiting direction.

According to the present invention, it is possible to provide an image display device which is capable of displaying an image with a very wide visual field angle compared to an ordinary liquid crystal display device, the image being recognized clearly even when viewed obliquely.

According to the present invention, it is possible to provide an image display device which is capable of displaying a distinctive image without blur and vagueness.

According to the present invention, since in the image display device of the present invention the light source section employs the semiconductor light emitting element as a light source, the image display device can exhibit an extremely high photoelectric conversion efficiency and has an ability to reduce power consumption compared to the conventional image display device such as the liquid crystal display device.

According to the present invention, the image display device of the present invention employs the semiconductor light emitting element as a light source, whereby a high photoelectric conversion efficiency can be achieved and the power consumption can be reduced compared to the conventional cathode fluorescent tube. For example, the power consumption of a 10.4 inch type thin film transistor (TFT) liquid crystal display device using the conventional cathode fluorescent tube as a light source is about 9 watts. On the contrary, the power consumption of the image display device adopting an ultra violet LED and the phosphor is about 4 watts, specifically, the power consumption is reduced to be less than half of that of the conventional liquid crystal display device. As a result, battery life of portable electronic equipment such as a notebook type computer and various kinds of information portable console units which incorporate the image display device of the present invention can be prolonged.

Moreover, according to the present invention, in the light source section of the image display device, the circuit thereof is simplified compared to the conventional cathode fluorescent tube, where the driving voltage for the light source section can be reduced. Specifically, the conventional cathode fluorescent tube had to be applied with a high voltage via a stabilizing circuit or an inverter. However, according to the present invention, the semiconductor light emitting element serving as a light source has an ability to provide a sufficient light emission intensity with a DC voltage as low as 2 to 3.5 volts. Therefore, there is no need of a stabilizing circuit or an inverter circuit for the semiconductor light emitting element, so that the driving circuit for the light source is greatly simplified and the driving voltage for driving the light source can be reduced.

Moreover, according to the present invention, the life time of the light source incorporated in the image display device can be significantly prolonged than that of the conventional image display device. Specifically, in a conventional cathode fluorescent tube, luminance is rapidly lowered after the passage of a predetermined life time period due to sputtering phenomenon at the light source section, and light emission stops. According to the present invention, reduced luminance is rarely found even when the light source has been used for an extremely long time as long as several tens of thousands of hours, and the life time of the light source can be said to be quasi-permanent.

Moreover, the image display device of the present invention has a very short rise-up time for the light emission. Specifically, the period of time from a signal input for starting of driving to a stationary state in the light emission is very short compared to the conventional cathode fluorescent tube so that the image display device of the present invention is capable of starting an operation instantaneously.

According to the present invention, the reliability of the image display device of the present invention can be increased. Specifically, the conventional cathode fluorescent tube has a structure that seals a specified gas in a glass tube. Therefore, in some cases, the cathode fluorescent tube is broken by excessive shock and vibration. According to the present invention, however, since the semiconductor light emitting element that is a solid state element is used as a light source, reliability against shock and vibration increases remarkably.

Moreover, according to the present invention, there is no need of harmful mercury. Specifically, in the conventional cathode fluorescent tube, a designated amount of mercury is often sealed in its glass tube. The image display device of the present invention need not use such harmful mercury.

Moreover, the light emitting element of the present invention is small in size, thin in thickness, and exhibits high luminance and is reliable. A plurality of emitted lights having different wavelengths such as red, green and blue colors can be simultaneously produced from the light emitting element of the present invention. As described above, according to the present invention, provided are the image display device and the light emitting element which have simple constitutions and are small in size with a high reliability. In addition, excellent industrial advantages, including those described above and hereinafter, can be brought about by the present invention.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE PREFERRED EMBODIMENTS

Figure 1:
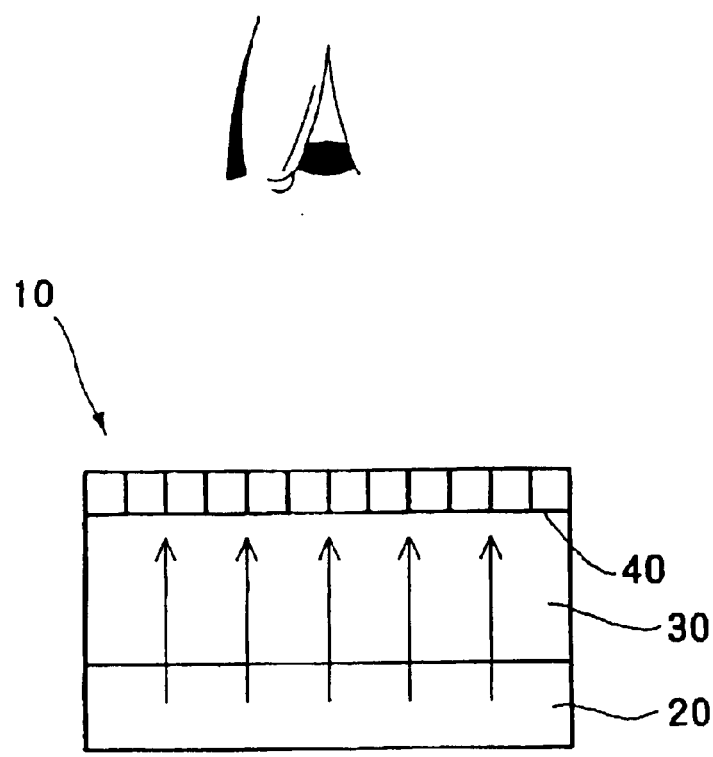
FIG. 1 is an illustration of a sectional view showing an outline of a constitution of an image display device according to a first embodiment of the present invention.

Referring now to the drawings, wherein like reference numerals designate identical or corresponding parts throughout the several views, and more particularly to FIG. 1, thereof, the present invention provides an image display device which is capable of displaying a high quality image with a wide visual field angle and a low power consumption, by combining in various forms a material having a wavelength conversion function, a light adjustment mechanism for adjusting an intensity of a transmission light and a semiconductor light emitting element. Moreover, the present invention provides a small-sized light emission device which emits a plurality of lights with high luminance, each of the lights having a different wavelength.

In FIG. 1 there is provided a sectional view showing an outline of a constitution of an image display device according to a first embodiment of the present invention. Specifically, the image display device 10 of the present invention comprises a light source section 20, a light adjustment section 30, and a wavelength conversion section 40. Or, the image display device 10 may comprise a wavelength selection section 40 instead of the wavelength conversion section 40. The light source section 20 includes semiconductor light emitting elements appropriately arranged therein, and emit light incident onto the light adjustment section 30. The light has predetermined wavelength and quantity of lights, and exhibits a predetermined luminance distribution.

The light adjustment section 30 adjusts the light incident from the light source section 20 thereinto every pixel, and transmits the adjusted light through the wavelength conversion section 40, which appropriately changes the wavelength of the light incident from the light adjustment section 30, and emits the light outside of the image display device 10.

According to the present invention, a spatial intensity distribution of the light emitted from the wavelength conversion section or the wavelength selection section 40 can be approximated to an intensity distribution displayed by an aggregate of point light sources formed by the wavelength conversion section 40 as the light source. Therefore, there is an extremely wide angle of visual field compared to ordinary liquid crystal display devices, and the image display device of the present invention is capable of displaying an image clearly recognized even when it is observed from an oblique angle.

According to the present invention, the light emitted from the wavelength conversion section 40 is directly output without passing through the light adjustment section 30. The wavelength of the light being changed by the wavelength conversion section 40 is disposed in the front plane of the image display device 10. Therefore, no blur or vignette are produced, and a distinct image can be obtained.

According to the present invention, the light source section 20 employs the semiconductor light emitting element as a light source, resulting in a high photoelectric conversion efficiency and reduction in power consumption compared to conventional image display devices such as liquid crystal display devices.

Figure 2:
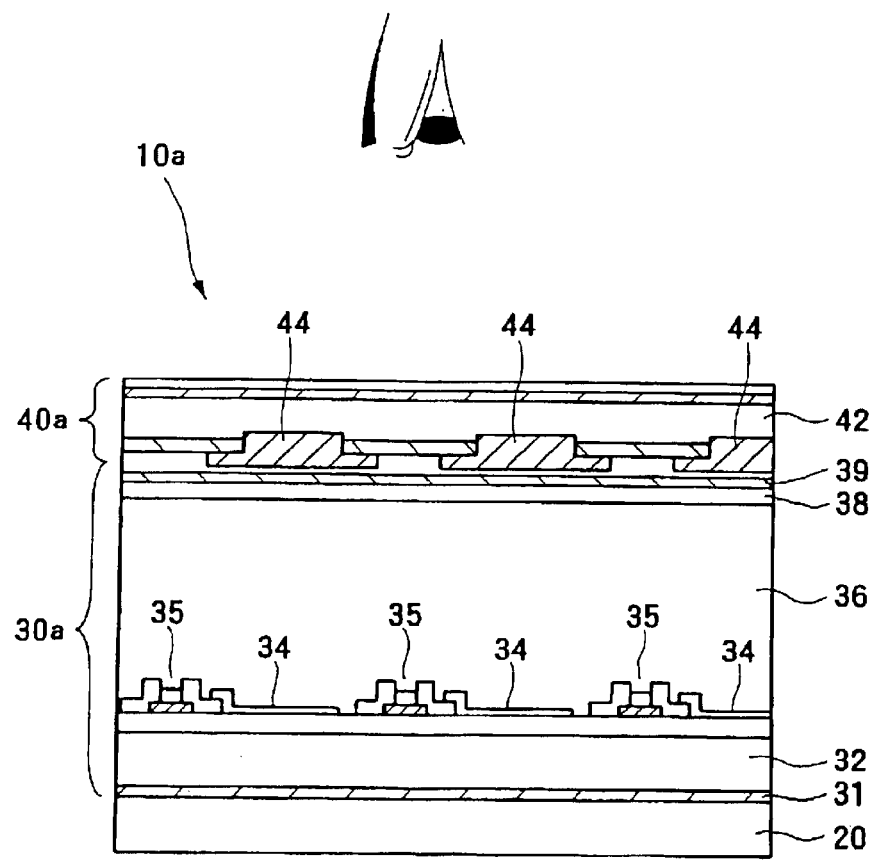
FIG. 2 is an illustration of sectional view of an image display device 10a according to the present invention.

FIG. 2 is a sectional view showing an outline of the concrete structure of the image display device of the present invention. Specifically, the image display device 10*a* shown in FIG. 2 comprises a light source section 20, a light adjustment section 30*a* and a wavelength change section 40*a*.

The light source section 20 comprises a semiconductor light emitting element as a light source, which posses a designated light emission spectrum.

The light adjustment section 30*a* has a structure that adjusts the transmission ratio of a light with liquid crystal. Specifically, in the light adjustment section 30*a*, liquid crystal layer 36 is held between polarizing plates 31 and 39. By applying a designated voltage between pixel electrodes 34 and the opposite electrode 38, the orientation state of molecules in the liquid crystal layer 36 is controlled and the liquid crystal layer 36 acts with the upper and lower polarization plates 31 and 39, whereby the transmission ratio of the light can be controlled. Each pixel electrode 34 is supplied with a designated voltage via switching elements 35. For switching elements 35, a metal-insulating layer-metal (MIM) coupling type element or a thin film transistor (TFT) formed from a hydrogenized amorphous silicon or polycrystalline silicon can be used, for example.

The wavelength conversion section 40*a* has a structure which phosphors 44 are disposed on the lower surface of transparent substrate 42. Phosphors 44 may be arranged so that the pixels are partitioned from each other by black matrixes formed of a light shading material. Or, the phosphors 44 may be arranged on the upper surface of the transparent substrate 42.

In an image display device such as image display device 10*a*, the light adjustment section 30*a* adjusts the amount of light of every pixel emitted from the light source section 20, depending on the voltage applied to the liquid crystal layer 36. Then, the light is incident onto the phosphors 44. Then the wavelength of each pixel is converted at phosphors 44, thereby forming a designated image. Here, the phosphors 44 may be a long wavelength conversion type phosphor, specifically, they may be a phosphor that, upon receipt of an incident light, changes the incident light into a light having a longer wavelength and emits it. Or, the phosphors 44 may be a phosphor that changes the incident light into one having a wavelength shorter than that of the incident light and emits it.

According to the present invention, since the semiconductor light emitting element is used as a light source, the photoelectric conversion efficiency is higher than that of the conventional cathode fluorescent tube, and power consumption can be reduced. Moreover, in the new structure the phosphor is excited by the light emitted from the semiconductor light emitting element which has a high photoelectric conversion efficiency, resulting in reduced power consumption of the image display device as a whole.

As one example, in the case of the 10.4 inch type TFT liquid crystal display device using a conventional cathode fluorescent tube as a light source, the power consumption was about 9 watts. However, in case of the image display device of the present invention, using a ultra violet ray LED and phosphors, the power consumption is about 4 watts, so that power consumption is reduced to less than half of that of the conventional liquid crystal display device. As a result, the battery cells of portable type electronic equipment such as notebook type computers and various kinds of portable information terminal equipment can be prolonged.

Moreover, the image display device of the present invention can achieve a simplification of the circuit constitution and a reduction in the driving voltage, compared to a conventional cathode fluorescent tube. Specifically, a conventional cathode fluorescent tube had to be applied with a high voltage via a stabilizing circuit or an inverter. However, according to the image display device of the present invention, the semiconductor serving as the light source can produce a sufficient light emission intensity with a DC voltage as low as 2 to 3.5 V. Therefore, a stabilizing circuit or an inverter is unnecessary so that the driving circuit of the light source is greatly simplified and at the same time the driving voltage is reduced.

Moreover, according to the image display of the present invention, the life of the light source can be significantly prolonged. Specifically, the luminance of the emitted light declines rapidly in a conventional cathode fluorescent tube and light emission stops after the expiration of a predetermined life time, due to a sputtering phenomenon at its electrode section. However, according to the image display device of the present invention, the semiconductor light emitting element of the light source scarcely exhibits any drop of luminance of the emitted light after it has been used for a long time such as tens of thousands of hours. It can be said that the life time of the semiconductor light emitting element is quasi-permanent. Therefore, the image display device of the present invention has greatly prolonged life compared to a conventional device. Moreover, according to the present invention, the image display device has an extremely short rise-up time to start an operation. Specifically, the time from turning on of the power to a steady state of illumination luminance is very short compared to the conventional cathode fluorescent tube, so that the image display device of the present invention is capable of starting its display operation virtually simultaneously.

According to the present invention, the image display device of the present invention has increased reliability. Specifically, the conventional cathode fluorescent tube has a structure that its glass tube is charged with specified gas. Therefore, the conventional cathode fluorescent tube may be broken due to excessive shock or vibration. However, according to the present invention, since a semiconductor light emitting element which is a solid state element, is employed as the light source, durability against shock and vibration increases remarkably. As a result, the reliability of various kinds of portable electronic equipment mounting the image display device of the present invention can be increased greatly.

Moreover, according to the present invention, harmful mercury is not used. Specifically, in a conventional cathode fluorescent tube, a designated amount of mercury is often charged in its glass tube. However, according to the present invention, it is unnecessary to use such harmful mercury.

Figure 3:
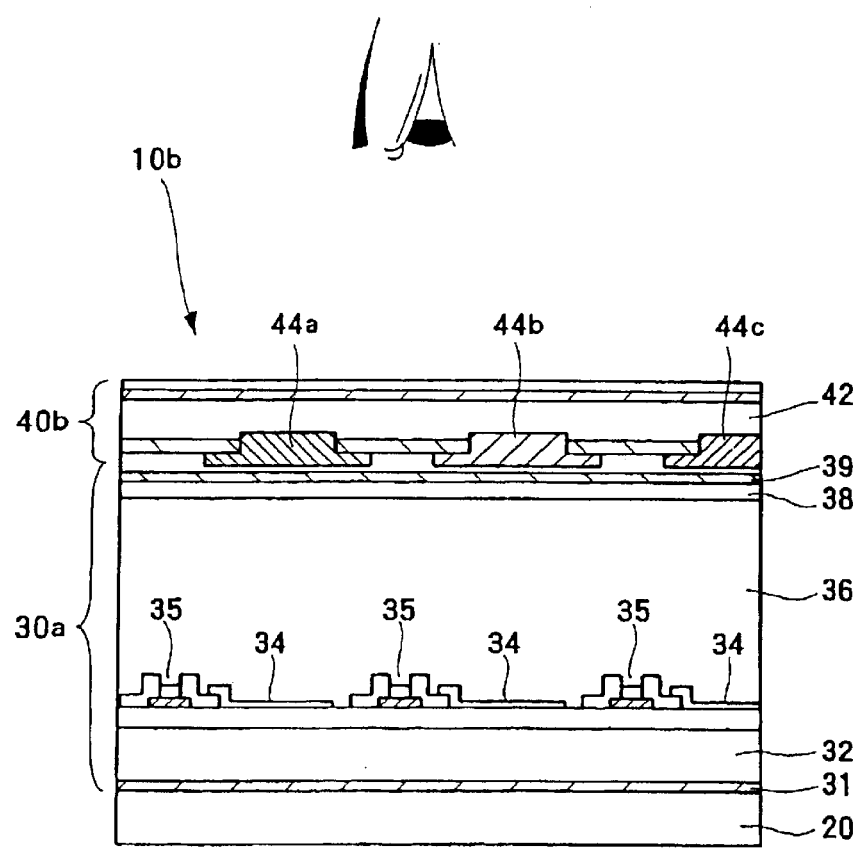
FIG. 3 is an illustration of a sectional view showing an outline of a detailed constitution of another image display device 10b according to the present invention.

FIG. 3 is a sectional view showing an outline of a concrete structure of image display device 10b of the present invention. Specifically, the image display device 10b shown in FIG. 3 comprises a light source section 20, a light adjustment section 30a and a wavelength conversion section 40b.

The light source section 20 comprises a semiconductor light emitting element as a light source, which emits light in an ultraviolet ray range. For example, gallium nitride which is explained in FIG. 4 should preferably be used for a material forming a light emitting layer material of the light emitting element.

The wavelength conversion section 40b includes phosphors 44a, 44b, and 44c, arranged in a predetermined pattern. The phosphors convert light wavelength ranges of light emitted from the light adjustment section 30a into visible rays of red, green, and blue wavelength light, respectively.

Figure 4:
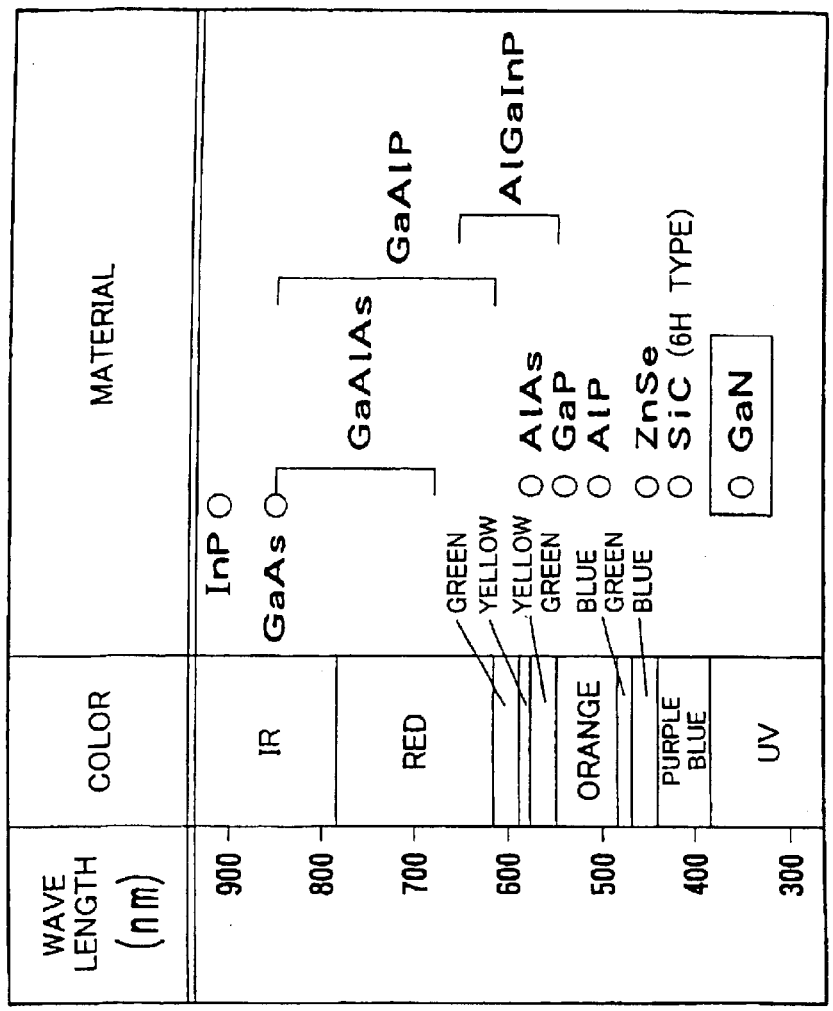
FIG. 4 is a chart illustrating concrete examples of semiconductor light emitting elements suitably used for a light source section of the image display devices according to the present invention.

FIG. 4 is an explanatory chart concerning a concrete example of a semiconductor light emitting element which is suitably used for the light source of the image display device. In FIG. 4, wavelengths of light, colors corresponding to each of the wavelengths and materials of compound semiconductors, each of which has a light emission peak in the corresponding wavelength zones, is shown.

In the image display device 10b shown in FIG. 3, the wavelength of light from the light source 20 is changed and output by the conversion section 40b. Here, phosphor is a means for changing the wavelength, and the wavelength conversion section 40b performs in many cases what is called long wavelength conversion, which emits light having a longer wavelength than that of the incident light. Therefore, in order to realize a full color display, the wavelength of the semiconductor light emitting element should be shorter than that of blue color which has the shortest in the visible light range. In addition, the semiconductor light emitting element must also exhibit a high light emission luminance at the same time.

For a material of such semiconductor light emitting element satisfying these requirements, gallium nitride can be utilized. A semiconductor light emitting element that uses gallium nitride as a light emitting layer, and emits light of a wavelength ranging from 360 to 380 nanometer, has a high light emission efficiency. Therefore, using such a semiconductor light emitting element as a light source, an image display device which displays a clear image with a high luminance can be realized.

The light adjustment section 30a of the image display device 10b shown in FIG. 3 can be constituted similar to that of the image display device 10a shown in FIG. 2. Accordingly, the same material parts in the light adjustment section 30a and the light adjustment section of image display device 10a are denoted with the same reference numerals, and descriptions for them are omitted.

Moreover, the wavelength change section 40b of the image display device 10b has a constitution in which phosphors 44a, 44b and 44c are arranged on the lower surface of the transparent substrate 42 so as to form a designated pattern. For the material of the phosphors 44a, 44b and 44c, the one that has an excitation characteristic that agrees with the light emission characteristic of the light source of light source section 20 should be preferably used.

Figure 5:
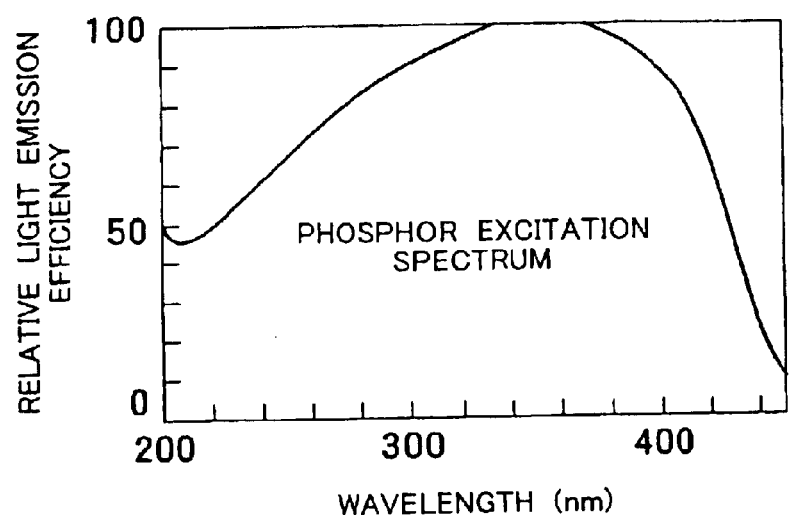
FIG. 5 is a graph of light emission efficiency versus wavelength for a phosphor which is suitably used for a wavelength change section 40b of the image display device 10b shown in FIG. 3.

FIG. 5 is an explanatory drawing concerning a concrete example of a phosphor suitable to be used in the wavelength conversion section 40b of the image display device 10b. Specifically, in FIG. 5, exemplified is a relation between a relative light emission efficiency of a phosphor and a wavelength of light incident thereto. The phosphor shown in FIG. 5 exhibits the maximum light emission efficiency of the wavelength of the incident light, at the ranges from 340 to 380 nanometer. Specifically, the phosphor shown in FIG. 5 indicates an excitation peak in the wavelength zone of the light emitted from the light emitting element which was explained in FIG. 4. By combining this phosphor with the semiconductor light emitting element explained with FIG. 4, an extremely high photoelectric conversion efficiency can be achieved. Moreover, the wavelength of the light emitted from the phosphor can be suitably selected by introducing specified impurities thereinto. Thus, the image display device 10b of the present invention will be capable of increasing luminance in an image display and displaying a bright and clear image.

For such phosphor, for example, a substance such as $Y_2O_2S$:Eu for emitting a red color will be mentioned; $(Sr, Ca, Ba, Eu)_{10}(PO_4)_6 \cdot Cl_2$ for emitting a blue color; and $3(Ba, Mg, Eu, Mn)O \cdot 8Al_2O_3$ for emitting a green color.

By using such phosphor, the wavelength of the light in the ultraviolet range emitted from the light source section 20 can be converted with high efficiency. The phosphors 44a, 44b and 44c receive the light in the ultraviolet range from the light source section 20 to convert the wavelengths of the light, and output lights in red (R), green (G) and blue (B) wavelength ranges respectively, thereby forming the designated color image.

Moreover, each pixel of phosphors 44a, 44b and 44c may be partitioned by the black matrix formed of a light shading material. Or, they may be arranged on the upper surface of the transparent substrate 42. When they are arranged on the upper surface of the transparent substrate 42, blurs and vignettes of the image can be suppressed by interposing the transparent substrate 42.

The image display device 10b of the present invention exhibits the following effects, in addition to those of the foregoing image display device 10a.

Specifically, the image display 10b employs the semiconductor light emitting element which emits light at the ultraviolet range as the light source, and at the same time employs a phosphor in the same ultraviolet ray range which exhibits a high photoelectric conversion efficiency, whereby the image display device 10b can display an image with an extremely high display luminance.

Figure 6:
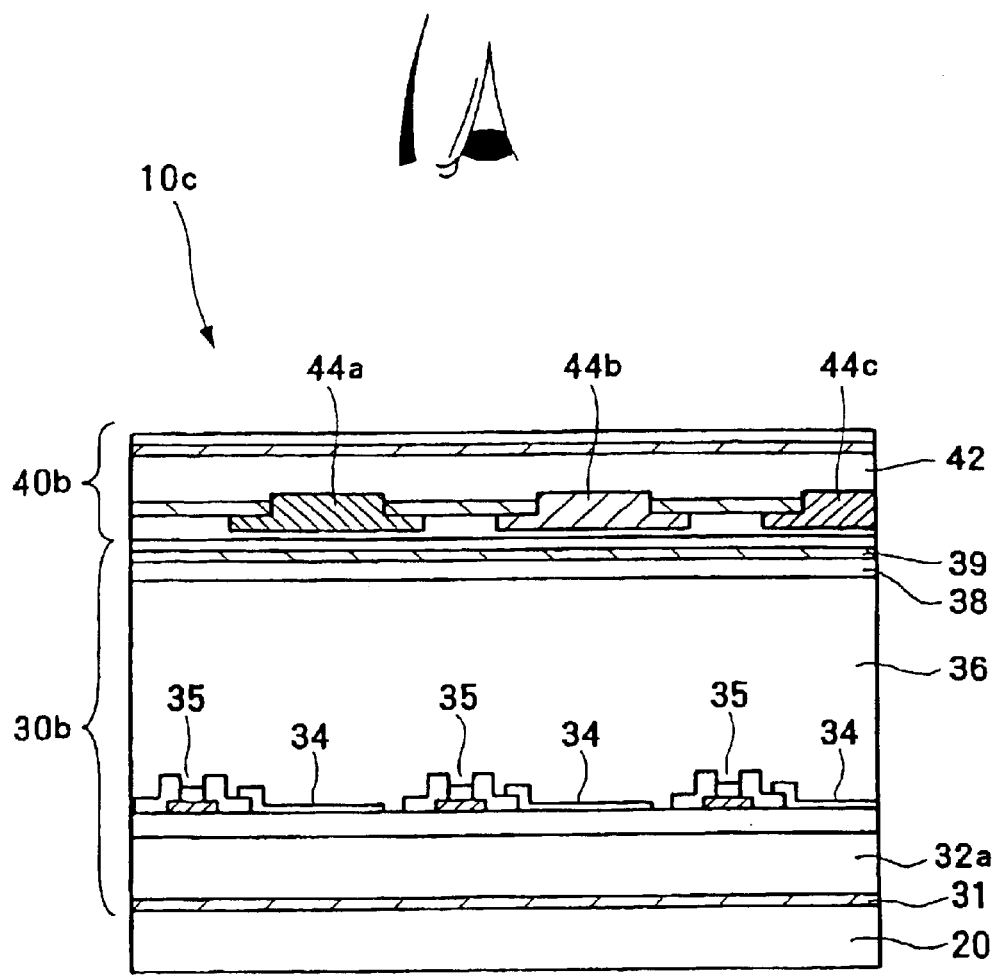
FIG. 6 is an illustration of is a sectional view of an image display device 10c shown in FIG. 3.

FIG. 6 is a sectional view showing an outline of a concrete structure of image display device 10c of the present invention. Specifically, the image display device 10c shown in FIG. 6 comprises a light source section 20, a light adjustment section 30b and a wavelength conversion section 40b.

The light source section 20 comprises a semiconductor light emitting element which emits light at the ultraviolet ray range, similar to the foregoing image display device 10b. Gallium nitride which was described above should be preferably used for a material of a light emitting layer of the semiconductor light emitting element.

The light adjustment section 30b has a constitution in which a light transmission ratio is adjusted by liquid crystal, similar to the foregoing image display device 10b. Specifically, in the light adjustment section 30b, a liquid crystal layer 36 is held between polarization plates 31 and 39.

Similar to the foregoing display device 10b, the wavelength conversion section 40b also has a constitution in which phosphors 44a, 44b and 44c are arranged on the under surface of the transparent substrate 42 so as to form a designated pattern. With respect to a material of the phosphors 44a, 44b and 44c, a material exhibiting a light emission characteristics as shown in FIG. 5 should preferably be used. Using such phosphors, the light in the ultraviolet ray range, which is emitted from the light source section 20, can be subjected to the wavelength conversion with high efficiency. The phosphors 44a, 44b and 44c receives the light in the ultraviolet ray range from the light source section 20 and change the wavelength of the light and emit it, each being in the wavelength ranges of red (R), green (G) and blue (B) colors, respectively.

In the image display device 10c, the transparent substrate 32a in the light adjustment section 30b is formed of low alkali glass containing alkali elements at a low content ratio. Here, "low alkali glass" means glass formed of a neutral silicic acid glass having a lower alkali content ratio than alkali glass formed of soda lime glass. In the case of alkali glass, the alkali content ratio is about 13.5% of weight, but in case of low alkali glass, it is about 7% by weight. By using such low alkali glass, absorption of the ultraviolet ray from the light source section 20 is suppressed so that the display luminance can be increased.

Figure 7:
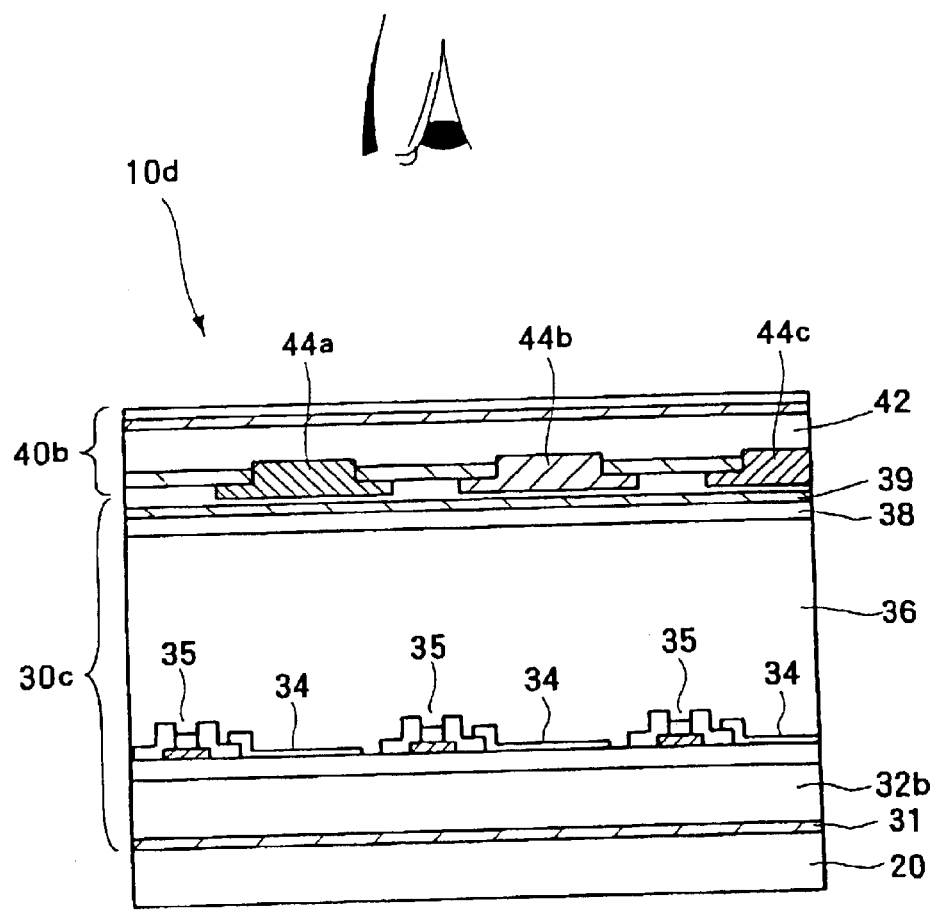
FIG. 7 is an illustration of a sectional view of an image display device 10d shown in FIG. 3.

FIG. 7 is a sectional view showing an outline of a concrete structure of the image display device 10d of the present invention. Referring to FIG. 7, the image display device 10d comprises a light source section 20, a light adjustment section 30c and a wavelength conversion section 40b.

The light source section 20 comprises a semiconductor light emitting element as a light source, which emits light at the ultraviolet ray range, similar to the foregoing image display device 10b. Gallium nitride described above should be used for the material of the light emitting layer of the semiconductor light emitting element.

The light adjustment section 30c comprises a structure in which the transmission ratio of light is adjusted by liquid crystal, similar to the foregoing image display device 10b. Specifically in light adjustment section 30c, a liquid crystal layer 36 is held between polarization plates 31 and 39.

Similar to the case of the foregoing image display device 10b, the wavelength conversion section 40b also has a constitution in which the phosphors 44a, 44b and 44c are arranged on the lower surface of the transparent substrate 42 so as to form a designated pattern. A material exhibiting a light emission characteristic as shown in FIG. 5 should preferably be used for the phosphors 44a, 44b and 44c. By using such phosphors, the light at the ultraviolet ray range, which is emitted from the light source section 20, can be subjected to the wavelength conversion with high efficiency. The phosphors 44a, 44b and 44c receive the light at the ultraviolet ray range from the light source section 20 to change the wavelength of the light and output the lights at the red (R), green (G) and blue (B) wavelength regions, respectively.

Here, in the image display device 10d, the transparent substrate 32b of the light adjustment section 30c is formed of non-alkali glass which substantially contains no alkali element. Here, "non-alkali glass" means glass which substantially contains no alkali. By using such non-alkali glass, the absorption of the ultraviolet ray from the light source section 20 is further suppressed so that the display luminance can be increased.

Figure 8:
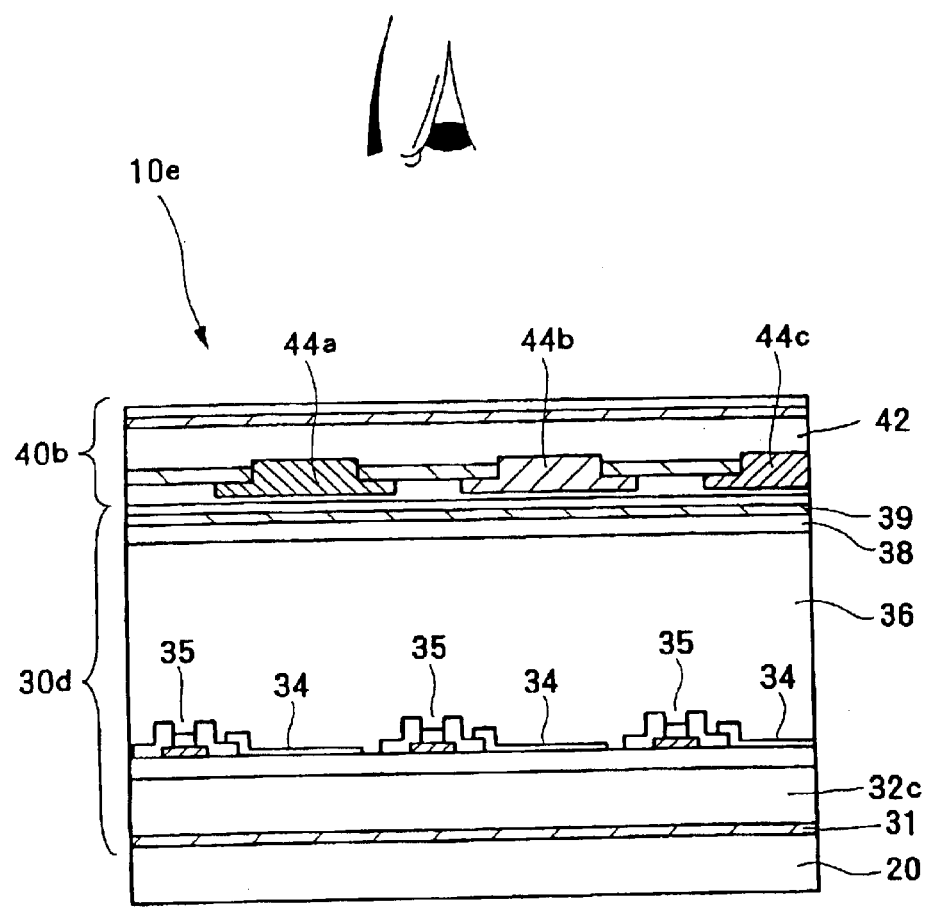
FIG. 8 is a sectional view showing an outline of still another concrete constitutional example of the image display device 10a shown in FIG. 3.

FIG. 8 is a sectional view showing an outline of a concrete structure of the image display device 10e of the present invention. Specifically, the image display device 10e shown in FIG. 8 comprises a light source section 20, a light adjustment section 30d and a wavelength change section 40b.

Similar to the foregoing image display device 10b, the light source section 20 comprises a semiconductor light emitting element as a light source, which emits light in the ultraviolet ray range. For example, gallium nitride which was described above should preferably be used for a material of a light emitting layer of the semiconductor light emitting element.

Similar to the foregoing image display device 10b, also the light adjustment section 30d also has a constitution in which the transmission ratio of the light is adjusted by a liquid crystal. Specifically, in the light adjustment section 30d, a liquid crystal layer 36 is held between polarization plates 31 and 39.

Similar to the foregoing image display device 10b, the wavelength conversion section 40b also has a constitution in which phosphors 44a, 44b and 44c are arranged on the lower surface of the transparent substrate 42 so as to form a designated pattern. A material exhibiting light emission characteristic shown in FIG. 5 should preferably be used for the phosphors 44a, 44b and 44c. By using such phosphors, the light from the light source section 20 at the ultraviolet ray range can be subjected to the wavelength conversion with high efficiency. The phosphors 44a, 44b and 44c receives the light at the ultraviolet ray range, emitted from the light source section 20, and change the wavelengths of the light to output the lights in the red (R), green (G) and blue (B) wavelength ranges, respectively.

Here, in the image display device 10e, the transparent substrate 32c of the light adjustment section 30d is formed of quartz glass. Quartz glass has a low alkali content ratio of about 2 ppm, so it exhibits an extremely low absorption ratio for ultraviolet ray. Therefore, the absorption of the ultraviolet ray is further suppressed, and the display luminance can be further increased.

Figure 9:
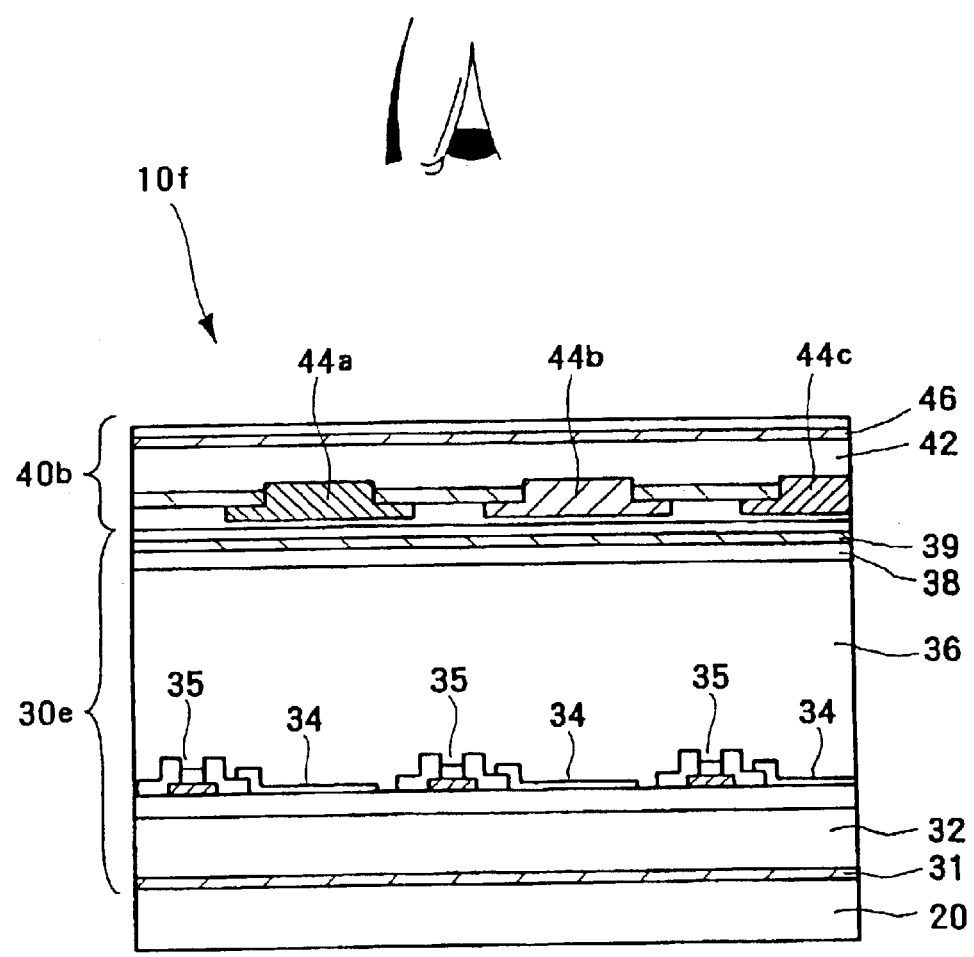
FIG. 9 is a sectional view showing an outline of further still another concrete constitutional example of the image display device 10a shown in FIG. 3.

FIG. 9 is a sectional view showing an outline of a concrete structure of the image display device 10f of the present invention. Specifically, the image display device 10f shown in FIG. 9 comprises a light source section 20, a light adjustment section 30e and a wavelength conversion section 40b.

Similar to the foregoing image display device 10b, the light source section 20 comprises a semiconductor light emitting element as a light source, which emits light at the ultraviolet ray range. Gallium nitride which was mentioned above should preferably be used for a material of the semiconductor light emitting element, for example.

The light adjustment section 30e also has a constitution in which the transmission ratio of light is adjusted by a liquid crystal, similar to the foregoing image display device 10b. Specifically, the light adjustment section 30e has a liquid crystal layer 36 held between polarization plates 31 and 39. Moreover, the transparent substrate 32d should be formed of any one of the low alkali glass, non-alkali glass, or quartz glass.

Similar to the foregoing image display device 10b, the wavelength change section 40b also has a constitution in which phosphors 44a, 44b and 44c are arranged on the lower surface of the transparent substrate 42 so as to form a designated pattern. A material exhibiting a light emission characteristic as shown in FIG. 5 should be used for phosphors 44a, 44b and 44c. By using such phosphors, the light from the light source section 20 in the ultraviolet ray range can be subjected to wavelength conversion with high efficiency. Phosphors 44a, 44b and 44c receive the light from the light source section 20 in the ultraviolet ray range and change the wavelength of the light, thereby outputting lights at red (R), green (G) and blue (B) wavelength ranges, respectively.

Here, in image display device 10f, an ultraviolet ray cutting filter 46 is stacked on the wavelength conversion section 40b. This ultraviolet ray cutting filter 46 should have a low absorption ratio for visible light and a high absorption ratio for ultraviolet ray. By providing such ultraviolet ray cutting filter 46 stacked on the wavelength conversion section 40b, the following effects can be obtained.

First, by employing the ultraviolet ray cutting filter 46, the light emission from the excitation of phosphors 44a, 44b and 44c from disturbance light can be suppressed. Specifically, when the ultraviolet ray is incident from the outside of the image display device 10f, the phosphors 44a, 44b and 44c are excited, whereby unnecessary light emission will be produced by them. However, when the ultraviolet ray cutting filter 46 is provided, filter 46 absorbs the ultraviolet ray from the outside of the image display device 10f, thereby suppressing the unnecessary light emission.

Moreover, it is possible to prevent the ultraviolet ray from the light source section 20 from leaking to the outside.

When the ultraviolet ray cutting filter 46 is provided between the transparent substrate 42 of the wavelength conversion section 40b and the phosphors 44a, 44b and 44c, the same effects can be obtained.

Figure 10:
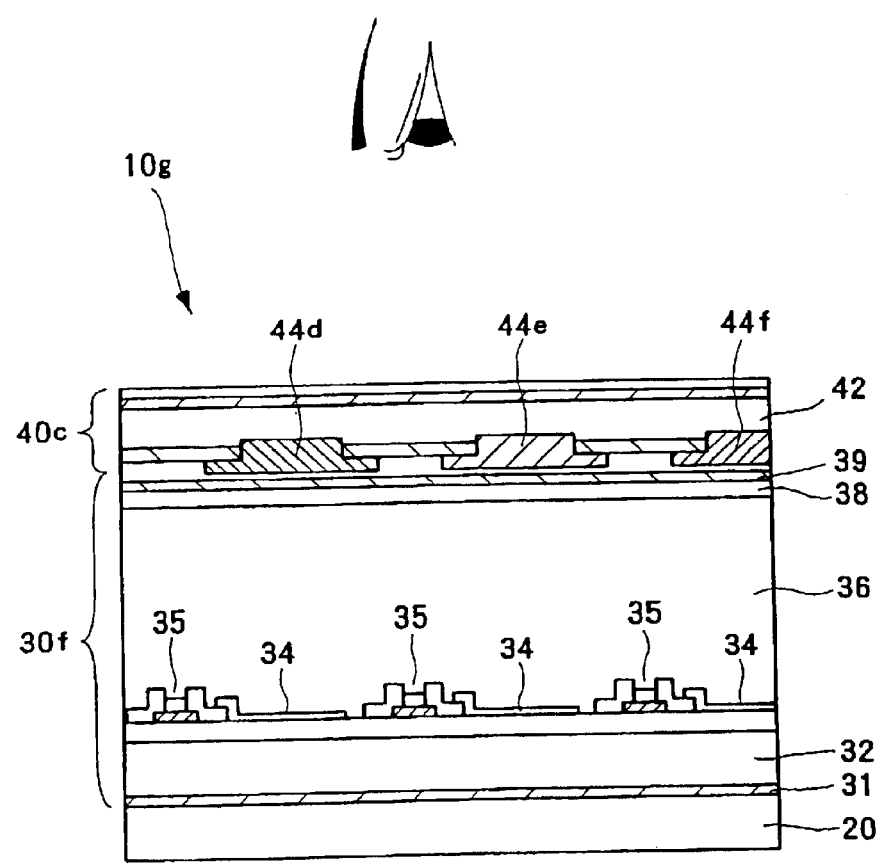
FIG. 10 is a sectional view showing an outline of further still another concrete constitutional example of the image display device 10a shown in FIG. 3.

FIG. 10 is a sectional view showing an outline of the concrete structure of image display device 10g of the present invention. Specifically, the image display device 10g shown in FIG. 10 comprises a light source section 20, a light adjustment section 30f and a wavelength conversion section 40c.

Here, the light source section 20 comprises a semiconductor light emitting element possessing a peak of light emission in a blue range. For example, a light emitting element employing gallium nitride type semiconductor can be used.

Similar to the foregoing image display device 10a, the light adjustment section 30f has a constitution in which the transmission ratio for light is adjusted by liquid crystal. Specifically, in the light adjustment section 30f, the liquid crystal layer 36 is held between the polarization plates 31 and 39.

The wavelength change section 40c comprises a phosphor 44d emitting light of a red (R) color, a phosphor 44e emitting light of a green (G) color and a window section 44f transmitting light of a blue (B) color. Specifically, the phosphor 44d receives blue colored light which is emitted from the light source section 20 and incident thereto through the light adjusting section 30f. The phosphor 44d changes its wavelength and outputs it as red color light. Moreover, the phosphor 44e receives the blue color light which is emitted from the light source section 20 and incident through the light adjusting section 30f. The phosphor 44e changes its wavelength and outputs it as green color light. Moreover, the window portion 44f receives the blue color light which is emitted from the light source section 20 and travels through the light adjusting section 30f. The window portion 44f then transmits the received blue color light.

Here, phosphors 44d and 44e should be formed of a material exhibiting an absorption excitation peak for the light in a blue color range, the light being emitted by the light source section 20. In addition, in order to achieve a high changing efficiency, it should be preferable that a phosphor formed of an organic material is used. For such organic phosphor, for example, rhodamine B is mentioned for emitting red color light, and brilliant sulfoflavine FF is mentioned for emitting green color light. On the other hand, the window portion 44f may be achromatic transparent, or it may be formed of a transparent material exhibiting a designated absorption ratio in order to balance the luminance of red and blue colors.

Since the image display device log shown in FIG. 10 uses a light emitting element which emits blue color light as a light source, it has an advantage that deterioration of material such as the liquid crystal layer can be avoided, the deterioration being produced when ultraviolet ray is used. Moreover, since the blue color light among the colors to be displayed can be outputted without changing its wavelength, loss in the wavelength conversion is small, so that it has an advantage that it is easy to increase the luminance of an image.

Figure 11:
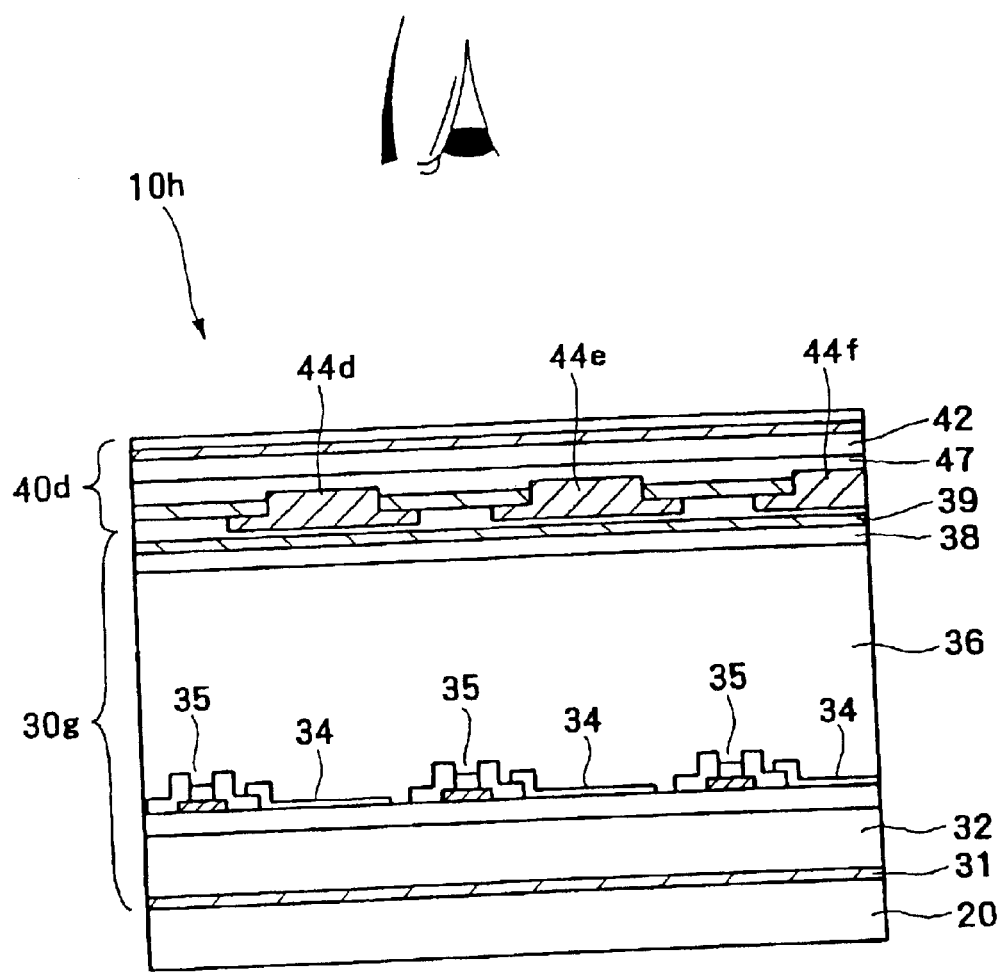
FIG. 11 is a sectional view showing an outline of further still another concrete constitutional example of the image display device 10a shown in FIG. 3.

FIG. 11 is a sectional view showing an outline of a concrete example of the structure of an image display device 10h of the present invention. Specifically, the image display device 10h shown in FIG. 11 comprises a light source section 20, a light adjustment section 30g and a wavelength change section 40d.

Here, similar to the foregoing image display device 10b, the light source section 20 can use a semiconductor light emitting element which exhibits a light emission peak in the ultraviolet ray range as a light source. Moreover, like the foregoing image display device log, the light source section 20 can use a semiconductor light emitting element which exhibits a light emission peak in the blue color range as a light source. Still furthermore, the light source section may use a semiconductor light emitting element which exhibits a light emission peak in other wavelength ranges as a light source.

Similar to the foregoing image display device 10a, the light adjustment section 30g also has a constitution in which a light transmission ratio is adjusted by a liquid crystal. Specifically, also in the light adjustment section 30g, a liquid crystal layer 36 is also held between polarization plates 31 and 39.

Similar to the foregoing image display device 10b, the wavelength conversion section 40d can be constituted of phosphors 44a, 44b and 44c which are arranged on the lower surface of the transparent substrate 42 so as to form a designated pattern, where phosphors 44a, 44b and 44c emits lights respectively in red (R), green (G) and blue (B) wavelength ranges. Moreover, in the case where the light source emits a blue colored light, the wavelength conversion section 40d has a structure in which a phosphor 44d emits a red color (R) light, a phosphor 44e emits a green color light (G) and a window portion 44f transmits a blue color light.

Moreover, in the image display device 10h, a light diffusion plate 47 is provided above the phosphors 44 of the wavelength conversion section 40d. This light diffusion plate 47 diffuses the directions of the light incident from phosphors 44 and outputs them. By providing such light diffusion plate 47, it is possible to widen the visual field angle and smoothen the image.

Figure 12:
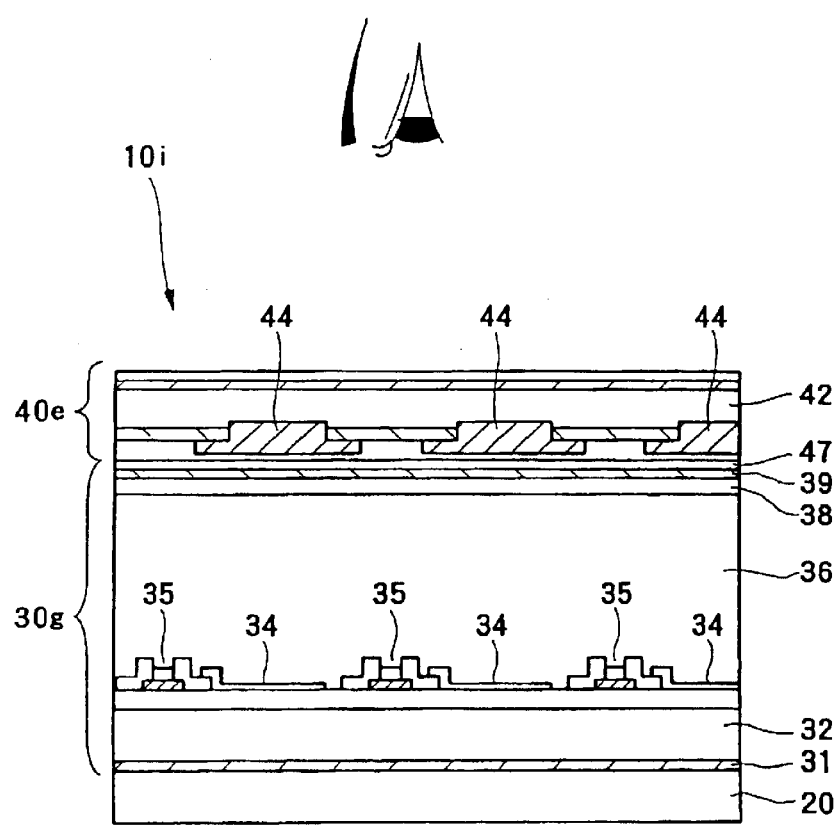
FIG. 12 is a sectional view showing an outline of further still another concrete constitutional example of the image display device 10a shown in FIG. 3.

FIG. 12 is a sectional view showing an outline of a concrete example of the structure of image display device 10i of the present invention. Specifically, the image display device 10i in FIG. 12 comprises a light source section 20, a light adjustment section 30g and a wavelength conversion section 40e.

Here, in the image display device 10i, the foregoing light diffusion plate 47 is arranged on the lower layer of phosphors 44. By arranging such light diffusion plate 47, lack of uniformity in luminance of lights incident onto phosphors 44 can be controlled, allowing each of the phosphors 44 to emit lights uniformly.

Next, an image display device of a second embodiment of the present invention will be described.

Figure 13:
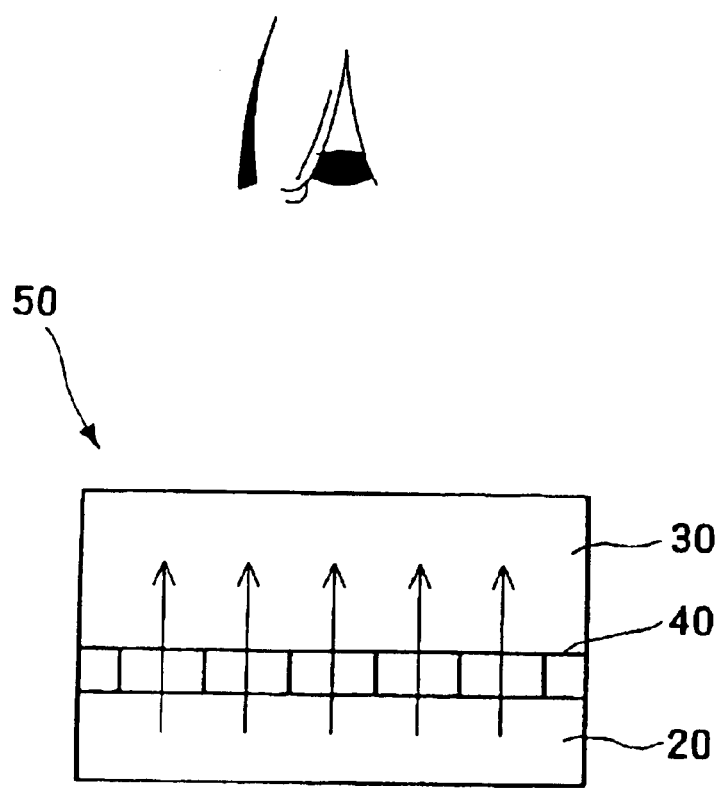
FIG. 13 is a sectional view showing an outline of a constitution of an image display device according to a second embodiment of the present invention.

FIG. 13 is a sectional view showing an outline of a concrete structure of the image display device of the second embodiment of the present invention. Specifically, image display device 50 of the present invention comprises a light source section 20, a wavelength conversion section 40 or a wavelength selection section 40 and a light adjustment section 30.

In the light source section 20, at least one semiconductor light emitting element is properly arranged so as to emit light to wavelength conversion section 40, the light having a designated wavelength, light amount and luminance distribution. The wavelength conversion section 40 changes the wavelength of the light incident from the light source section 20 to output it to the light adjustment section 30. When the wavelength selection section 40 is used, it selects the wavelength of the light to output it to the light adjustment section 30.

The light adjustment section 30 adjusts the amount of light incident from either the wavelength conversion section or the wavelength selection section for each pixel and forms a designated image and outputs it from the observation plane of the image display device 50.

According to the present invention, since the wavelength conversion section 40 is provided between the light source section 20 and the light adjustment section 30, the light from the light source section 20 is never incident directly onto the light adjustment section 30. Therefore, problems of deterioration and malfunction of the light adjustment section 30 due to the direct light from the light source section 20 never occurs. Particularly, the liquid crystal layer and the switching elements in the light adjustment section 30 are prone to deterioration by the irradiation of ultraviolet ray. However, in the image display device 50, such deterioration never occurs.

In addition, according to the present invention, the light adjustment section 30 can be structured so that it has the same structure as that of the conventional liquid crystal display device. Specifically, the light incident into the light adjustment section 30 is converted to visual light, whereby the light adjustment section 30 can be constituted so as to have the same structure as that of the conventional one.

Figure 14:
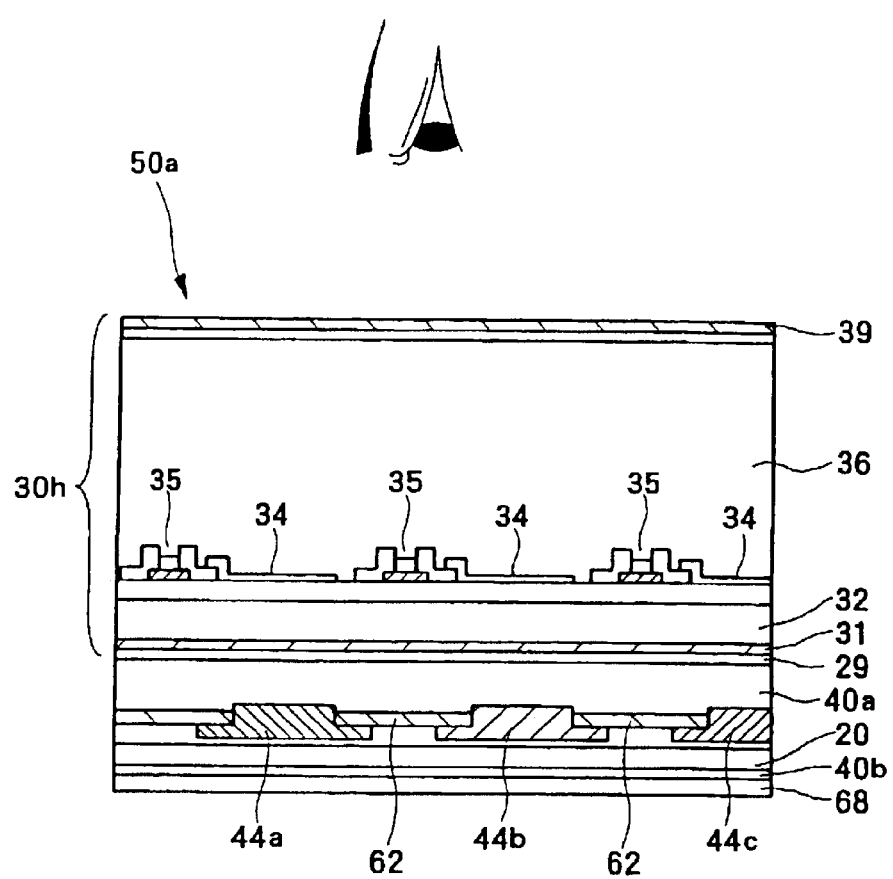
FIG. 14 is a sectional view showing an outline of a constitutional example of an image display device 50 of the present invention.

FIG. 14 is a sectional view showing an outline of a concrete example of the structure of the image display device of the present invention. Specifically, the image display device shown in FIG. 50a comprises a light source section 20, a wavelength conversion section 40a and a light adjustment section 30h.

Here, the light source section 20 can use the semiconductor light emitting element as a light source, which possesses a light emission peak in the ultraviolet ray range, like the foregoing image display device 10b. Moreover, like the foregoing image display device log, it can use the semiconductor light emitting element as a light source, which possess a light emission peak at the blue color light region. Moreover, it may use a semiconductor light emitting element as a light source, which exhibits a light emission peak in other wavelength ranges.

The wavelength conversion section 40a is provided between the light source section 20 and the light adjustment section 30h. Phosphors 44 can be used as its material. It is preferable that the wavelength of an absorption excitation peak of the phosphors 44 agrees with that of the light emitting element used in the light source section 20. For example, when the light emitting element formed of gallium nitride as described above is used in the light emission section 20, the phosphor exhibiting the absorption excitation peak as shown in FIG. 5 should be preferably used for the wavelength conversion section.

As such phosphors, $Y_2O_2S:Eu$ is mentioned for one emitting red colored light, $(Sr, Ca, Ba, Eu)_{10}(PO_4)_6.Cl_2$ is mentioned for emitting blue colored light, and $3(Ba, Mg, Eu, Mn)O.8Al_2O_3$ is mentioned for emitting green colored light.

Moreover, a second wavelength change section 40b may be provided under the light source section, and a reflection plate 68 may be further provided under the second wavelength conversion section 40b. With such structure, the light emitted downward from the light source section 20 is subjected to the wavelength conversion, and the light is reflected by the reflection plate 68. Then, the reflected light travels through the light source section 20 and the wavelength change section 40a and is incident onto the light adjustment section 30h. So it is possible to use the light effectively.

The light adjustment section 30h has a structure in which a light transmission ratio is adjusted by liquid crystal. Specifically, in the light adjustment section 30h, a liquid crystal layer 36 is held between polarization plates 31 and 39. The liquid adjustment section 30h is designed so that the molecule orientation state of the liquid crystal layer 36 is controlled by applying a designated voltage between pixel electrodes 34 and opposite electrodes, and the liquid crystal layer 36 controls the light transmission ratio in cooperation with the upper and lower polarization plates 31 and 39. Each of the pixel electrodes 34 is supplied with a designated voltage via the switching element 35. A metal/insulating film/metal (MIM) junction type device and a thin film transistor (TFT) formed of hydrogenized amorphous silicon or polycrystalline silicon can be used as switching element 35.

Figure 15:
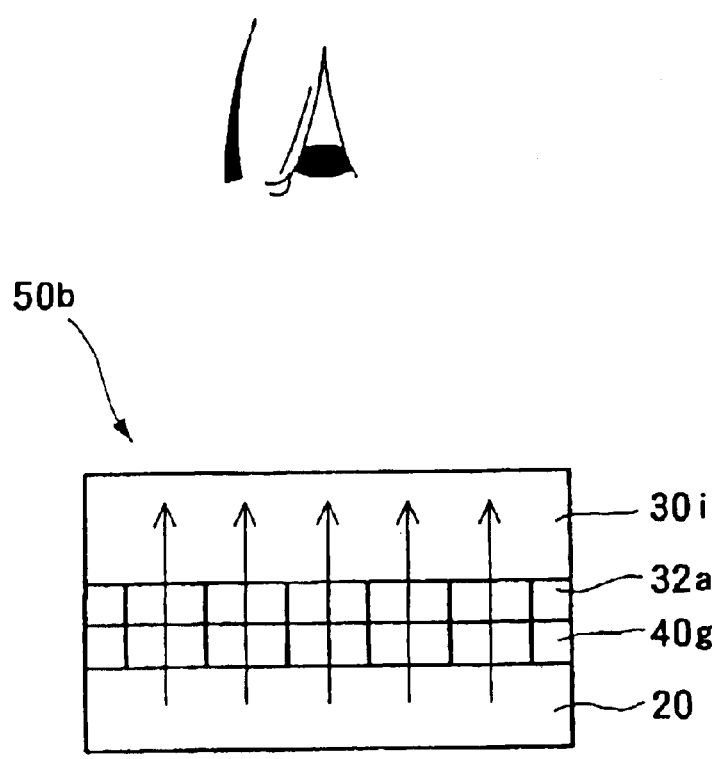
FIG. 15 is a sectional view showing an outline of a constitution of a modification example of an image display device 50a of the present invention.

FIG. 15 is a sectional view showing an outline of a concrete example of the structure of an image display device 50b which is a modification of the image display device 50a shown in FIG. 14. The image display device 50b shown in FIG. 15 comprises a light source section 20, a wavelength change section 40g and a light adjustment section 30i.

Here, as has been described concerning the image display device 50a, the transparent substrate 32a is provided between the wavelength conversion section 40g and the light adjustment section 30i. The image display device 50b has a structure in which an optical property of the transparent substrate 32a is changed for each pixel. For example, such change of the optical property of the transparent substrate 32a can be achieved, by providing a range in the substrate 32a, in which the refraction range is different for each pixel. Or, for each pixel, a light shielding partition may be provided in the substrate 32a. Moreover, a light shielding pattern may be formed on either both surfaces of the substrate 32a or on one surface thereof.

By changing the optical property of the transparent substrate 32a for each pixel, leakage of the light can be prevented when the light travels from the wavelength conversion section 40g to the light adjustment section 30j through the transparent substrate 32a. Therefore, pixel blur can be prevented.

Figure 16:
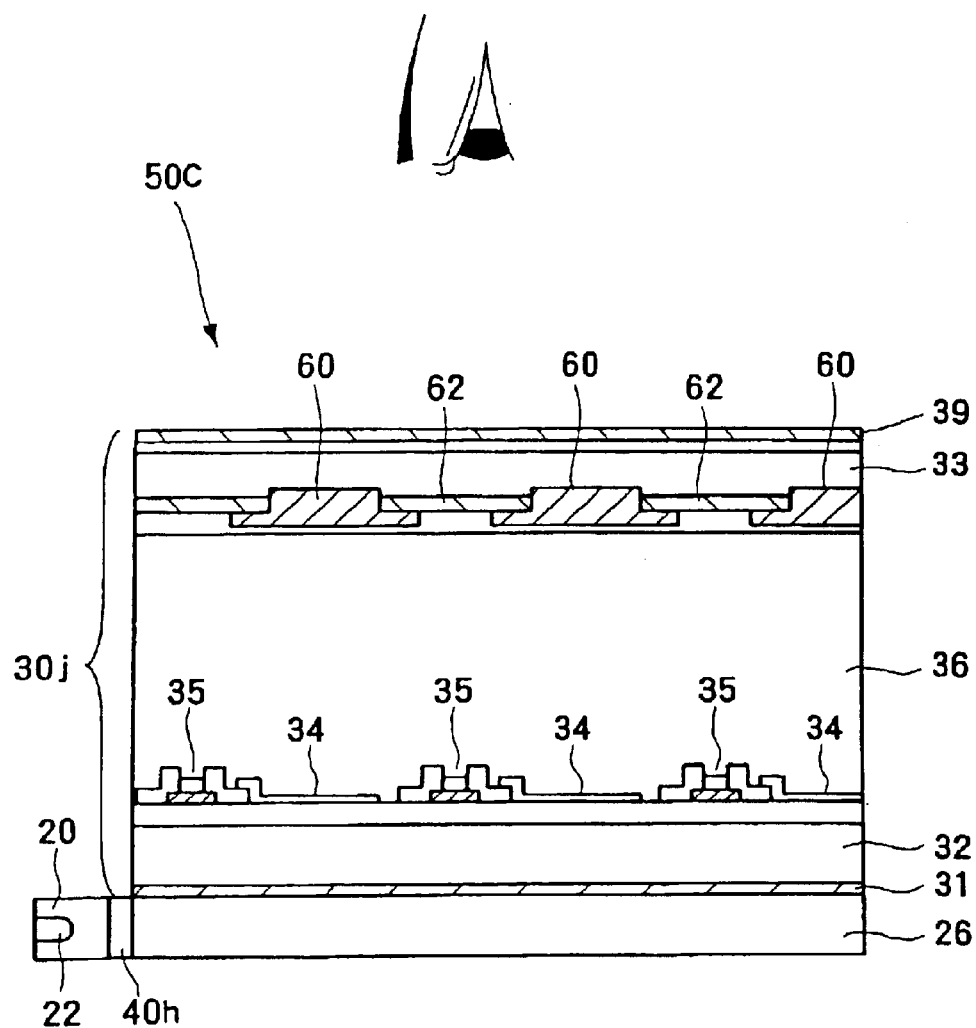
FIG. 16 is a sectional view showing an outline of a constitution of a modification example of an image display device 50 of the present invention.

FIG. 16 is a sectional view showing an outline of a concrete example of the structure of a modification of the image display device of the present invention. Specifically, the image display device 50c shown in FIG. 16 comprises a light source section 20, a wavelength conversion section 40h and a light adjustment section 30j.

However, in the image display device 50c, the wavelength conversion section 40h is disposed between light guiding plate 26 and light source 22 of the light source section 20. Specifically, the light from the light source 22 is subjected to the wavelength conversion by the wavelength conversion section 40h such that the light has a designated wavelength, and the light is incident onto the light adjustment section 30j through the light guiding plate 26 thereafter.

The phosphor can be employed as a material of the wavelength conversion section 40h, similar to the case of the image display device 50a. It should be preferable that the absorption excitation peak wavelength of the phosphor used for this wavelength change section 40h agrees with the light emission peak wavelength of the light emitting element used in the light source 22. For example, when the light emitting element formed of gallium nitride as is described in FIG. 4 is used in the light source 22, the phosphor exhibiting the absorption excitation peak shown in FIG. 5 should be preferably used for the phosphor of the wavelength conversion section 40h.

Moreover, it should be preferable that three kinds of phosphors, which exhibit light emission peaks in red (R), green (G) and blue (B) wavelength ranges are respectively used in combination with each other. More specifically, the light emission peak wavelengths of the phosphors should be selected so as to agree with the transmission spectrum characteristic of a color filter 60 of the light adjustment section 30j.

Next, a light adjustment section used suitably for the image display devices 10 and 50 of the present invention will be described.

Figure 17:
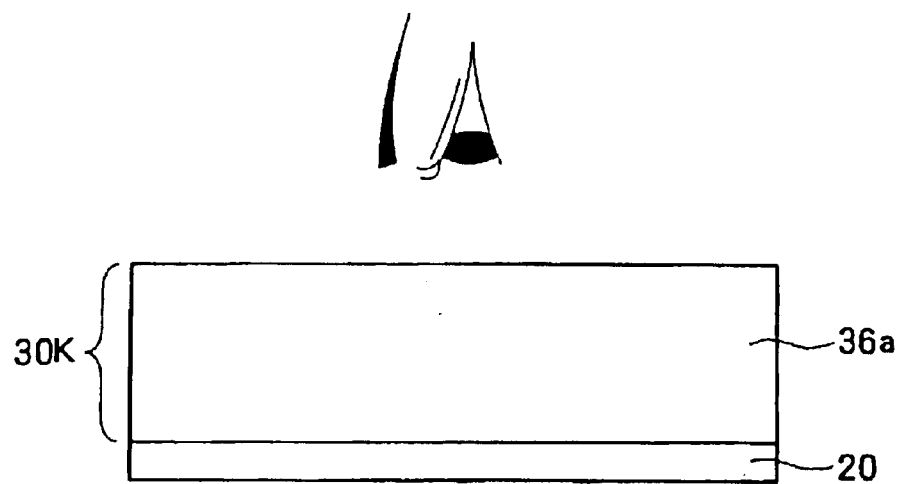
FIG. 17 is a sectional view exemplifying a constitution of a transmission type image display device which uses a light adjustment section 30k capable of being used in the present invention.

FIG. 17 is a sectional view exemplifying an outline of a structure of a transmission type image display device using a light adjustment device 30k, which can be used in the present invention. In FIG. 17, only the light source section 20 and the light adjustment section 30k are illustrated for convenience. A wavelength conversion section (not shown) can be disposed in a similar manner as that in any of the foregoing image display devices shown in FIGS. 1–3 and 6–16. In FIG. 17, the light emitted from the light source section 20 is emitted through the light adjustment section 30k.

Here, either a guest/host type liquid crystal or high polymer dispersion type liquid crystal is used as the liquid crystal 36a of the light adjustment section 30k. The guest/host type liquid crystal is one which two color dyes (guest) exhibiting anisotropic properties in absorption of visible light depending on the long and short axis directions of molecules dissolved in a liquid crystal (host) of a constant molecular arrangement. When the guest/host type liquid crystal is used, the light adjustment section can function with one polarization plate. Therefore, a high light transmission ratio can be obtained and luminance of the image display device can be increased.

Moreover, the high polymer dispersion type liquid crystal utilizes a light scattering effect of a composite substance composed of nematic liquid crystal and high polymer. The high polymer dispersion type liquid crystal is roughly divided into NCAP (nematic curvulinear aligned phase) type and PN (polymer network) type. In case of the high polymer dispersion type liquid crystal, a polarization plate is not necessary so the image display can be achieved with further brightness and a wider visual field angle.

Figure 18:
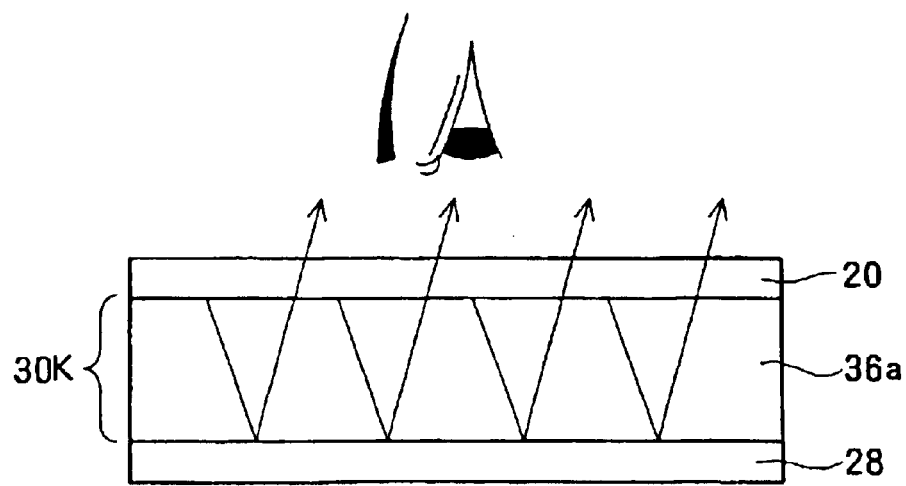
FIG. 18 is a constitutional view exemplifying an outline of a reflection type image display device which uses a light adjustment section 30k.

FIG. 18 is a sectional view showing an outline of a concrete example of the structure of a reflection type image display device using the light adjustment section 30k which has been described above. Specifically, in the image display device shown in FIG. 18, the light adjustment section 30k is stacked on a reflection plate 28, and further the light source section 20 is stacked on the light adjustment section 20. Then, the light emitted from the light source section 20 is reflected by the reflection plate 28 through the light adjustment section 30k, and then passes through the light adjustment section 30k again, and the light reaches the observer through the light source section 20.

Also in the image display device shown in FIG. 18, the light adjusting section 30k uses either a high polymer dispersion type liquid crystal or a guest/host type liquid crystal as liquid crystal 36a. Therefore, the polarization plate is unnecessary so that the transmission ratio can be improved. Thus, the image display device of the present invention can display a bright image.

Figure 19:
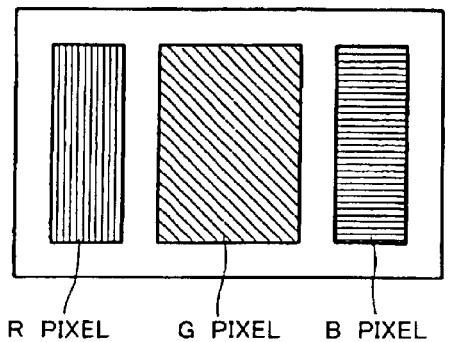
FIG. 19 is an explanatory view showing an example in which an area of each pixel is optimized in the image display device of the present invention.

FIG. 19 is an explanatory view showing an outline of an example in which each area of pixels in the image display device according to the present invention is optimized. Specifically, in any of the foregoing image display devices shown in FIGS. 1 to 18, luminance of each pixel of red (R), green (G) and blue (B) is not necessarily equal to each other. In order to adjust the luminance of each pixel, the area of each pixel is set to an appropriate ratio, as shown in FIG. 19, for example. Therefore, each of colors of red (R), green (G) and blue (B) can be displayed with an optimized balance, and an image reproducing colors with neutral tints can be displayed with precision.

Figure 20:
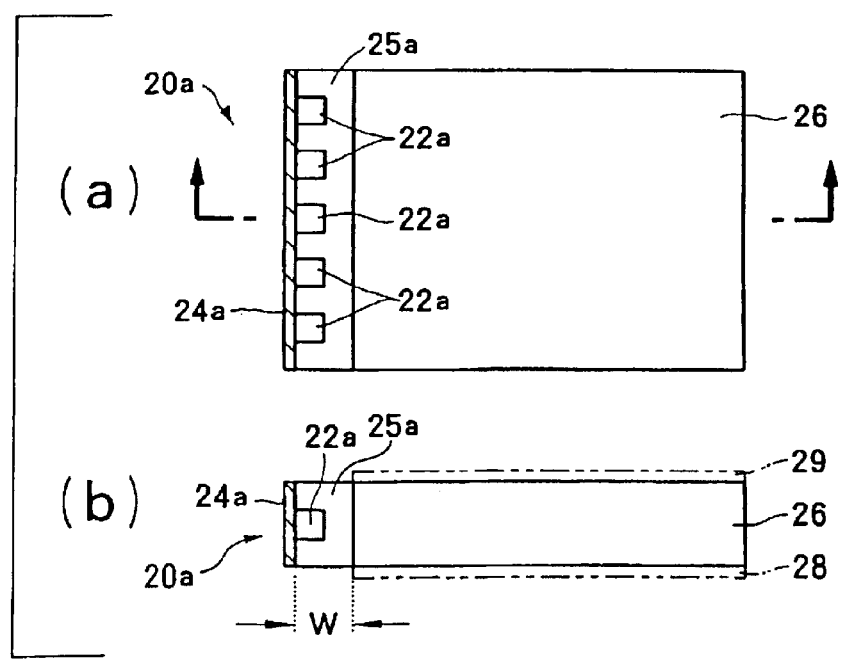
FIG. 20 is a constitutional view showing an outline of a concrete example of the light source section 20 of the image display device 10 or 50 according to the present invention.
Figure 21:
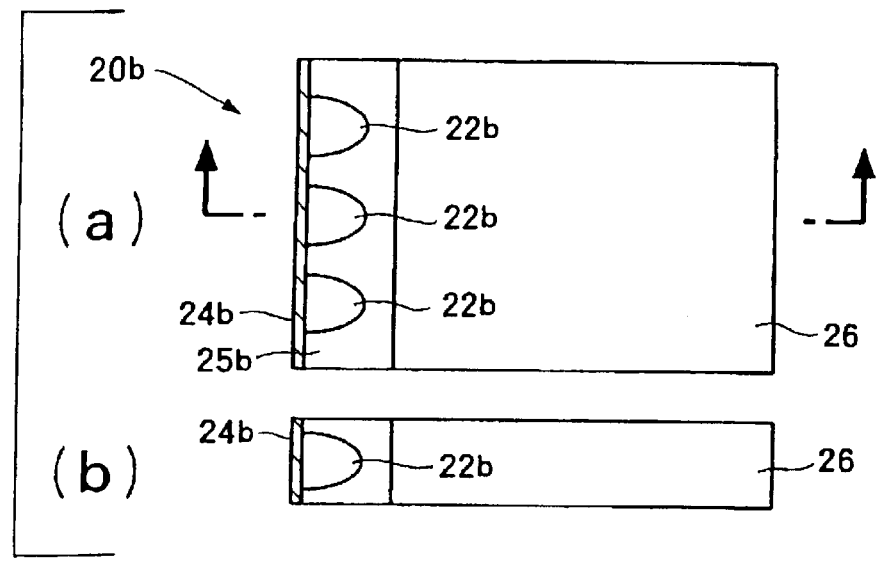
FIG. 21 is a constitutional view showing an outline of a second concrete example of the light source section of the image display section according to the present invention.
Figure 22:
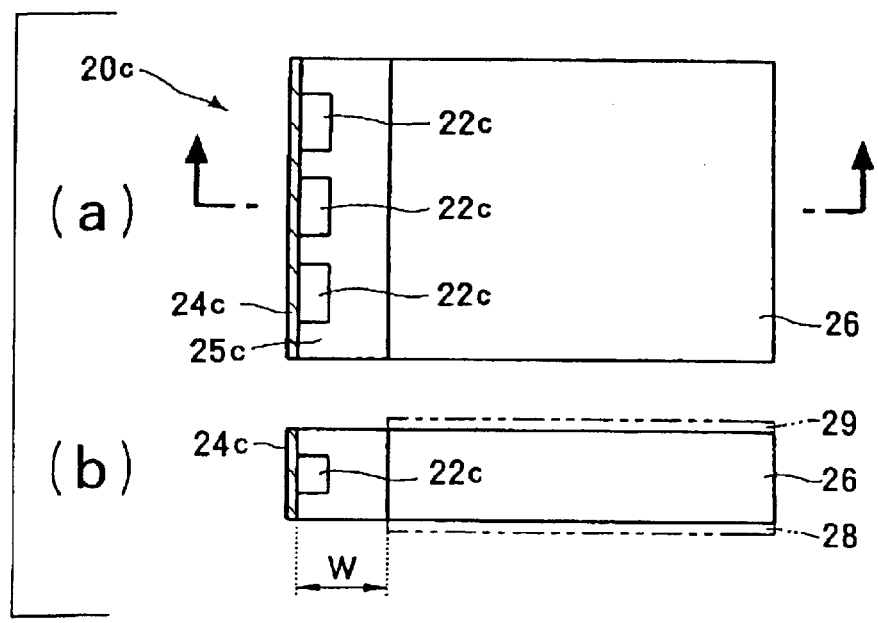
FIG. 22 is a constitutional view showing a third concrete example of the light source of the image display device according to the present invention.

Next, a light source section which is suitably used for the image display device of the present invention will be described. FIGS. 20(a) and 20(b) show an outline of a concrete example of the structure of a light source section 20 of either the image display device 10 or the image display device 50 of the present invention. Specifically, FIG. 20(a) is a sectional view showing an outline in parallel with the observation plane of the image display device. FIG. 20(b) is a sectional view showing an outline perpendicular to the observation plane of the image display device.

A light source section 20a illustrated in FIGS. 20(a) and 20(b) comprises a installation section 25a, to which a light source is installed, and a light guiding plate 26. In the installation section 25a, light emitting diode (LED) chips 22a are arranged as the light source. The LED chip 22a is mounted on, for example, a substrate 24a and a designated wiring is performed on the chip 22a. The LED chip 22a is supplied with a driving electric current, whereby the LED chip 22a is allowed to emit light. The light which is radiated from the LED chip 22a diverges within the light guiding plate 26, and incident onto a light adjustment section 30 or a wavelength conversion section 40, both of which are not shown in FIGS. 20(a) and 20(b). Furthermore, since a light extracting efficiency is increased, a reflection plate 28 can be disposed under the light guiding plate 26, whereby the light emitted from the light guiding plate downward can be returned upward. Moreover, in order to reduce the unevenness of luminance of the light, a diffusion plate 29 may be stacked on the light guiding plate 26.

The image display device of the present invention, which uses the light source section 20a, has the following effects in addition to the various kinds of the foregoing effects described using FIGS. 1 to 22.

Specifically, since the small sized LED chips 22a in a so-called bare chip state are used, it is possible to make the width W of the installation section 25a small. The installation section 25a is often arranged outside of the display region of the image display device, so a frame section of the image display device, namely, the non-display region can be made smaller by narrowing the width W of the installation section 25a.

In addition, since the LED chip 22a in a bare chip state are small, the LED chips 22a can be densely mounted, whereby luminance of the light source can be increased. As a result, a bright and clear image can be displayed.

FIGS. 21(a) and 21(b) are structural views showing an outline of the structure of a second concrete example of the light source of the image display device according to the present invention. Specifically, FIG. 21(a) is a sectional view showing an outline of the light source section in parallel with an observation plane of the image display device, and FIG. 21(b) is a sectional view showing an outline of the light source section perpendicular to the observation plane thereof.

The light source section 20b showing in FIGS. 21(a) and 21(b) comprises a installation section 25b to which a light source is installed, and a light guiding plate 26. In the installation section 25b, LED lamps 22b are arranged. Each LED lamp 22b has a structure that an LED chip is mounted on a lead frame, or a stem possessing lead wire, and molded with resin. Each of the LED lamps 22b can be mounted on the substrate 24b, for example. Moreover, a reflection plate 28 and a diffusion plate 29 may be provided therein (not shown).

The image display device using the light source section 20b shown in FIGS. 21(a) and 21(b) has the following effects in addition to those of the image display device 10a described above.

Specifically, since the LED lamps 22b are used, a light collection capability by virtue of the lens effect of the mold resin is increased, whereby a light utilization effect can be improved.

Moreover, since the lead wire of the LED lamp 22b can be inserted into the substrate 24b and it can be mounted by only soldering, assembly steps can be simplified.

FIGS. 22(a) and 22(b) are structural views showing an outline of the structure of a third concrete example of the light source section of the image display device according to the present invention. Specifically, FIG. 22(a) is a sectional view showing an outline of the light source section in parallel with an observation plane of the image display device and FIG. 22(b) is a sectional view showing an outline of the light source section perpendicular to the observation plane thereof.

The light source section 20c shown in FIGS. 22(a) and 22(b) comprises a installation section 25c to which the light source is fitted, and a light guiding plate 26. In the installation section 25c, surface mounting (SMD) type lamps 22c are arranged. Each of the SMD lamps 22c has a structure that an LED chip is mounted on a small sized mounting substrate and it is molded with resin. The SMD lamp 22c can be mounted on the substrate 24c, for example. Moreover, a reflection plate 28 and a diffusion plate 29 may be provided therein.

The image display device using the light source section 20c shown in FIGS. 22(a) and 22(b) has the following effects in addition to the effects of the foregoing image display device 10a.

First, since the SMD lamp 22c is used, assembly steps can be simplified. Specifically, the SMD lamp 22c can be simply mounted on the substrate 24c according to a so called soldering reflow method, simultaneously when other parts are mounted such as a chip type resistor or a chip type capacitor. In addition, automation of the mounting steps can easily be realized.

The SMD lamp 22c is short in height, so that the width W of the installation section 25c of the light source section 20c can be set small. As a result, the size of the frame section of the image display device, that is, the non-display region thereof can be made smaller.

Figure 23:
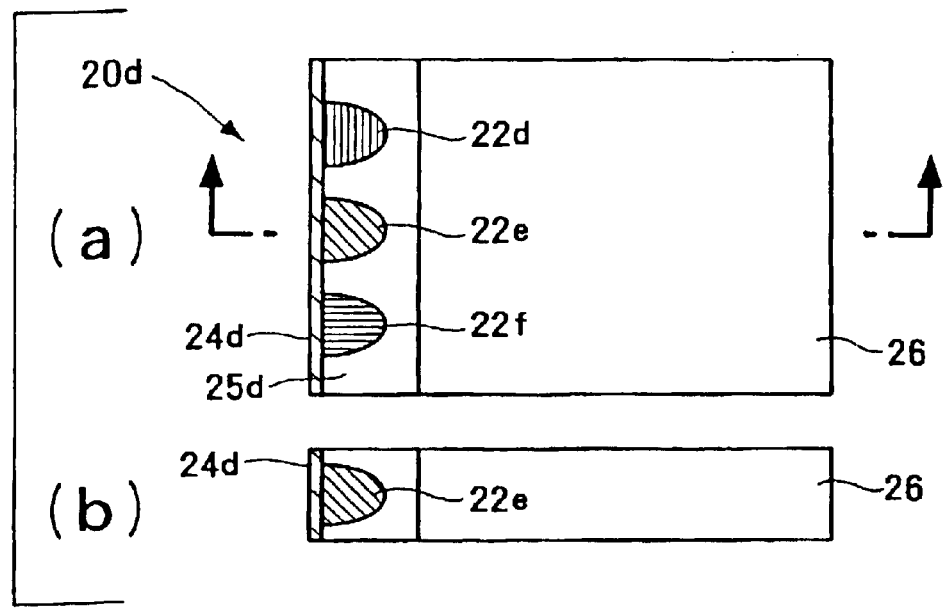
FIG. 23 is a constitutional view showing a fourth concrete example of the light source of the image display device according to the present invention.

FIGS. 23(a) and 23(b) are structural views showing an outline of the structure of a fourth concrete example of the light source section of the image display device according to the present invention. Specifically, FIG. 23(a) is a sectional view showing an outline of the light source section in parallel with an observation plane of the image display device, and FIG. 23(b) is a sectional view showing an outline of the light source section perpendicular to the observation plane.

The light source section 20d shown in FIGS. 23(a) and 23(b) comprises a installation section 25d to which a light source is installed, and a light guiding plate 26. In the installation section 25d, LED lamps 22d, 22e and 22f exhibiting light emission peaks respectively in wavelength zones of red (R), green (G) and blue (B), are arranged.

As is described above, the LED lamps 22d, 22e and 22f emitting R, G and B colors are arranged in the installation section 25d, so that an existing illumination section of a conventional image display device can be replaced with them. Specifically, in the conventional liquid crystal display device, a cathode fluorescent tube or an electroluminescence element has been used for the illumination section. However, by using the light source section 20d of the present invention, the image display device of a low power consumption and a long life time can be obtained. In addition, the image display device using the light source section 20d of the present invention has a high reliability and an ability to function with high speed.

Figure 24:
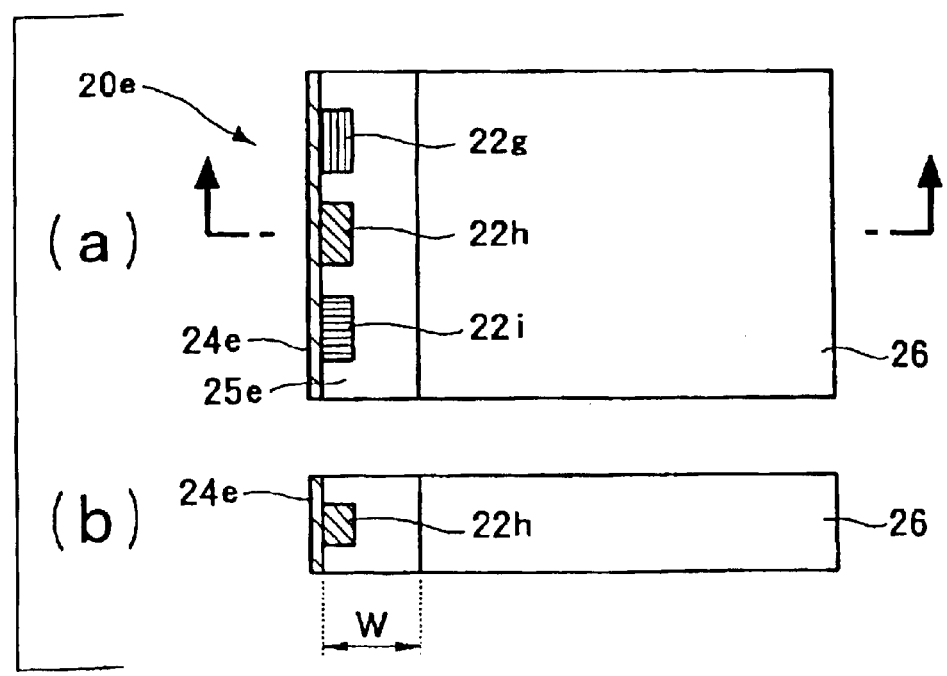
FIG. 24 is a constitutional view showing a fifth concrete example of the light source of the image display device according to the present invention.

FIGS. 24(a) and 24(b) are structural views showing an outline of the structure of a fifth concrete example of the light source section of the image display device according to the present invention. Specifically, FIG. 24(a) is a sectional view showing an outline of the light source section in parallel with an observation plane of the image display device, and FIG. 24(b) is a sectional view showing an outline of the light source section perpendicular to the observation plane thereof.

The light source section 20e shown in FIGS. 24(a) and 24(b) comprises SMD lamps 22g, 22h and 22i arranged therein as a light source, which exhibit light emission peaks in wavelength zones of red (R), green (G) and blue (B) colors, respectively. By using the SMD lamps as described above, the light source section 20e has effects that the width W of the installation section 25e can further be made smaller and the image display device can be manufactured to be smaller in size, in addition to the effects of the foregoing light source section 20d.

Moreover, by using LED chips instead of the SMD lamps 22g, 22h and 22i, the width W of the installation section 25e can be reduced more, so that the image display device can be made smaller.

Figure 25:
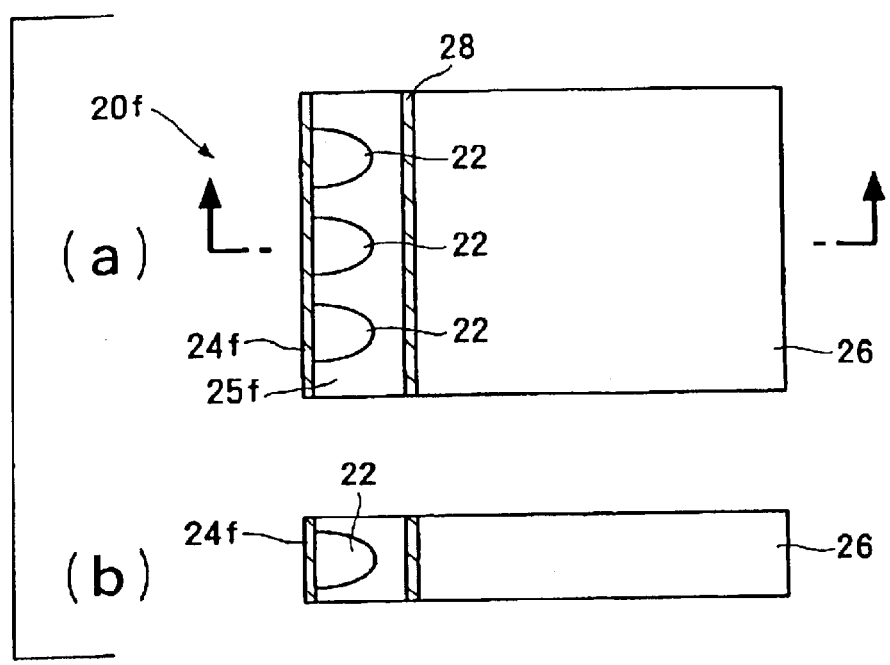
FIG. 25 is a constitutional view showing a sixth concrete example of the light source of the image display device according to the present invention.

FIGS. 25(a) and 25(b) are structural views illustrating an outline of the structure of a sixth concrete example of a light source section of the image display device according to the present invention. Specifically, FIG. 25(a) is a sectional view showing an outline of the light source section in parallel with an observation plane of the image display device, and FIG. 25(b) is a sectional view showing the outline thereof perpendicular to the observation plane of the image display device.

Similar to the foregoing light source sections 20d and 20e, the light source section 20f illustrated in FIGS. 25(a) and 25(b) comprises a installation portion 25f in which semiconductor light emitting elements 22 exhibiting light emission peaks in the wavelength zones of, for example, red (R), green (G) and blue (B), respectively, are arranged as a light source.

Then, a light diffusion plate 28 is provided between the installation section 25 and the light guiding plate 26. By arranging the light diffusion plate 28 near the light sources 22, that is, the semiconductor light emitting elements, the lights of the RGB colors are mixed so that the occurrence of unevenness of color can be suppressed.

Figure 26:
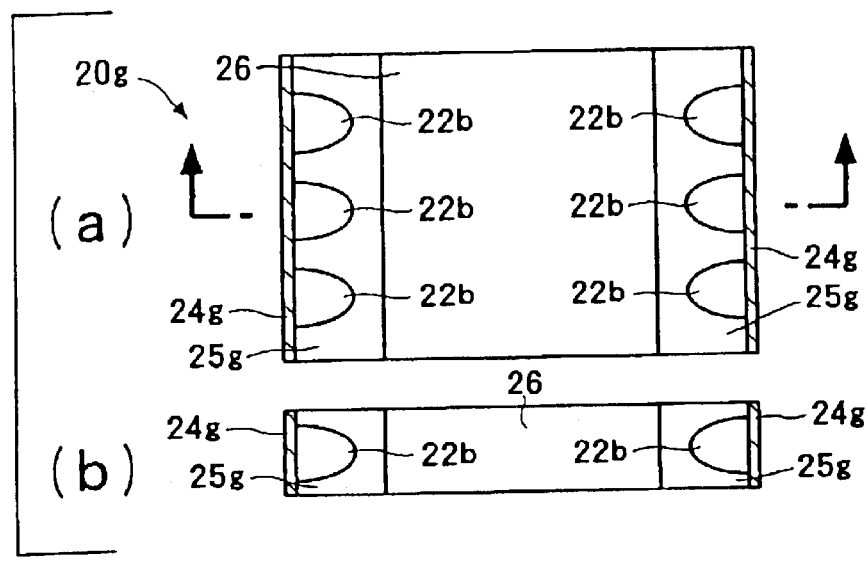
FIG. 26 is a constitutional view showing a seventh concrete example of the light source of the image display device according to the present invention.

FIGS. 26(a) and 26(b) are sectional views showing an outline of the structure of a seventh concrete example of the light source section of the image display device according to the present invention. Specifically, FIG. 26(a) is a sectional view showing an outline of the light source section in parallel with an observation plane of the image display is device and FIG. 26(b) is a sectional view showing the outline thereof perpendicular to the observation plane.

The light source section 20g illustrated in FIGS. 26(a) and 26(b) comprises a installation section 25g arranged on the right and left ends thereof with the light guiding plate 26 interposed therebetween, LED lamps 22b being arranged in each of 25g. By arranging the LED lamps 22b on both sides of the light guiding plate 26, the number of the light sources increases so that luminance of the light source section can be further increased.

Figure 27:
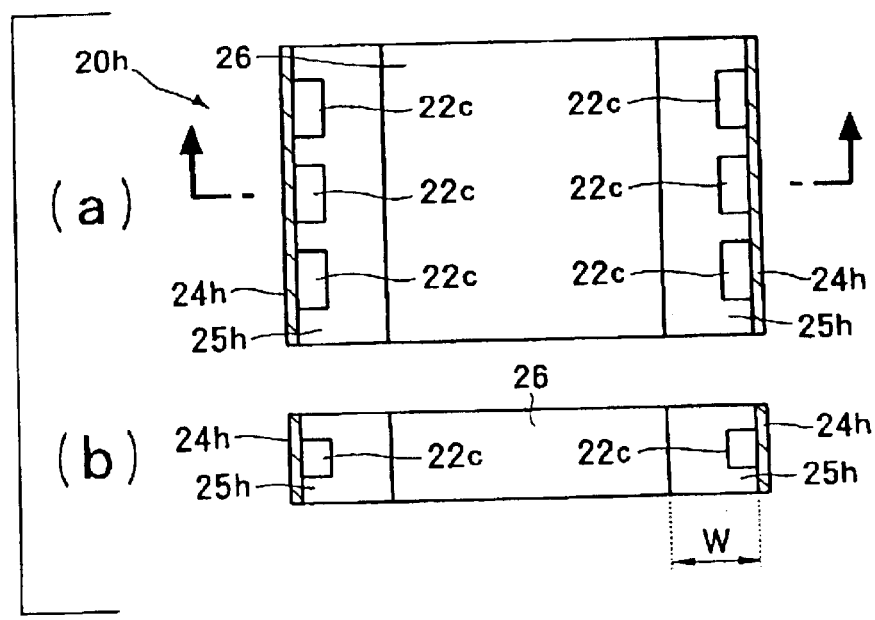
FIG. 27 is a constitutional view showing an eighth concrete example of the light source of the image display device according to the present invention.

FIGS. 27(a) and 27(b) are sectional views showing an outline of the structure of an eighth concrete example of the light source section of the image display device according to the present invention. Specifically, FIG. 27(a) is a sectional view showing an outline of the light source section in parallel with an observation plane of the image display device and FIG. 27(b) is a sectional view showing the outline perpendicular to the observation plane of the image display device.

The light source section 20h illustrated in FIGS. 27(a) and 27(b) comprises installation sections 25h arranged in the left and right end portions thereof with the light guiding plate 26 interposed therebetween, and SMD lamps 22c being arranged in each of the installation sections 25h and 25h. By arranging the LED lamps 22c on both sides of the light guiding plate 26, the number of the light sources is increased so that the luminance of the light source section can be increased. Moreover, the width W of the installation section 25h can be made smaller compared to the case of the LED lamp 22c, whereby the image display device can be made smaller. Furthermore, if the LED chip 22a is used instead of the SMD lamp 22c, the width W of the installation section 25 can be reduced more, whereby the size of the image display device can be made smaller furthermore.

Figure 28:
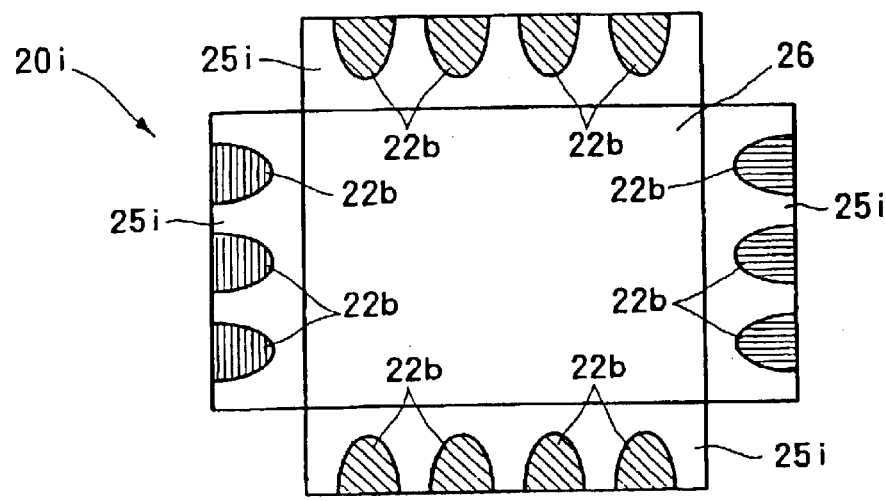
FIG. 28 is a constitutional view showing a ninth concrete example of the light source of the image display device according to the present invention.

FIG. 28 is a structural view showing an outline of the structure of a ninth concrete example of the light source section of the image display device according to the present invention. Specifically, FIG. 28 is a sectional view showing an outline of the light source section in parallel with an observation plane of the image display device. The light source section 20i illustrated in FIG. 28 comprises installation sections 25i arranged at four sides of the light guiding plate 26, and LED lamps 22b arranged in each of the installation sections 25i. By arranging the LED lamps 22b at the four sides of the light guiding plate 26, the number of the light sources increases so that the luminance of the light source section can be improved furthermore.

Figure 29:
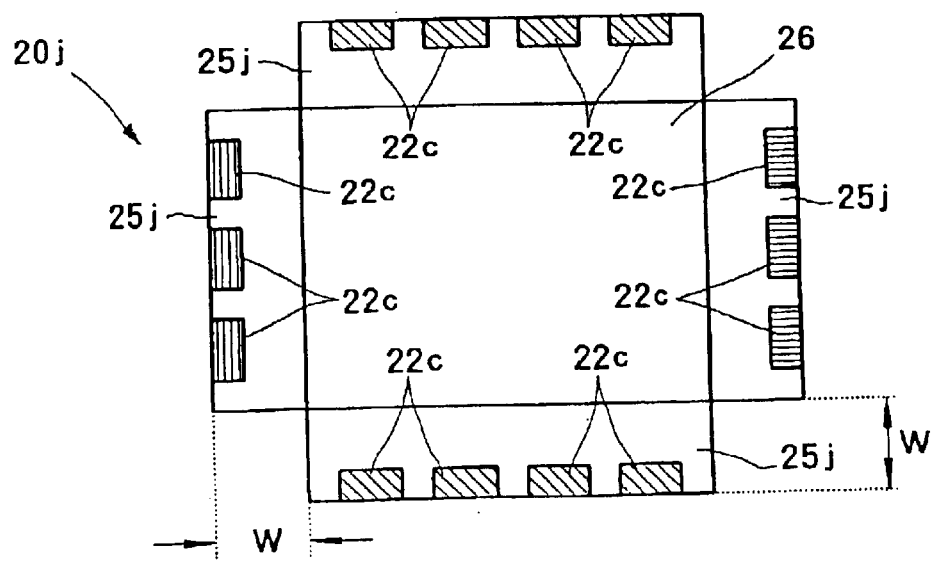
FIG. 29 is a constitutional view showing a tenth concrete example of the light source of the image display device according to the present invention.

FIG. 29 is a structural view showing an outline of the structure of a tenth concrete example of the light source section of the image display section according to the present invention. Specifically, FIG. 29 is a sectional view showing an outline of the light source section in parallel with an observation plane of the image display device. The light source section 20j shown in FIG. 29 comprises installation sections 25j arranged on four sides of the light guiding plate 26, and SMD lamps 22c arranged in each of the installation sections 25j. By arranging the SMD lamps 22c on the four sides of the light guiding plate 26, the number of the light sources is further increases so that the luminance of the light source section can be further increased. Moreover, the width W of the installation sections 25j can be reduced in comparison to the case of the LED lamp 22b, whereby the size of the image display device can be reduced. Furthermore, if the LED chip 22a is used instead of the SMD lamp 22c, the width W of the installation section 25 can be further reduced so that the size of the image display device can also be further reduced.

Figure 30:
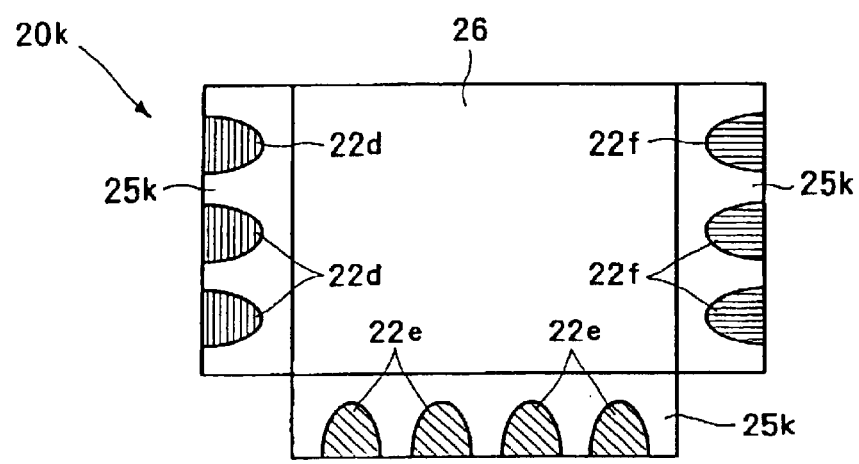
FIG. 30 is a constitutional view showing an eleventh concrete example of the light source of the image display device according to the present invention.

FIG. 30 is a structural view showing an outline of the structure of an eleventh concrete example of the light source section of the image display device according to the present invention. Specifically, FIG. 30 is a sectional view showing an outline of the light source section in parallel with an observation plane of the image display device. The light source section 20k shown in FIG. 30 comprises installation sections 25k arranged on three sides of the light guiding plate 26, and a red colored, green colored and blue colored LED lamps 22d, 22e and 22f are respectively arranged in each of the installation sections 25k. By arranging three color LED lamps 22d, 22e and 22f separately on the three sides of the light guiding plate 26, the occurrence of the local color unevenness is suppressed, whereby neutral tinted colors can evenly be obtained on the whole image screen.

Figure 31:
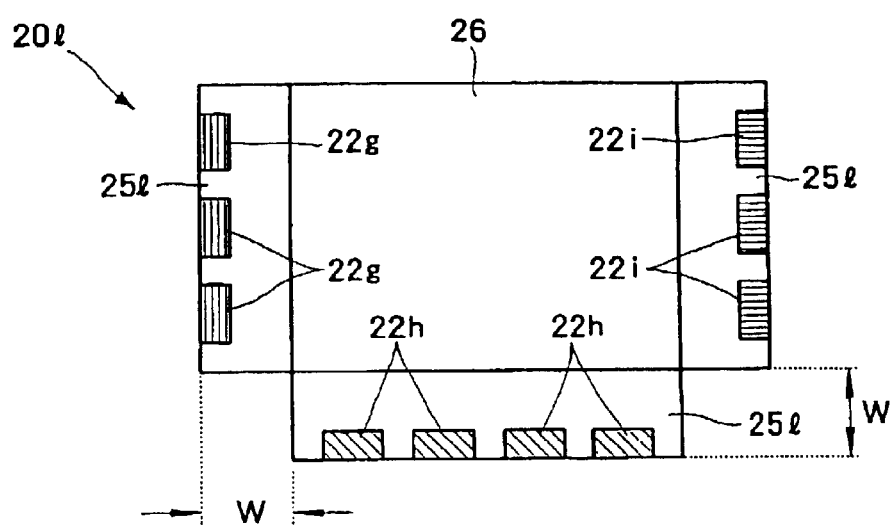
FIG. 31 is a constitutional view showing a twelfth concrete example of the light source of the image display device according to the present invention.

FIG. 31 is a constitutional view showing an outline of a twelfth concrete constitution of the light source section of the image display device according to the present invention. Specifically, FIG. 31 is a sectional view showing an outline of the light source section in parallel with the observation plane of the image display device. The light source section 201 shown in FIG. 31 comprises installation sections 25*l* arranged on three sides of the light guiding plate 26, and red color SMD lamps 22*g*, green color SMD lamps 22*h* and blue color SMD lamps 22*i* are arranged in the respective installation sections 25*l*. By arranging the SMD lamps separately on the three sides of the light guiding plate 26, the occurrence of the local color unevenness can be suppressed so that neutral tinted colors can be obtained evenly all over the entire image screen. Moreover, the width W of the installation section 25 can be reduced more compared to the case of the LED lamp 22*b*, whereby the side of the image display device can be reduced. Furthermore, if the LED chip 22*a* is used instead of the SMD lamp 22*c*, the width W of the installation section 25 can be further reduced, whereby the size of the image display device can be further reduced.

Figure 32:
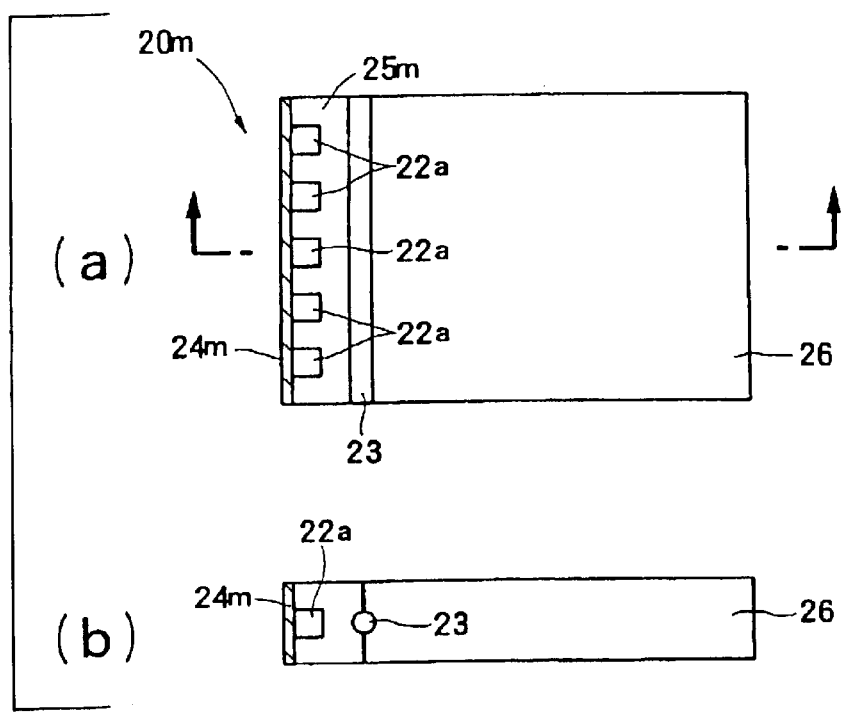
FIG. 32 is a constitutional view showing a thirteenth concrete example of the light source of the image display device according to the present invention.

FIGS. 32(*a*) 32(*b*) are structural views showing an outline of the structure of a thirteenth concrete example of the light source section of the image display device according to the present invention. Specifically, FIG. 32(*a*) is a sectional view showing an outline of the light source section in parallel with an observation plane of the image display device and FIG. 32(*b*) is a sectional view showing an outline of the light source section perpendicular to the observation plane of the image display device.

The light source section 20*m* shown in FIGS. 32(*a*) and 32(*b*) comprises an LED array unit 25*m* fitted to one side of the light guiding plate 26. The LED array unit 25*m* is a unified part which comprises LED chips 22*a* and a rod lens 23 arranged in a designated space between LED array unit 25*m* and light guiding plate 26. The rod lens 23 has a long cylindrical shape and is arranged along the longitudinal direction of the LED array unit 25*m*. By using such LED array unit, a light emission intensity distribution which is uniform in the longitudinal direction of the rod lens can be obtained. The rod lens also converges the light from the LED chips 22*a* in a transverse direction. Moreover, since the light source section 20*m* can be constituted only by unifying the light guiding plate 26 and the LED array unit, assembly steps can be simplified.

Figure 33:
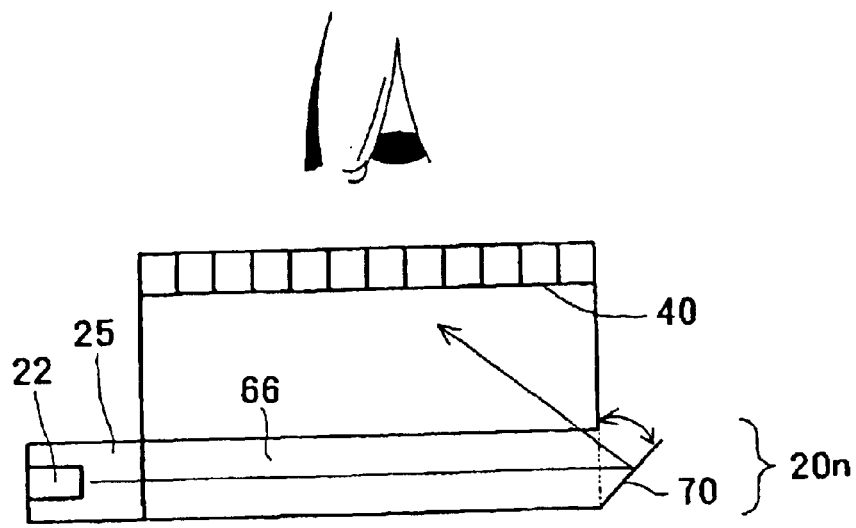
FIG. 33 is a constitutional view showing a fourteenth concrete example of the light source of the image display device according to the present invention.

FIG. 33 is a sectional view showing an outline of a fourteenth concrete constitution of the light source section of the image display device according to the present invention. Specifically, the image display device shown in FIG. 33 comprises a light source section 20*n* and a wavelength conversion section 40. Here, the light source section 20*n* comprises a installation section 25 at a one end of its light guiding portion 66, and a movable mirror 70 at the other end thereof. The movable mirror 70 is designed such that it moves in the arrow direction shown in the drawing and changes its inclination angle. The movable mechanism of the mirror 70 may be moved by a motor or an electromagnet (not shown), or it may use a piezoelectric element. Moreover, the movable mirror 70 may be a slender mirror united in the arrow direction, or may be constituted by arranging individual small mirrors in the arrow direction, each mirror corresponding to each pixel.

The installation section 25 comprises a light source 22. Here, a light emitting diode may be used as the light source 22, or a laser diode may be used. Light emitted from the light source 22 is reflected by the movable mirror 70, and irradiated onto the position of the predetermined designated pixel of the wavelength conversion section 40. Therefore, by adjusting the amount of light of the light source 22 and moving the movable mirror 70 in synchronization with the amount of light, light can be incident onto each pixel of the wavelength change section 40 with designated intensity. Thus, a designated image can be displayed.

In a case where a light source such as the light source section 20*n* is used, a light adjustment section using liquid crystal will be unnecessary. Therefore, the constitution of the image display device is simplified. Moreover, since it is unnecessary to use liquid crystal, the image display device can be used in a wide temperature range and the response characteristic of the image display is good. The image display device of the present invention can improve its function against weather conditions.

Figure 34:
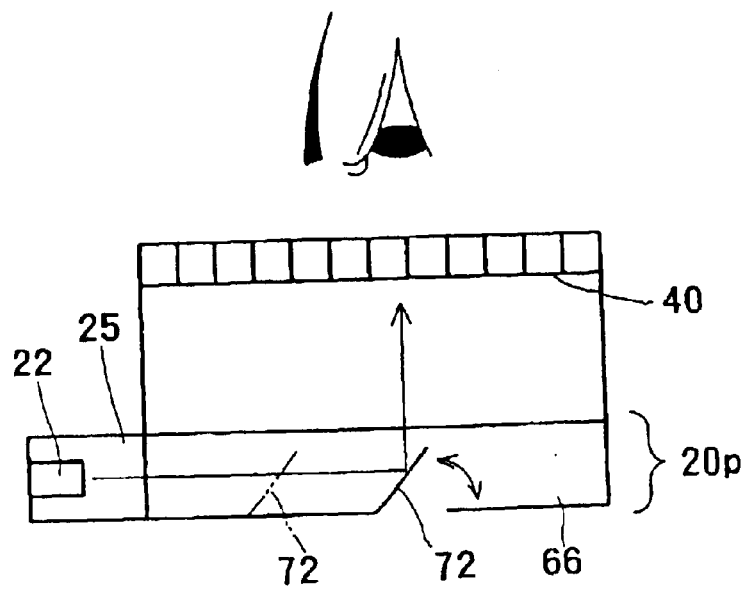
FIG. 34 is a constitutional view showing a fifteenth concrete example of the light source of the image display device according to the present invention.

FIG. 34 is a sectional view showing an outline of the structure of a fifteenth concrete constitution of the light source section of the image display device according to the present invention. Specifically, the image display device shown in FIG. 34 comprises a light source section 20*p* and a wavelength conversion section 40. Here, the light source section 20*p* comprises a installation section 25 at one end of a light guiding portion 66. A light emitting diode may be used as the light source 22, or a laser diode may be used.

Moreover, the light guiding portion 66 comprises a plurality of movable mirrors 72, 72, ..., 72 therein, each mirror arranged corresponding to each of the pixel columns. The movable mirrors 72, 72, ..., 72 are designed so that they move in the illustrated arrow direction and reflect the light from the light source section 22 in the corresponding pixels. Each movable mechanism of them may use, for example, a motor or an electromagnet (not shown), or, the movable mechanism may use a piezoelectric element. The movable mirrors 72, 72, ..., 72 may be a slender mirror unified along the direction of the column of the pixels. Or, each of the movable mirrors 72, 72, ..., 72 may be arranged as an individual small mirror, corresponding to each of the pixels in the direction of corresponding pixel columns.

The light emitted from the light source section 22 is reflected by one of the movable mirrors 72, 72, ..., 72, and irradiated onto the corresponding pixel of the wavelength conversion section 40, the pixel being disposed a designated position. Therefore, the amount of light of the light source 22 is adjusted and one of the movable mirrors 72, 72, ..., 72 is moved in synchronization with it. The light is reflected by the mirror. The light of a designated intensity is allowed to incident onto each of the pixels of the wavelength conversion section 40. Thus, the designated image can be displayed.

Also in a case where such light source section 20*p* is used, the light adjustment section using liquid crystal is unnecessary. Therefore, the constitution of the image display device can be simplified. In addition, since it is unnecessary to use liquid crystal, the image display device of the present invention can be used in a wide temperature range, and exhibit a good response characteristic for image display. Moreover, the image display device of the present invention can improve its function against weather conditions.

Figure 35:
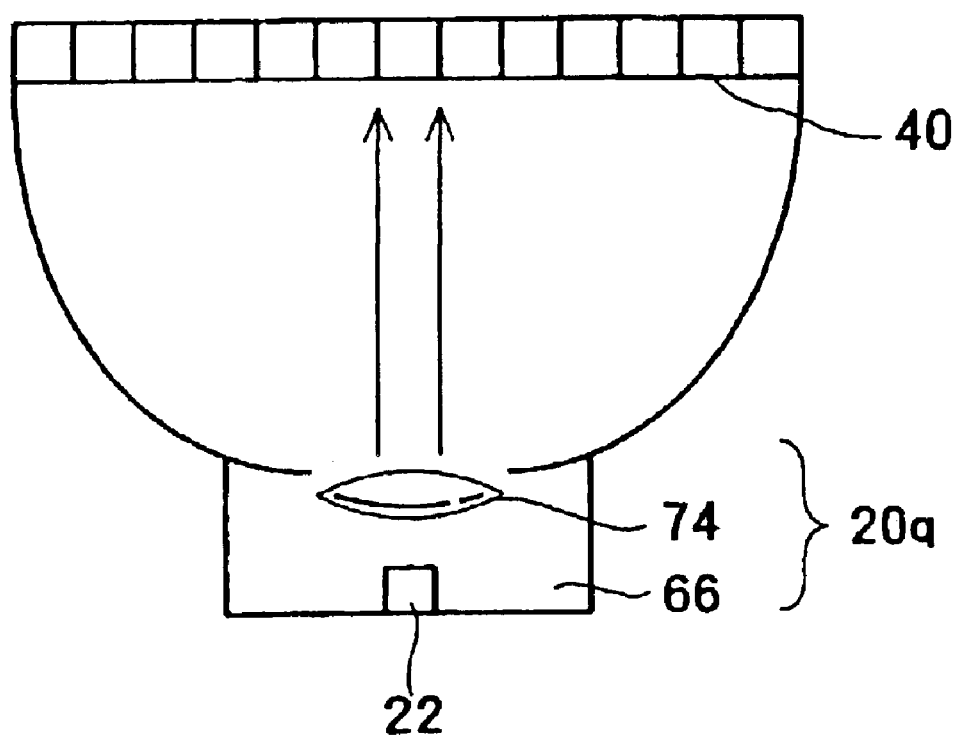
FIG. 35 is a constitutional view showing a sixteenth concrete example of the light source of the image display device according to the present invention.

FIG. 35 is a sectional view showing the outline of the structure of a sixteenth concrete example of the light source section of the image display device according to the present invention. Specifically, the image display device shown in FIG. 35 comprises a light source section 20*q* and a wavelength conversion section 40. Here, the light source section 20*q* comprises a light source 22 at a lowermost end of the light guiding portion 66. A light emitting diode may be used as the light source 22, or a laser diode may be used. Moreover, a movable lens 74 is arranged in the front of the light source 22. The movable lens 74 has an ability to move obliquely and horizontally and to make the light from the light source 22 incident onto a pixel disposed at a designated position of the wavelength conversion section 40.

A movable mechanism of the movable lens 74 may use, for example, a motor or an electromagnet (not shown), or the movable mechanism may use a piezoelectric element. Furthermore, a mechanism in which the movable lens 74 is fixed, and the light source 22 is freely movable and the light from the light source 22 is incident onto the pixel at a designated position of the wavelength conversion section 40 may be adopted. Also, a combination of the movable lens and a freely movable light source 22 may be utilized.

The light emitted from the light source 22 is collected by the movable lens 74, and irradiated onto a pixel at a designated position of the wavelength conversion section 40. Therefore, by adjusting the amount of light from the light source 22, and moving the movable lens 74 in synchronization with it and performing a scan, the light of a predetermined intensity can be incident onto each of the pixels of the wavelength conversion section 40. Thus, a predetermined image can be displayed.

In a case where such light source section $20q$ is used, a light adjustment section using liquid crystal is also unnecessary. Therefore, since it is unnecessary to use liquid crystal, the image display device of the present invention can be used in a wide temperature range, and exhibit a good response characteristic for image display. The image display device of the present invention can improve its function against weather conditions.

Figure 36:
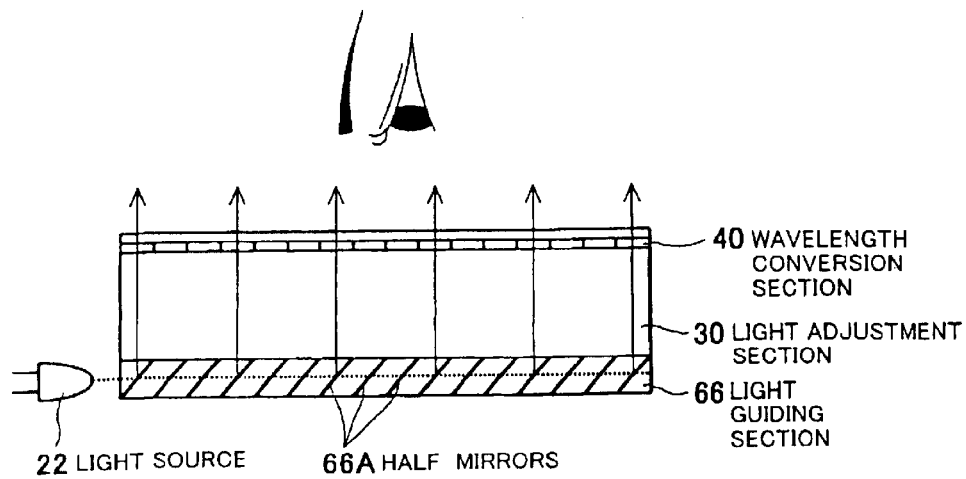
FIG. 36 is a constitutional view showing a seventeenth concrete example of the light source of the image display device according to the present invention.

FIG. 36 is a sectional view showing an outline of the structure of a seventeenth concrete example of the light source section of the image display device according to the present invention. Specifically, the image display device shown in FIG. 36 comprises a light guiding section 40, a light adjustment section 30 and a wavelength conversion section 40. The light guiding section 66 comprises plural half mirrors 66A each pixel or for each column therein. The light from the light source is reflected by the half mirror, and reaches the wavelength conversion section after passing through the light adjustment section 30.

By using the half mirror, light is less scattered compared to the light source section using a conventional reflection sheet or dot printing plane. The light from the light source can be conducted to the light adjustment section effectively since the light is less scattered. Such effects will be remarkable when a light source exhibiting a high light collection characteristic such as an LED or a semiconductor laser is used. Moreover, if the light source section is designed such that the reflection light passes through the a somewhat smaller area than that of the pixel by adjusting the magnitude of the reflection plane of the mirror, the leakage of the light between the pixels is suppressed so that blurring or unsharpness of the pixel can also be prevented.

Figure 37:
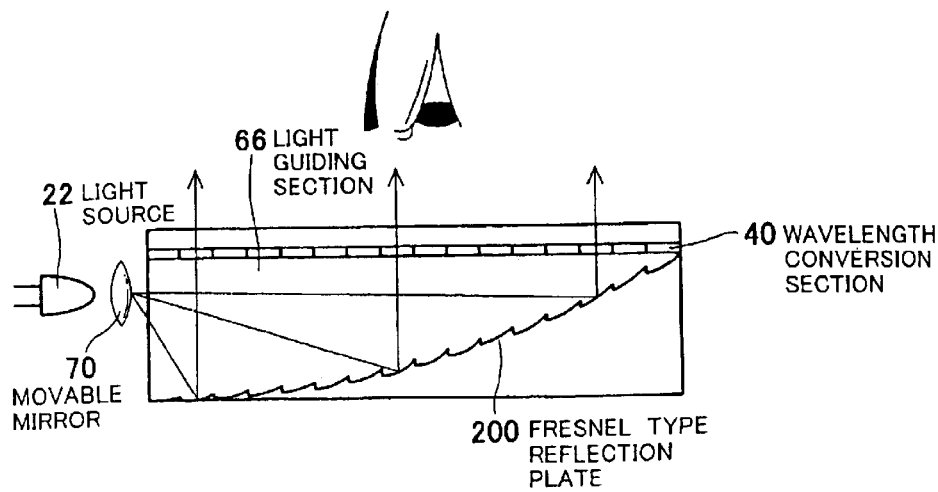
FIG. 37 is a constitutional view showing a eighteenth concrete example of the light source of the image display device according to the present invention.

FIG. 37 is a sectional view showing an outline of the structure of an eighteenth concrete example of the light source section of the image display device according to the present invention. Specifically, the image display device illustrated in FIG. 37 comprises a Fresnel type reflection plate 200, which has a reflection surface that transmits reflection light into each of the pixels. Moreover, a light source 22 or a movable mirror 70 are arranged on the side portion of the light guiding section 66, whereby the light is sequentially supplied to the corresponding reflection mirrors.

Alternatively, the light source 22 may be moveable, and light emitted from the movable light source is concentrated by the movable lens and scanned in the light guiding section 66, and sequentially irradiated by respective Fresnel type reflection mirrors onto a pixel at a designated position of the wavelength conversion section 40. Whether or not the light source is moveable, by adjusting the amount of light of the light source and moving the movable lens in synchronization with it to perform a scan, the light of the predetermined intensity can be supplied to each of the pixels of the wavelength conversion section. With such structure, the designated image can be displayed.

Also in the case where such light source section is used, a light adjustment section using liquid crystal or the like is unnecessary. Therefore, the constitution of the image display device of the present invention can be simplified. Moreover, since it is unnecessary to use liquid crystal, the image display device can be used in a wide temperature range, and has a good response characteristic for displaying an image. The image display device of the present invention also increases its resistance to weather conditions.

Figure 38:
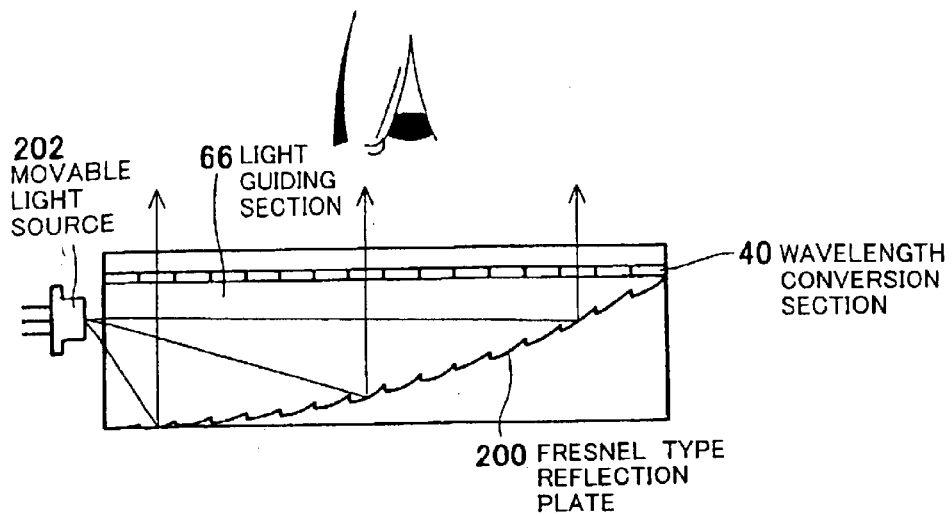
FIG. 38 is a constitutional view showing a nineteenth concrete example of the light source of the image display device according to the present invention.

FIG. 38 is a sectional view showing an outline of the structure of a nineteenth concrete example of the light source section of the image display device according to the present invention. Specifically, in the 6 section 66, the image display device illustrated in FIG. 38 also comprises a Fresnel type reflection plate 200 having a reflection plane which emits the reflection light onto each of the pixels.

Moreover, on the side of the light guiding section 30, the movable light source 202 is disposed, and the light is sequentially supplied to respective reflection mirrors of the Fresnel type reflection plate 200. Specifically, the movable light source may be designed so that light emitting elements itself are mechanically moved, such as light emitting elements in an LED and a semiconductor laser, for example. Alternatively, means for polarizing the light may be provided in front of these light emitting elements (not shown).

The light emitted from the movable light source 202 is scanned in the light guiding section 66, and sequentially irradiated onto the designated pixel location of the wavelength conversion sections by the respective Fresnel type reflection mirrors.

Therefore, by adjusting the amount of light and moving the movable light source in synchronization to perform a scan, the light of a designated intensity can be incident onto the pixels of the wavelength conversion section 40. Therefore, a designated image can be displayed. In a case where such light source sections are used, a light adjustment section using a liquid crystal and the like will be unnecessary. Therefore, the constitution of the image display device of the present invention can be simplified. Moreover, since it is unnecessary to use a liquid crystal, the image display device of the present invention can be used in a wide temperature range and exhibits a good response characteristic for displaying an image. Also resistance to weather conditions can be improved in the image display device of the present invention.

Figure 39:
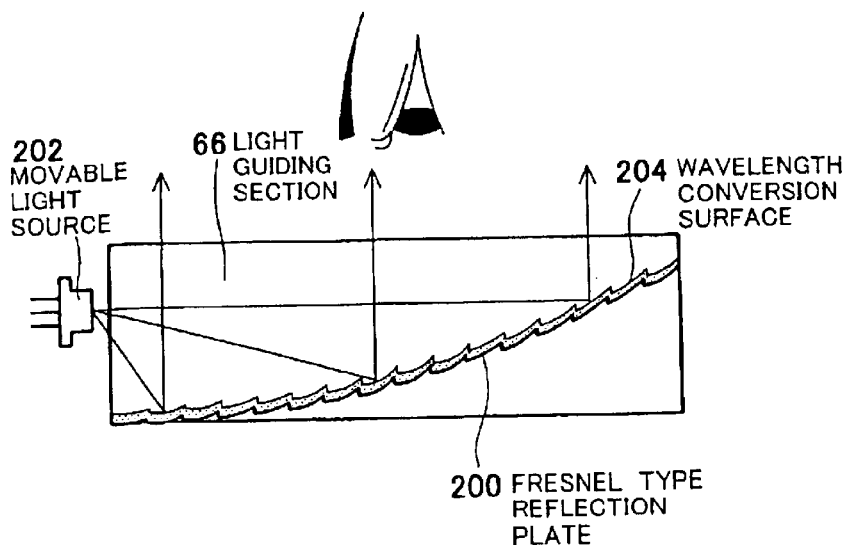
FIG. 39 is a constitutional view showing a twentieth concrete example of the light source of the image display device according to the present invention.

FIG. 39 is a sectional view showing an outline of the structure of a twentieth concrete example of the light source section of the image display device according to the present invention. Specifically, in the light guiding section, the image display device illustrated in FIG. 39 also comprises a Fresnel type reflection plate 200 having a reflection plane which emits the reflection light onto each of the pixels. However, in the image display device illustrated in FIG. 39, a wavelength conversion section 40 is formed on the reflection plane of the Fresnel type mirror. For example, a phosphor material 204 is deposited in the reflection plane of the mirror as the wavelength conversion section 40.

Moreover, on the side of the light guiding section 66, the movable light source 202 is disposed, and the light is sequentially supplied to the respective reflection mirror of the Fresnel type reflection plate 200. Specifically, the movable light source may be designed so that light emitting elements itself, for example, such as LED and a semiconductor laser are mechanically moved. Alternatively, means for polarizing the light may be provided in front of these light emitting elements (not shown).

The light emitted from the movable light source is scanned in the light guiding section, and sequentially irradiated onto the wavelength conversion planes which are deposited on the reflection planes of the respective Fresnel type reflection mirrors. Then, the wavelength of the light is changed so that the light is emitted from observation plane as image information corresponding to each pixel.

Therefore, by adjusting an amount of light and moving the movable light source 202 in synchronization to perform a scan, light of a designated intensity can be incident onto the respective wavelength conversion sections on the reflection planes which correspond to each pixel. In a case where such light source sections are used, a light adjustment section using liquid crystal and the like will be unnecessary. In addition, the provision of another wavelength conversion section will also be unnecessary. Therefore, an extremely simplified constitution of the image display device of the present invention can be obtained, and the image display device of the present invention can be manufactured to be smaller and thinner. Moreover, since it is unnecessary to use liquid crystal, the image display device of the present invention can be used in a wide temperature range and exhibits a good response characteristic for displaying an image. Also resistance to weather conditions will be improved in the image display device of the present invention.

Figure 40:
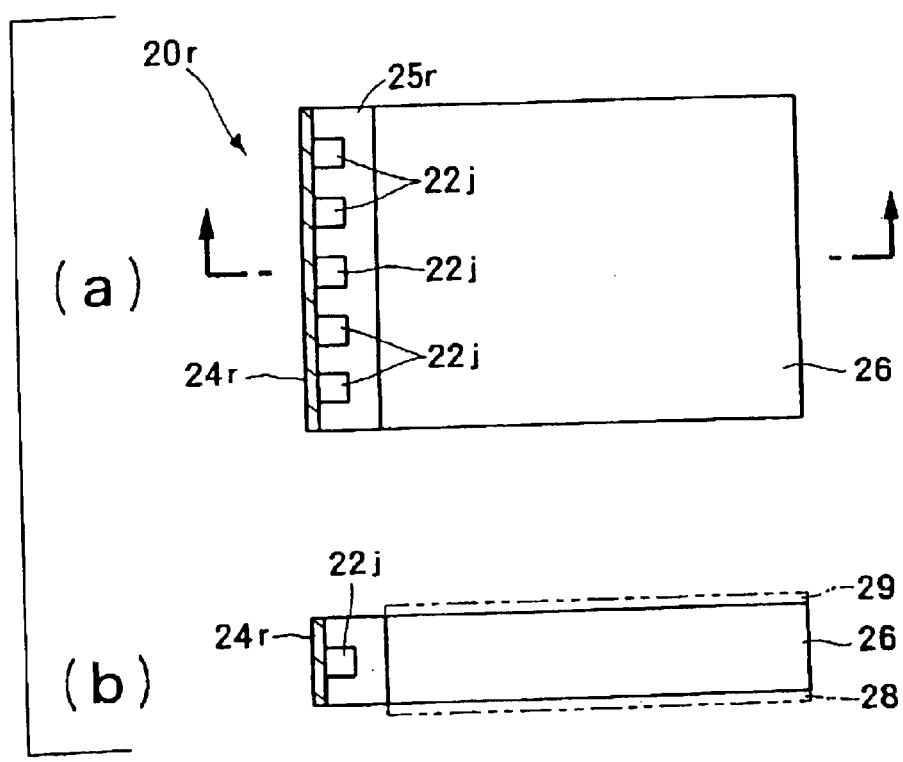
FIG. 40 is a constitutional view showing a twenty-first concrete example of the light source of the image display device according to the present invention.

FIGS. 40(a) and 40(b) are structural views showing an outline of the structure of a twenty-first concrete example of the light source section of the image display device according to the present invention. Specifically, FIG. 40(a) is a sectional view showing an outline of the light source section in parallel with an observation plane of the image display device, and FIG. 40(b) is a sectional view showing the outline perpendicular to the observation plane of the image display device thereof.

The light source section 20r shown in FIGS. 40(a) and 40(b) comprises a installation section 25r arranged at one end of the light guiding plate 26. In the installation section 25r, a laser diodes 22j as a light source is arranged.

As described above, by using laser diodes 22j as the light source, light collection characteristics are improved. Moreover, since the image display device of the present invention can easily narrow down the light to a form of beam light, the light source section of FIGS. 40(a) and 40(b) is especially effective when one or more mirrors of FIGS. 33 and 34 perform a light scan.

Figure 41:
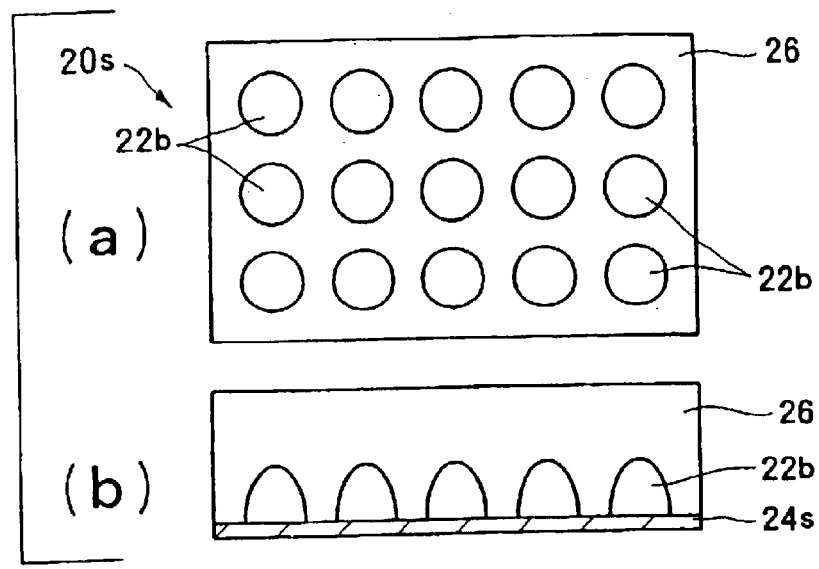
FIG. 41 is a constitutional view showing a twenty-second concrete example of the light source of the image display device according to the present invention.

FIGS. 41(a) and 41(b) are structural view showing an outline of the structure of a twenty-second concrete example of the light source section of the image display device according to the present invention. Specifically, FIG. 41(a) is a sectional view showing an outline of the light source section in parallel with an observation plane of the image display device, and FIG. 41(b) is a sectional view showing an outline thereof perpendicular to the observation plane of the image display device.

The light source section 20s illustrated in FIGS. 41(a) and 41(b) comprises LED lamps 22b arranged on the lower surface of the light guiding section 26 with designated spaces in between. By illuminating upward with the LED lamps 22b, it is possible to significantly reduce the width of the frame section of the image display device, that is, the width of the periphery section of the display region, and a reduction in size of the image display device can be realized. Moreover, the LED lamps 22b are arranged with a high density, whereby luminance of the image display device can be easily increased, and thus a bright image can be obtained.

Figure 42:
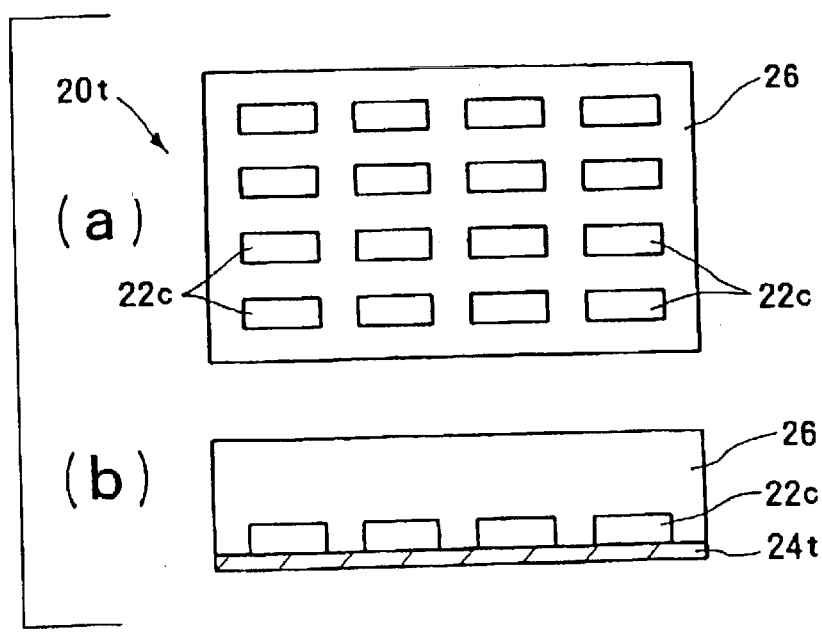
FIG. 42 is a constitutional view showing a twenty-third concrete example of the light source of the image display device according to the present invention.

FIGS. 42(a) and 42(b) are structural views showing an outline of the structure of a twenty-third concrete example of the light source section of the image display device according to the present invention. Specifically, FIG. 42(a) is a sectional view showing an outline of the light source section in parallel with an observation plane of the image display device, and FIG. 42(b) is a sectional view showing an outline perpendicular to the observation plane of the image display device thereof.

The light source section 20t illustrated in FIGS. 42(a) and 42(b) comprises SMD lamps 22c arranged on the lower surface of the light guiding section 26 with designated spaces in between. By illuminating upward with the SMD lamps 22c, the width of the frame section of the image display device, that is, the width of the periphery section of the display region can be significantly reduced, whereby the reduction in the size of the image display device can be realized.

By arranging the SMD lamps 22c with a high density, luminance can be easily increased, so that a bright image can be obtained. Moreover, since the SMD lamps 22c have a smaller dimension in height than that of the LED lamps, the thickness of the light source section 20t can be reduced. By arranging LED chips instead of the SMD lamps 22c, a higher density mounting will be possible thereby further increasing luminance, and, at the same time, the thickness of the light source section 20t can further be reduced.

Figure 43:
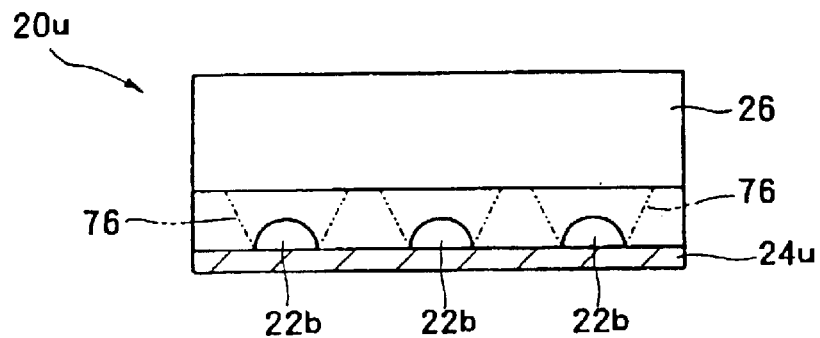
FIG. 43 is a constitutional view showing a twenty-fourth concrete example of the light source of the image display device according to the present invention.

FIG. 43 is a sectional view showing an outline of the structure of a twenty-fourth concrete example of the light source section of the image display device according to the present invention. The light source section 20u illustrated in FIG. 43 comprises a substrate 24u arranged on the lower surface of the light guiding section 26, and LED lamps 22b arranged on the substrate 24u with designated spaces in between. Moreover, a reflection plate 76 is provided around each of the LED lamps 22b. By arranging the reflection plates 76 around the corresponding LED lamps 22b, it will be possible to extract the light that escapes laterally or downward and out put it in a direction toward the observation plane of the image display device, and utilization efficiency of light is improved.

Figure 44:
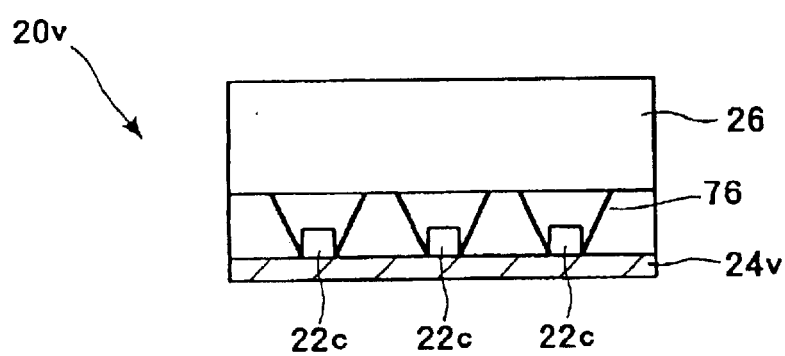
FIG. 44 is a constitutional view showing a twenty-fifth concrete example of the light source of the image display device according to the present invention.

FIG. 44 is a sectional view showing an outline of the structure of a twenty-fifth concrete example of the light source device of the image display device according to the present invention. The light source section 20v illustrated in FIG. 44 comprises a substrate 24v provided on the lower surface of the light guiding section 26, and SMD lamps 22c arranged on the substrate 24v with designated spaces in between. Moreover, reflection plates 76 are arranged around each of the SMD lamps 22c. By providing the reflection plates 76, the light that escape from the SMD lamps 22c laterally and downward can be extracted in the frontward direction of the image display device, thereby improving a light utilization efficiency. Moreover, the same effect can obtained by arranging LED chips instead of the SMD lamps 22c which includes advantages due to reduced size.

Figure 45:
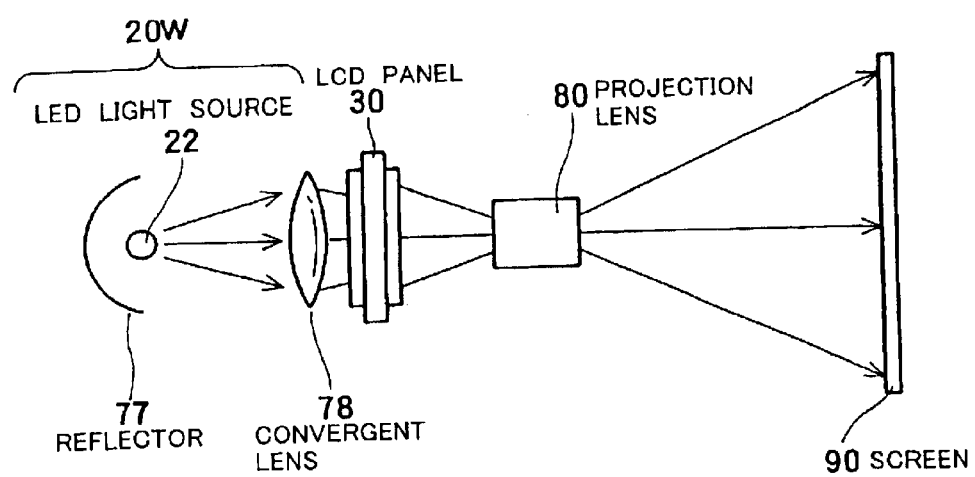
FIG. 45 is a constitutional view showing a twenty-sixth concrete example of the light source of the image display device according to the present invention.

FIG. 45 is a sectional view showing an outline of the structure of a twenty-sixth concrete example of the light source section of the image display device according to the present invention. The image display device illustrated in FIG. 45 is a so called projection type image display device. The image display device illustrated in FIG. 45 comprises a light source section 20W, a liquid crystal panel 30 and a projection lens 80. The light source section 20W comprises a convergent lens 78, a light source 22 and a reflector 77. A light emitting diode is used as the light source 22.

The light irradiated from the light source 22 is reflected by the reflector 77, and converged by the convergent lens 78. Thereafter, the converged light is incident onto the liquid crystal panel 30. Then, the light travels through the projection lens 80 so that a designated image is displayed on screen 90.

By using the light emitting diode as the light source, the life time of the light source is prolonged extremely, compared to that of a conventional arc lamp. Moreover, since the rise up time of the light emitting operation is short, the light source section is capable of performing an instantaneous operation.

Next, concrete examples of light sources of the image display device according to the present invention will be described.

Figure 46:
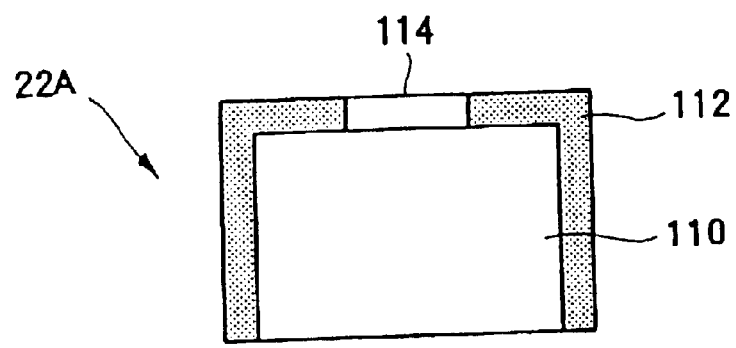
FIG. 46 is a sectional view showing an outline of a concrete example of the light source of the image display device according to the present invention.

FIG. 46 is a sectional view showing an outline of the structure of a first concrete example of a light source of the image display device according to the present invention. The light source 22A shown in FIG. 46 comprises a light emitting element 110 and a wavelength conversion material 112 deposited on the surface of the light emitting element 110. Moreover, the electrode portion 114 of the light emitting element 110 has a region where the wavelength change material 112 is not deposited. The region is subjected to a wire bonding for making electrical connections to the light emitting element 110.

The light emitting element 110 is a semiconductor element exhibiting a designated light emission wavelength peak. Moreover, the light emitting element 110 may be constituted of a so called a light emitting diode or a semiconductor laser. The material of the light emitting element 110 is properly determined depending on the required light emission wavelength zone. For example, in order to emit R, G and B color lights, the light emitting diode having a light emitting layer formed of gallium nitride as described in FIG. 4, which emits light of a wavelength in ultraviolet ray range should be used.

It should be preferable that the wavelength conversion material 112 exhibits an absorption excitation peak which agrees with the wavelength of light emitted from the light emitting element 110. For example, when the light emitting element is the one using gallium nitride, it should be preferable that the wavelength conversion material 112 exhibits the absorption peak as is shown in FIG. 5.

A fluorescent material should be employed as the wavelength change material 112. If the wavelength change material 112 is formed of the fluorescent material, any material such as fluorescent dye, fluorescent pigment and fluorescent substance will be sufficient as long as it is capable of changing the wavelength of the light from the light emitting element to a different wavelength thereof. Moreover, it is sufficient that the wavelength conversion material 112 is deposited on at least one part of the surface of the light emitting element 110.

It is possible to suitably select the wavelength of the light emitted from the wavelength change material 112 in accordance with use. For example, in order to use the wavelength change material 112 as a light source of an image display device performing a full color display, a mixture of the fluorescent substances which absorbs emitted ultraviolet rays and emits lights having each wavelength of red (R), green (G) and blue (B) color zones, as described referring to FIG. 4. Moreover, when the light emitting element 110 emits blue light, a fluorescent substance which absorbs this blue light and emits the green and red color lights can be used. For example, $Y_2O_2S$: Eu f or emitting red color, (Sr, Ca, Ba, Eu)$_{10}$ (PO$_4$)$_6$·Cl$_2$ for emitting blue light and 3 (Ba, Mg, Eu, Mn) 0.8Al$_2$O$_3$ can be mentioned for such fluorescent substance.

A light emitting element emits light by recombinations of holes with electrons inside a semiconductor crystal upon the injection of the electrons into a semiconductor crystal. In conventional light emitting elements, due to the difference in refraction ratio between the semiconductor and air or between the semiconductor and mold resin and the light is partially trapped inside. As a result, the light to be extracted from the light emitting element to the outside was as little as 2% of the entire light. However, in the light source 22A according to the present invention, the light reaching the surface of the light emitting element 110 is absorbed in the wavelength conversion material 112 and the wavelength of the light is changed so that the light can be extracted to the outside. The light source 22A shown in FIG. 46 can be manufactured in the manufacturing steps of the light emitting element 110 by depositing the wavelength conversion material 112 on the surface of the light emitting element 110 using a sputtering method. Alternatively, the light source 22A can be manufactured either by applying the wavelength conversion material 112 to the surface of the light emitting element 110 or coating it thereon, in any of the manufacturing steps for the element 110.

The use of the light source 22A of the present invention is not limited to a light source of an image display device. Specifically, the light source 22A of the present invention can be used as a novel and high-performance light source in light sources for various kinds of display devices such as an indicator or a panel and in light sources for reading and writing of optical disks.

Figure 47:
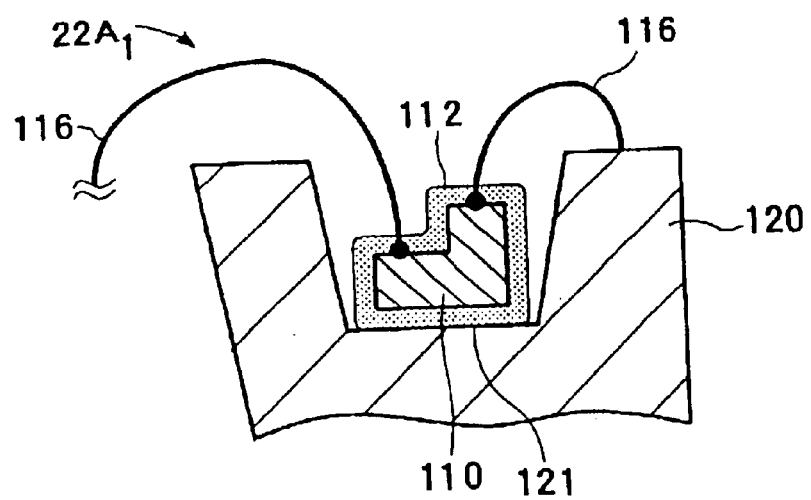
FIG. 47 is a sectional view showing an outline of a concrete example of the light source section 22A.

FIG. 47 is a sectional view showing an outline of a concrete example of the light source 22A. Specifically, the light source 22A$_1$ shown in FIG. 47 comprises a light emitting element 110, a wavelength conversion material 112 deposited on the surface thereof and a mounting material 120. A light emitting diode formed of a gallium nitride type compound semiconductor, and a semiconductor laser can be used as the light emitting element 110, for example. The wavelength conversion material 112 is deposited approximately on the entire surface of the light emitting element 110. A fluorescent substance which absorbs light from the light emitting element 110 and emits red (R), green (G) and blue (B) color lights can be used as the wavelength conversion material 112.

The light emitting element 110 is mounted on the bottom surface of a cup section 121 of the mounting material 120. Moreover, wires 116 and 116 are bonded onto the light emitting element 110, and a driving current is supplied via wires 116 to the light emitting element 110.

The light source shown in FIG. 47 is capable of producing the lights having a plurality of wavelengths such as red (R), green (G) and blue (B) colors, using one light emitting element. Therefore, the constitution of the light source is simplified, and the size and weight thereof is reduced. In addition, the driving circuit for the light source can also be simplified.

Figure 48:
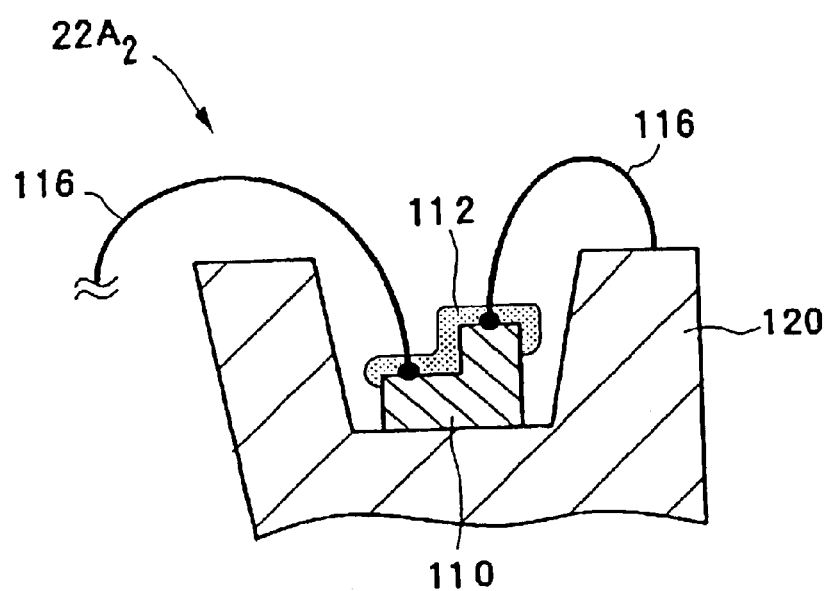
FIG. 48 is a sectional view showing an outline of a concrete example of the light source section 22A.

FIG. 48 is a sectional view showing an outline of the structure of a concrete constitution of the light 22A.

Specifically, in the light source 22A₂ shown in FIG. 48, the wavelength conversion material 112 is deposited on the part of the surface of the light emitting element 110. Therefore, the light emitted from the light emitting element 110 is partially absorbed in the wavelength conversion material 112, and the wavelength of the light is changed. Thereafter, the light is outputted to the outside. The remaining light is exhausted as light having an intact wavelength as light from the light emitting element 110. For example, in a case where the light emitting element 110 produces blue color light and the wavelength change material 112 is formed of a material which absorbs blue color light and produces red and green color lights, lights of wavelengths in red (R) color, green (G) color and blue (B) color ranges are obtained.

By adjusting the area where the wavelength conversion material 112 is deposited, it will be possible to control the intensity balance of the respective wavelength components of lights in the red, green and blue color range. For example, when the intensity of the red (R) color component is increased, it will be sufficient to increase a red (R) color light emission component of the wavelength conversion material 112, and at the same time, increase the area for the material.

Specifically, according to the present invention, the lights, having a plurality of wavelengths of the red (R), green (G) and blue (B) color ranges, can be emitted from the light source section. In addition, it is possible to easily control the intensity balance of the wavelength components of the red (R), green (G) and blue (B) color lights.

Figure 49:
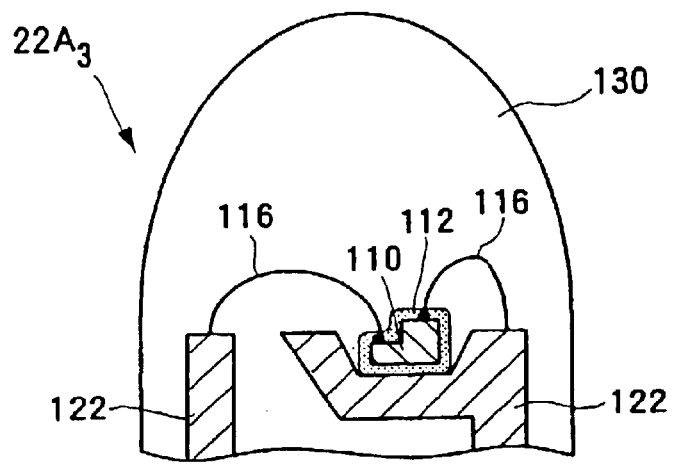
FIG. 49 is a sectional view showing an outline of a concrete example of the light source section 22A.

FIG. 49 is a sectional view showing the structure of an outline of a concrete example of the light source 22A. Specifically, in the light source 22A₃ shown in FIG. 49, the wavelength change material 112 is deposited on the surface of the light emitting element 110, the element 110 is mounted on the mounting material 122, and is molded by the resin 130. A lead frame or a stem can be used as the mounting material 122.

The foregoing light emitting element using gallium nitride for the light emitting layer as shown in FIG. 4 can also be used as the light emitting element. Moreover, the structure of the light emitting element may be the same as that of a light emitting diode or a semiconductor laser. The wavelength change material 112 is deposited on at least one part of the surface of the light emitting element 110. For example, a fluorescent substance which absorbs ultraviolet ray from the light emitting element 110 and produces lights of wavelengths in red (R), green (G) and blue (B) may be used as a material of the light emitting element. It is preferable that the absorption excitation peaks of them agrees with the wavelengths of the light emitted from the wavelength of the light emitting element.

The resin 130 has a light emitting surface formed as a lens. The light emitted from the light emitting element 110 and the wavelength change material 112 deposited on the element 110 can be converged and outputted by virtue of a lens effect. The light source 22A of the present invention has an advantage that the collection efficiency is very high for the light which has been subjected to the wavelength conversion.

Figure 50:
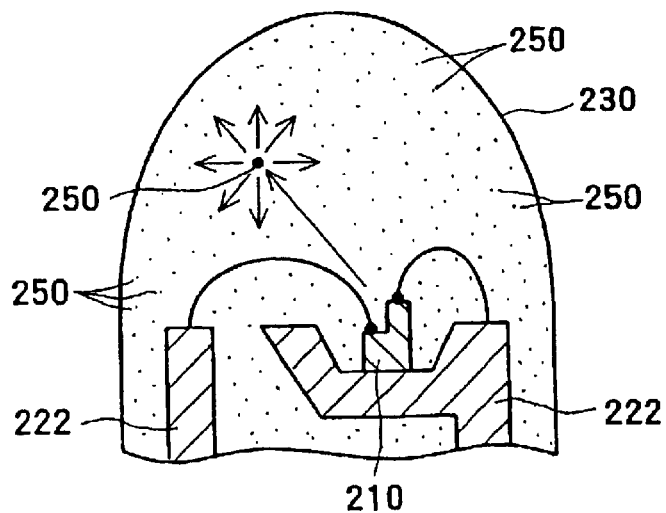
FIG. 50 is a sectional view showing an outline of a conventional light source, which is illustrated for comparison with the present invention.

FIG. 50 is a sectional view showing an outline of the conventional light source shown for comparison with the present invention. In the conventional light source shown in FIG. 50, the light emitting element 210 is mounted on the mounting material 222, and is molded with resin 230. Moreover, resin 230 has a light extracting plane formed to be lens-like so that resin 230 converges the light from the light emitting element 210 and outputs it. Moreover, in order to convert the wavelength of the light emitted from the light emitting element 230 or in order to compensate a color to the emitted light, a fluorescent substance for converting the wavelength of the light from the light emitting element 210 is mixed into the resin 230. Or, a filter substance 250 for absorbing range of a designated wavelength of light emitted from the element 210 is mixed into the resin 230. In many cases, these wavelength conversion substances 250 are mixed with even distribution into the resin 230.

However, when wavelength conversion substances 250 are mixed into resin 230, light will be emitted from each of the wavelength conversion substances 250 distributed evenly in the resin 230. Specifically, the arrows shown in the drawing schematically shows the state where after the light from the light emitting element collides against the wavelength conversion substance 250, and the wavelength converted light is scattering. These scattered lights are not converged by the lens because the positional relations of the lights with respect to the lens formed on the entire surface of the resin 230 are at random. Therefore, the convergence efficiency is extremely lowered so that luminance is reduced. In addition, when the wavelength change substance 250 is distributed evenly into the resin 230, a ratio of the lights passing through gaps between the wavelength change substances 250 increases so that the wavelength conversion efficiency is extremely low.

Compared to the conventional light source, in the light source 22A3 according to the present invention as shown in FIG. 49, the wavelength conversion material 112 is deposited on the surface of the light emitting element 110 so that the light that has been subjected to wavelength conversion is effectively converged by the front surface of the lens of the resin 130. Moreover, since the wavelength conversion material 112 is deposited directly on the surface of the light emitting element 110, the wavelength conversion efficiency is extremely high and the ratio of the lights which are to be subjected to the wavelength conversion can be easily controlled depending on the area that the wavelength change material 112 is deposited.

According to the present invention, the light emitted from the light emitting element 110 can be combined with the wavelength conversion material with a high efficiency so the luminance is greatly increased.

For example, when the gallium nitride type light emitting element is used as the light source element 110 and the fluorescent substance which absorbs the ultraviolet ray from the light emitting element 110 and produces the lights having the wavelengths at the red (R), green (G) and blue (B) color range is used as the wavelength change material 112, the light source emitting a white color of a high luminance can be realized. Such white color light source can be used as a high luminance light source, instead of the existing cold cathode fluorescent tube.

Figure 51:
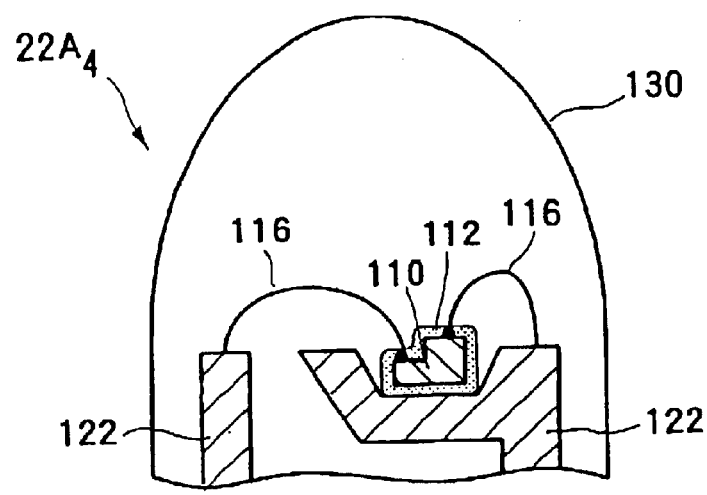
FIG. 51 is a sectional view showing an outline of a concrete example of the light source 22A.

FIG. 51 is a sectional view showing an outline of a concrete example of the light source 22A. Specifically, in the light source 22A₄, the light source element 110, the surface of which the wavelength change material 112 is deposited on, is mounted on the mounting material 122 such as a lead frame and a stem, and the light source element 110 is molded by the resin 130. As the light emitting element, a light emitting element which uses gallium nitride producing a blue color light as a light emitting layer can be used. Moreover, the structure of the light emitting element may be the same as that of a light emitting diode or a semiconductor laser.

The wavelength change material 112 is deposited on at least one part of the surface of the light emitting element 110. A fluorescent substance which absorbs a blue color light from the light emitting element 110 and produces lights having a wavelength at either a red (R) or green (G) color range, can be used as a substance of the wavelength change material 112. An organic fluorescent substance should preferably be used as such fluorescent substance, from the point of view of its high wavelength conversion efficiency.

The light source 22A, has an ability to simultaneously obtain the blue light colored light from the light emitting element 110 and the red and green colored lights from the wavelength change material 112. Thereafter, the light source 22A, can replace an existing white color light source.

Figure 52:
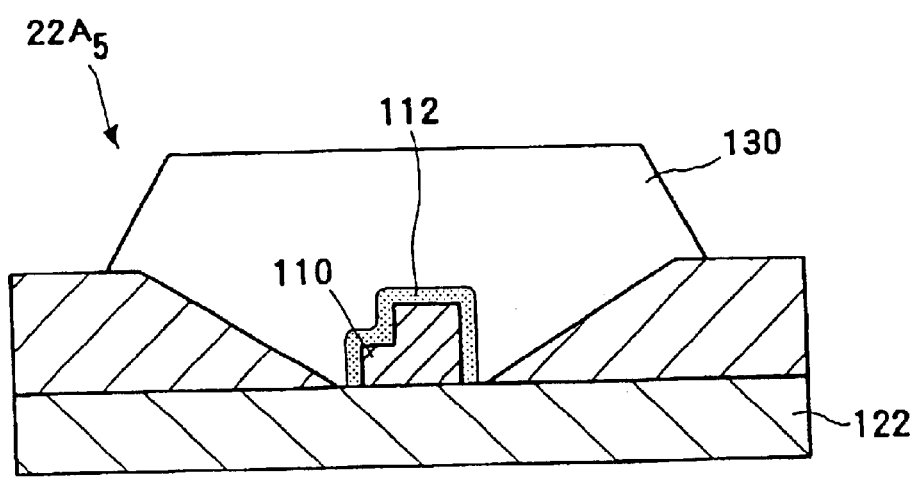
FIG. 52 is a sectional view showing an outline of a concrete example of the light source 22A.

FIG. 52 is a sectional view showing an outline of a concrete example of the light source 22A. Specifically, in FIG. 52, as the light source 22A5, an SMD lamp is shown, which comprises the light emitting element 110 mounted on the mounting material 122, which the wavelength change material 112 is deposited on the surface of the light emitting element 110, and the resin 130 molding the light emitting element 110 interposing the wavelength change material 112. A substrate or a lead frame can be, for example, used as the mounting member 122.

As the light emitting element 110, the light emitting element using gallium nitride as a light emitting layer, described in FIG. 4, is used, which emits the light with the wavelength in the ultraviolet ray range. The structure of the element 110 may be the same as those of a light emitting diode or a semiconductor laser.

The wavelength change material 112 is deposited on at least one part of the surface of the light emitting element 110. For a material of the wavelength change material 112, a fluorescent substance which absorbs a light of a wavelength in the ultraviolet ray range and emits lights of wavelengths of red (R), green (G) and blue (B) color ranges is employed. As such fluorescent substance, the fluorescent substance exhibiting the absorption characteristic shown in FIG. 5 should be employed, from the point of view of its high wavelength conversion efficiency.

A light emitting element emitting a blue colored light is used as the light emitting element 110. As the wavelength conversion material 112, an organic fluorescent substance may also be used, which absorbs a blue color light and emits lights of wavelengths at red (R), blue (B) and green (G) color ranges.

The light source $22A_5$, is small in size, and is capable of obtaining lights of high luminance at red (R), green (G) and blue (B) color ranges. Therefore, the light source $22A_5$ can replace the existing white color light source.

Figure 53:
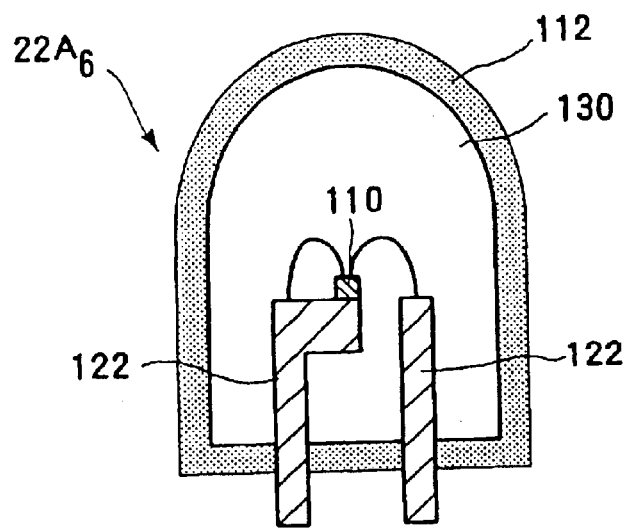
FIG. 53 is a sectional view showing an outline of a concrete example of the light source 22A.

FIG. 53 is a sectional view showing an outline of a concrete example of the light source 22A. Specifically, in FIG. 53, as the light source $22A_6$, the LED lamp, the surface of which the wavelength conversion material 112 is deposited on, is shown. This LED lamp has a constitution that the light emitting element 110 is mounted on the mounting material 122 such as a lead frame and a stem or the element 110 is molded by the resin 130.

As the light emitting element 110, the light emitting element using gallium nitride as the light emitting layer which emits the ultraviolet ray light, as described in FIG. 4, is used. Moreover, the structure of the element 110 may be the same as those of a light emitting diode or a semiconductor laser.

The wavelength change material 112 is deposited on at least one part of the surface of resin 130. A material of the wavelength conversion material 130 is a fluorescent substance which absorbs a ultraviolet light from the light emitting element 110 and emits lights of wavelengths at red (R), green (G) and blue (B) color regions. As such fluorescent substance, a fluorescent substance which exhibits the absorption characteristic shown in FIG. 5 should be employed from the point of view of its high wavelength change efficiency.

As the light emitting element 110, a light emitting element emitting a blue colored light is used. As the wavelength change material 112, an organic fluorescent substance may be also used, which absorbs blue colored light and emits lights of wavelengths at red (R), blue (B) and green (G) color ranges.

The light source $22A_6$ can be easily manufactured and is small in size, and is capable of obtaining lights of high luminance at red (R), green (G) and blue (B) color range. Therefore, the light source $22A_6$ can replace the existing white color light source.

Figure 54:
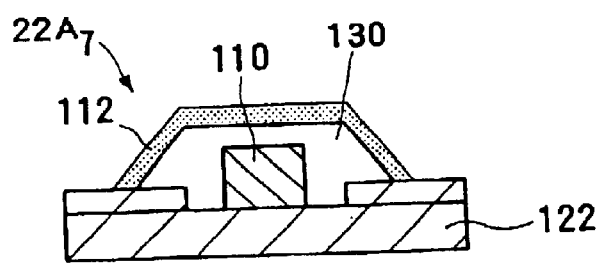
FIG. 54 is a sectional view showing an outline of a concrete example of the light source 22A.

FIG. 54 is a sectional view showing an outline of a concrete example of the light source 22A. Specifically, in FIG. 54, an SMD lamp has a surface on which the wavelength change material 112 is deposited, is shown as the light source $22A_7$. This SMD lamp has a constitution that the light emitting element 110 is mounted on the mounting material 122 such as a substrate and the element 110 is molded by the resin 130.

As the light emitting element 110, the light emitting element using gallium nitride as the light emitting layer which emits the light of the ultraviolet ray, as described in FIG. 4, is used. Moreover, the structure of the element 110 may be the same as those of a light emitting diode or a semiconductor laser.

The wavelength conversion material 112 is deposited on at least one part of the surface of the resin 130. A material of the wavelength conversion material 112 is a fluorescent substance which absorbs a ultraviolet light from the light emitting element 110 and emits lights of wavelengths at red (R), green (G) and blue (B) color regions. As such fluorescent substance, a fluorescent substance which exhibits the absorption characteristic shown in FIG. 5 should be employed from the point of view of its high wavelength conversion efficiency.

As the light emitting element 110, a light emitting element emitting a blue colored light is used. As the wavelength conversion material 112, an organic fluorescent substance may be also used, which absorbs blue colored light and emits lights of wavelengths at red (R), blue (B) and green (G) color regions.

The light source $22A_7$ can be easily be manufacture and is small in size, and is capable of obtaining lights of high luminance at red (R), green (G) and blue (B) color regions. Therefore, the light source $22A_5$ can replace the existing white color light source.

Figure 55:
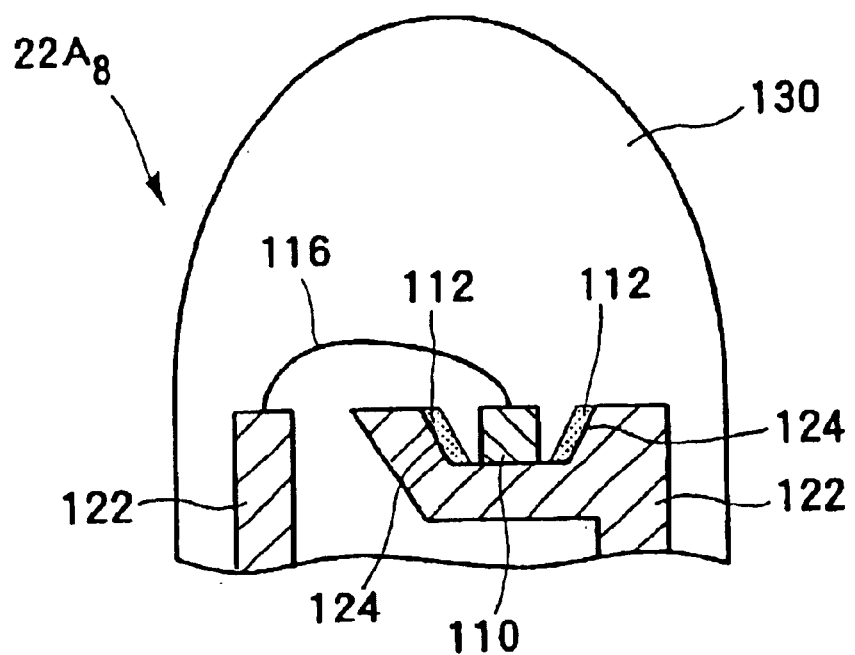
FIG. 55 is a sectional view showing an outline of a concrete example of the light source 22A.

FIG. 55 is a sectional view showing an outline of a concrete example of the light source 22A. Specifically, in FIG. 55, as the light source $22A_8$, an LED lamp, in which the wavelength conversion-material 112 is deposited on the surface of the reflection plate 124 of the lead frame 122, is shown. Specifically, this LED lamp has a constitution that the light emitting element 110 is mounted on the mounting material 122 such as a substrate and the element 110 is molded by the resin 130.

As the light emitting element 110, the light emitting element using gallium nitride as the light emitting layer which emits the light of the ultraviolet ray, as described in FIG. 4, is used. Moreover, the structure of the element 110 may be the same as those of a light emitting diode or a semiconductor laser.

The wavelength conversion material 112 is deposited on at least one part of the surface of reflection plates 124 of the lead frame 122. A material of the wavelength conversion material 112 is a fluorescent substance which absorbs ultraviolet light from the light emitting element 110 and emits lights of wavelengths of red (R), green (G) and blue (B) color range. As such fluorescent substance, a fluorescent substance which exhibits the absorption characteristic shown in FIG. 5 should be employed from the point of view of its high wavelength conversion efficiency.

As the light emitting element 110, a light emitting element emitting a blue color light is used. As the wavelength change material 112, an organic fluorescent substance may be also used, which absorbs a blue color light and emits lights of wavelengths of red (R) and green (G) color ranges.

The light source $22A_8$ can be easily manufactured and is small in size, and is capable of obtaining lights of high luminance at red (R), green (G) and blue (B) color ranges. Therefore, the light source $22A_8$ can replace the existing white color light source.

Figure 56:
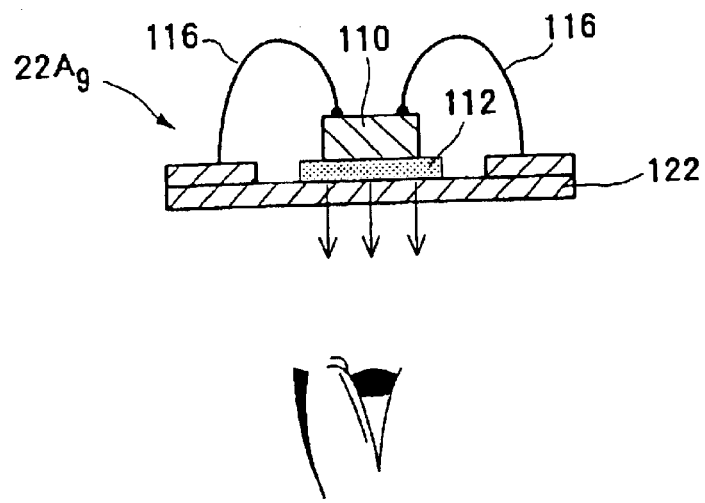
FIG. 56 is a sectional view showing an outline of a concrete example of the light source 22A.

FIG. 56 is a sectional view showing an outline of a concrete example of the light source 22A. Specifically, in FIG. 56, a light source $22A_9$ is shown, in which the wavelength conversion material 112 is deposited on the light transmission substrate 122 and the light emitting element 110 is deposited on the wavelength change material 112. Here, in the light source 22A, for example, a designated wire pattern may be formed on the light transmission substrate 122 and a wire 116 may connect the substrate 122 and light emitting element 110.

As the light emitting element 110, the light emitting element using gallium nitride as the light emitting layer which emits the light of the ultraviolet ray, as described in FIG. 4, is used. Moreover, the structure of the element 110 may be the same as those of a light emitting diode and a semiconductor laser.

The wavelength conversion material 112 is deposited on at least one part of a facing region between the light emitting element 110 and the light transmission substrate 122. A material of the wavelength conversion material is a fluorescent substance which absorbs an ultraviolet ray light from the light emitting element 110 and emits lights of wavelengths at red (R), green (G) and blue (B) color regions. As such fluorescent substance, the fluorescent substance exhibiting the absorption characteristic as shown in FIG. 5 should be used from the point of view of its high wavelength-conversion efficiency.

As the light emitting element 110, a light emitting element emitting a blue color light is used. As the wavelength conversion material 112, an organic fluorescent substance may be also used, which absorbs a blue color light and emits lights of wavelengths at red (R) and green (G) color regions. In the light source $22A_9$, the light emitted from the light emitting element 110 is converted to a light of a designated wavelength in the wavelength conversion material 112, and passes through the light transmission substrate 122. Finally, the light is extracted out to the outside.

The light source $22A_9$ can also be easily manufactured, and is small in size. Particularly, the thickness of the light source $22A_9$ can be made thin. In addition, the light source $22A_9$ is capable of obtaining lights of high luminance at red (R), green (G) and blue (B) color lights. Therefore, the light source $22A_9$ can replace the existing white color light source.

Figure 57:
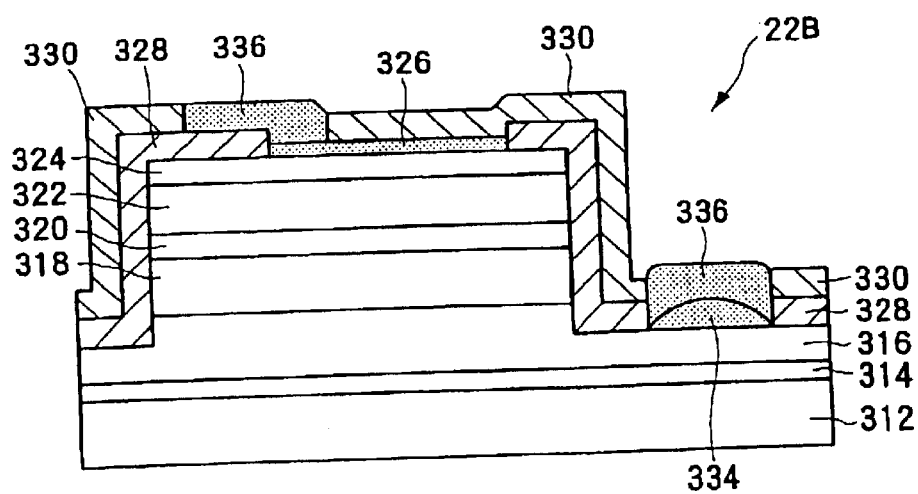
FIG. 57 is a sectional view showing an outline of a concrete example of the light source of the image display device according to the present invention.

FIG. 57 is a sectional view showing an outline of a concrete example of the light source of the image display device according to the present invention. The light source 22B shown in FIG. 57 shows a light emitting element 22B using a gallium nitride type compound semiconductor. The light emitting element 22B comprises a semiconductor multilayered structure which includes a pn-junction stacked on a substrate 312. On the substrate 312, a buffer layer 314, an n-type contact layer 316, an n-type clad layer 318, an activation layer 320, a p-type clad layer 322 and a p-type contact layer 324 are formed in this order. The p-type layers and n-type layers may be stacked on the substrate 312 in a reversed order. On the p-type contact layer 324, a transparent electrode layer 326 is deposited. In addition, on the n-type contact layer 316, an n-type electrode layer 334 is deposited.

When a current is supplied to the light emitting element 22B of such structure, a light of a wavelength at a blue color range or an ultraviolet range centering around the activation layer 320 can be obtained.

Here, the present invention is characterized in that a wavelength conversion material is mixed into at least one of the foregoing substrate 312, buffer layer 314, n-type contact layer 316, n-type clad layer 318, activation layer 320, p-type clad layer 322, p-type contact layer 324 and transparent electrode layer 326. For example, a fluorescent substance can be mentioned as such wavelength conversion material.

Such mixing can be realized by adding the wavelength conversion material into each of the layers as impurities at the time of crystal growth of the layers. Specifically, as an example, the wavelength conversion material can be mixed by vaporizing a fluorescent substance at the time of crystal growth. Moreover, a phosphor may be injected into the substrate 312 in the form of ions.

Phosphors as an insulating film 328 and a protection film 330 may be deposited by a sputtering method or an electron beam deposition method. Moreover, phosphor films may be deposited between the insulating film 328 and the semiconductor layer, or between the protection layer 330 and the semiconductor layer, using the sputtering method or the electron beam deposition method. Moreover, the phosphor may be added to the insulating film 328 and the protection film 330. In addition, the phosphors may be deposited on the surfaces of the insulating film 328 and protection film 330.

When the activation layer 320 emits a light of a wavelength at an ultraviolet region, the employed phosphors should be the ones which absorb an ultraviolet light and emit lights of red (R), green (G) and blue (B) colors, respectively. On the other hand, when the activation layer 320 emits a light of a wavelength at a blue color region, the phosphors should be the ones which absorb the blue color light and emit red (R) and green (G) color lights, respectively since an organic phosphor particularly exhibits a high wavelength conversion efficiency for the blue color light, it should be preferably be used as a wavelength change material to be mixed. As such organic phosphor, rhodamine B can be mentioned for the one emitting a red color light, and brilliantsulfoflavine FF can be mentioned for the one emitting a green color.

As described above, by arranging the wavelength conversion material in any position that constitute the semiconductor light emitting element, the wavelength conversion with a high efficiency can be realized in a bare chip state.

Figure 58:
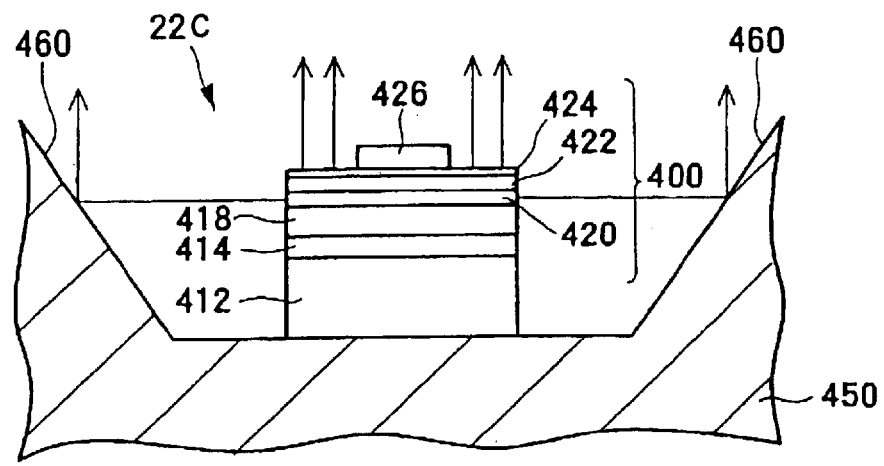
FIG. 58 is a sectional view showing an outline of a concrete example of the light source 22A.

FIG. 58 is a sectional view showing an outline of the structure of a concrete example of the light source of the image display device of the present invention. In the light source 22C, the light emitting element 400 using an indium/gallium/aluminum/phosphor type compound semiconductor is mounted on the mounting material 450. The light emitting element 400 has a semiconductor multilayered structure including a pn-junction which is stacked on a gallium arsenic substrate 412. On the substrate 412, the buffer layer 414, the n-type clad layer 418, the activation layer 420, the p-type clad layer 422 and the p-type contact layer 424 are formed in this order. Each of the p-type layers and each of the n-type layers may be stacked on the substrate in a reverse order. On the p-type contact layer 424, the p-type layer side electrode layer 426 is stacked.

When a electric current is supplied to the light emitting element 400 with such a structure, light in the green color range centering around the activation layer 420 is emitted from an upper surface of the light emitting element 400. Moreover, at the same time, a light of a wavelength in the red color range is emitted from the side surface of the light emitting element 400.

Here, in the present invention, the mounting material 450 comprises a reflection plate 460. The light source is designed so that red colored light emitted from the side surface of the light emitting element 400 is reflected by the reflection plate 460 upward and the red colored light is allowed to be extracted together with the green color light. As described above, the red color light emitted from the side surface of the light emitting element 400 is utilized, whereby the light source 22C can be used as a red (R) and green (G) light source. Therefore, by combing the light source 22C with the blue color light emitting element, three lights of red (R), green (G) and blue (B) colors can be obtained with the two light emitting elements.

Figure 59:
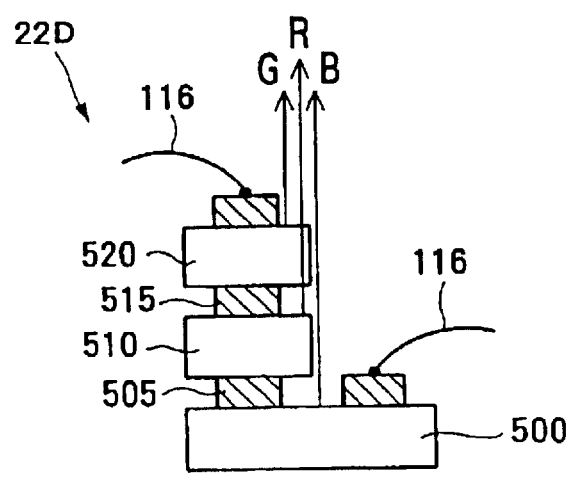
FIG. 59 a sectional view showing an outline of a concrete example of the light source 22A.

FIG. 59 is a sectional view showing an outline of the structure of a concrete example of the light source of the image display device according to the present invention. The light source 22D shown in FIG. 59 shows an example in which a small sized light of multi-wavelength is constituted by stacking light emitting elements emitting lights of wavelengths different from each other.

Specifically, in the light source 22D shown in FIG. 59, the red color light emitting element 510 is stacked over the blue color light emitting element 500 interposing the connection means 505, and the green color light emitting element 520 is stacked over the red color light emitting element 510 interposing the connection means 515. Here, as the connection means, metals such as gold and indium can be used for example. Moreover, the light emitting elements may be connected to each other by insulating materials, and may be electrically connected by wirings.

When a current is supplied to the light emitting elements stacked on another, the blue color light from the blue color light emitting element 500 can be extracted upward without being shaded by other light emitting elements, as shown by the arrow of FIG. 59. Moreover, from the red color light from the red color light emitting element 510, can be transmitted through the green color light element 520, and the light can be extracted upward. And the green color light from the green color light emitting element 520 can be extracted upward without being shaded by the light emitting elements.

By stacking the light emitting elements emitting the three colors, respectively, the small sized light source with a high luminance can be realized.

Figure 60:
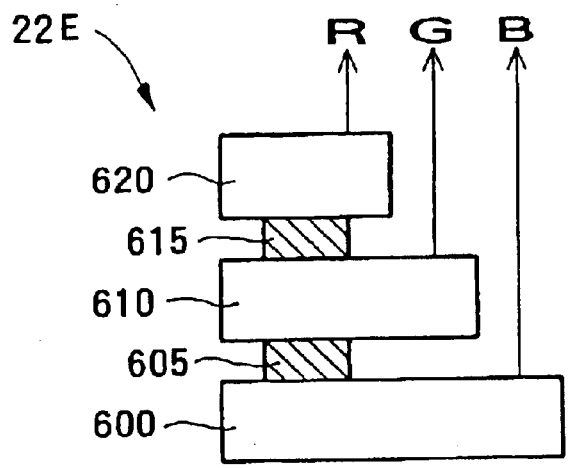
FIG. 60 is a sectional view showing an outline of a concrete example of the light source of the image display device according to the present invention.

FIG. 60 is a sectional view showing an outline of the structure of a concrete example of the light source of the image display device according to the present invention. The light source 22E shown in FIG. 60 shows another example of a small sized multi-wavelength type light source, which is constituted by stacking light emitting elements which emit lights of wavelengths different from each other.

Specifically, in the light source 22E shown in FIG. 60, the green color light emitting element 610 is stacked over the blue color light emitting element 600 interposing the connection means 605, and the red color light emitting element 620 is stacked over the green color light emitting element 610 interposing the connection means 615. As connection means, metals such as gold and indium can be used, for example. Moreover, the elements may be connected by insulating materials and be electrically connected by wirings.

Here, in the light source 22E, the light emitting elements are stacked by shifting each of their light emission portions from others so that the lights from the light emitting elements can be extracted upward without shading the light from other light emitting elements.

When electric current is supplied to the light emitting elements stacked described above, all of the light from the light emitting elements can be extracted upward without being shaded, as shown by the arrows in FIG. 60.

By stacking the light emitting elements, each emitting one of red (R), green (G) and blue (B) colors, the small sized light source with a high luminance can be realized.

Figure 61:
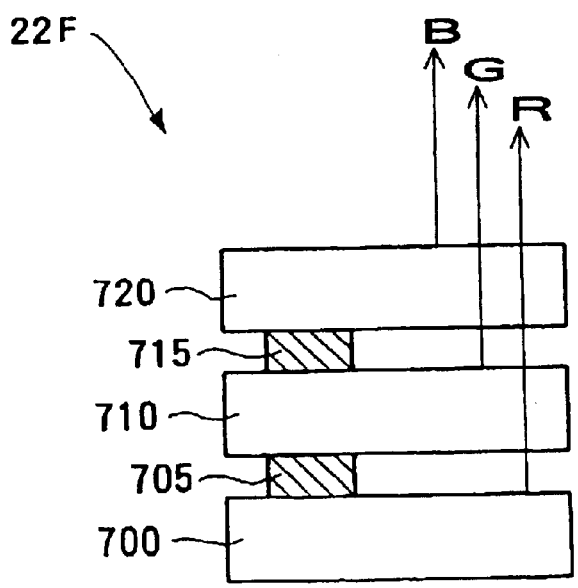
FIG. 61 is a sectional view showing an outline of a concrete example of the light source of the image display device according to the present invention.

FIG. 61 is a sectional view showing an outline of a concrete example of the light source of the image display device according to the present invention. The light source 22F shown in FIG. 61 shows another example of a small sized multi-wavelength type light source which is constituted by stacking light emitting elements, each emitting a light of a wavelength different from each other.

Specifically, in the light source 22F shown in FIG. 61, the green color light emitting element 710 is stacked over the red color light emitting element 700 interposing the connection means 705, and the blue color light emitting element 720 is stacked over the green color light emitting element 710 interposing the connection means 715. As connection means, metals such as gold and indium, for example, can be used. Moreover, the light emitting element may be connected by insulating materials and be electrically connected by wirings (not shown). When gallium nitride type semiconductor element is used as the blue color light emitting element 720, an insulating sapphire is, in many cases, selected as a substrate (not shown). Therefore, when such gallium nitride type semiconductor element is used, the light source 22F should be made by providing a connection hole in the substrate to electrically connect the light source element 720 to the light source element 710 disposed below, or, alternatively, an electrical wiring should be formed. Moreover, when an element using a silicon carbide type material is adopted as the blue color light emitting element 720, an electrical connection between the upper and lower light emitting elements 720 and 710 can be secured by the connection means 715 because of an electrical conductivity thereof.

When electric current is supplied to the light emitting elements 700, 710 and 720 stacked as described above, the red colored light emitted from the red color light emitting element 700 is transmitted through the green and blue color emitting elements 710 and 720 as shown by the arrow in FIG. 61, and the light can be extracted upward. This is because the materials constituting the green and blue color light emitting elements 710 and 720 have large band gaps so that the elements 710 and 720 possess very small absorption coefficients for the red color light. For a similar reason, the green colored light emitted from the green color light emitting element 710 is transmitted through the blue color light emitting element 720, whereby the light can be extracted upward. Moreover, the blue colored light emitted from the blue color light emitting element 720 can be extracted upward without being shaded. Thus, the red (R), green (G) and blue (B) color lights can be extracted at the upper part of the light source 22F.

As described above, by stacking each of the color light emitting elements emitting the red (R), green (G) and blue (B) color lights on another, a small sized light source with a high luminance can be realized.

Figure 62:
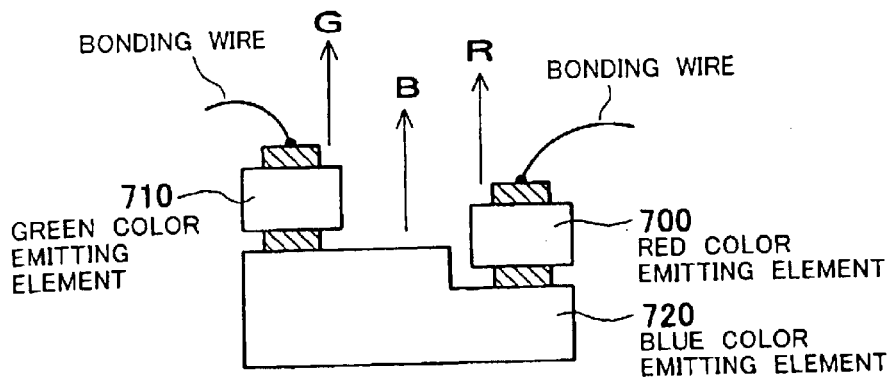
FIG. 62 is a sectional view showing an outline of a concrete example of the light source of the image display device according to the present invention.

FIG. 62 is a sectional view showing an outline of a concrete example of the light source of the image display device according to the present invention. The light source shown in FIG. 62 shows another example in case where a small sized multi-wavelength type light source is constituted by stacking the red and green color light emitting elements respectively on the blue color light emitting element.

Specifically, in the light source shown in FIG. 62, the green color light element 710 is stacked on an anode side of the blue color light emitting element 720, and red color light emitting element 700 is stacked on a cathode electrode side of the blue color light emitting element 720. The lights emitted from the light emitting elements can be extracted upward as shown in FIG. 62 without interference of the lights of others.

In such light source, mounting density of the light source elements can be increased, and mounting can be easily conducted because the elements need not be stacked in three layers. Moreover, since an n-up type high luminance red color light emitting diode formed of gallium/aluminum arsenic is mounted on the cathode of the blue color light emitting element 720, luminance is also greatly improved.

Figure 63:
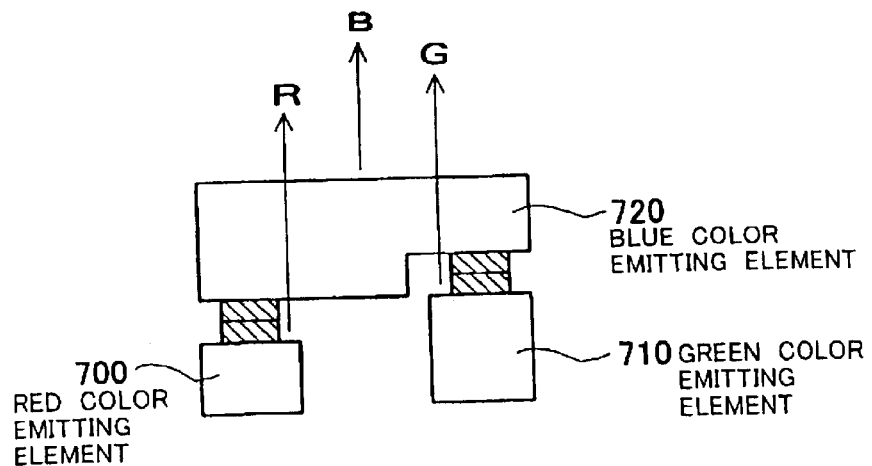
FIG. 63 is a sectional view showing an outline of a concrete example of the light source of the image display device according to the present invention.

FIG. 63 is a sectional view showing an outline of a concrete example of the light source of the image display device according to the present invention. The light source shown in FIG. 63 shows another example in a case where a small sized multi-wavelength type light source is constituted by stacking the blue color light emitting element 720 on the green and red color light emitting elements 710 and 700, respectively.

Specifically, in the light source shown in FIG. 63, an anode of the blue color light emitting element 720 is stacked on the red color light emitting element 700, and a cathode of the blue color light emitting element 720 is stacked on he green color light emitting element 710. The lights emitted from the red and green color light emitting elements are transmitted through a substrate of the blue color light emitting element upward and can be extracted.

In the light source constituted as described above, mounting density of the elements can be increased, and since the elements need not to be stacked in three layers, mounting of the elements can be easily conducted. Moreover, since an n-up type high luminance red color light emitting diode formed of gallium/aluminum arsenic can be used, the luminance can also be improved.

Moreover, since it is not necessary to use a bonding wire, assembly steps are simplified, resulting in an increase in reliability. Moreover, since the plane for extracting the light is disposed on the substrate side of the blue color light emitting element, the efficiency for light extracting of the blue color light emitting element is increased. Since the lights emitted from the red and green light emitting elements having comparatively small band gap are transmitted through the blue color light emitting element having a large band gap, the lights can be effectively extracted without being absorbed.

Figure 64:
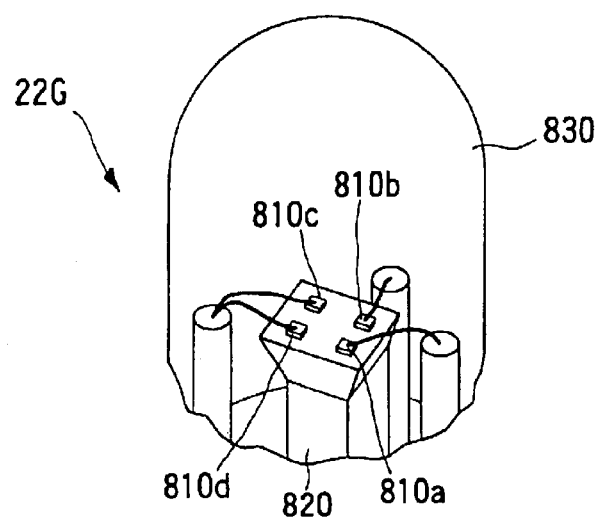
FIG. 64 is a sectional view showing an outline of a concrete example of the light source of the image display device according to the present invention.

FIG. 64 is a sectional view showing an outline of a concrete example of the light source of the image display device according to the present invention specifically, in FIG. 64, the LED lamp in which a plurality of light emitting elements are mounted is shown as the light source 22G. Specifically, the LED lamp has a constitution that the light emitting elements 810a, 810b, . . . , 810d emitting lights of wavelengths in red (R), green (G) and blue (B) color ranges are mounted on the mounting material 820 and molded by resin 830.

Specifically, in the example illustrated in FIG. 64, the LED lamps is shown, in which the red color light emitting element 810a, the blue color light emitting element 810b and the green color light emitting element 810c and 810d are mounted on the lead frame 820.

As described above, by installing the light emitting elements, each of which emits different colored light, in one package, the small sized light source with high luminance and reliability can be realized.

Moreover, the acquisition of the red (R), green (G) and blue (B) color lights with high luminance by the light source 22G replaces an existing white color light source.

Figure 65:
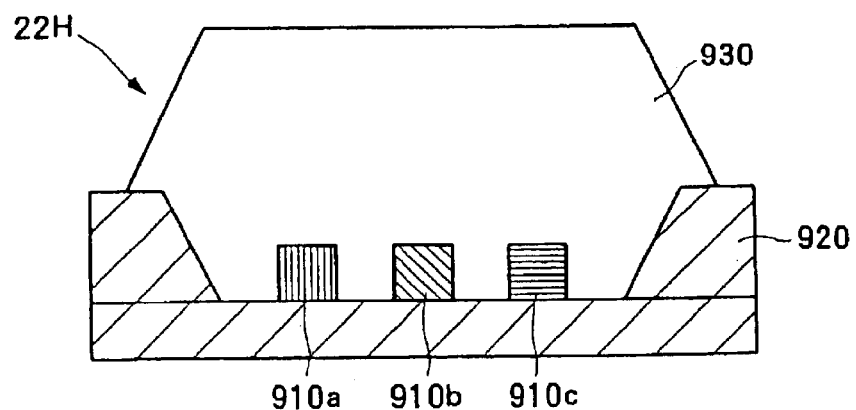
FIG. 65 is a sectional view showing an outline of a concrete example of the light source of the image display device according to the present invention.

FIG. 65 is a sectional view showing an outline of a concrete example of the light source of the image display device according to the present invention. Specifically, in FIG. 65, an SMD lamp, in which a plurality of light emitting elements are mounted, is shown as the light source 22H. The SMD lamp has a constitution that the light emitting elements 910a, 910b . . . each emitting one of the red (R), green (G) and blue (B) color lights, are mounted on the mounting material 920 and molded by resin 930.

In the example shown in FIG. 65, the SMD lamp is shown, in which the red color light emitting element 910a, the blue color light emitting element 910b and the green color light emitting element 910c and 910d (not shown) are mounted on the mounting material 920.

As described above, by installing the light emitting elements, each of which emits one of the red (R), green (G) and blue (B) color lights, in one package, the small sized light source with high luminance and reliability can be realized.

Moreover, the acquisition of the red (R), green (G) and blue (B) color lights with high luminance by the light source 22H replaces an existing white color light source.

Obviously, numerous modifications and variations of the present invention are possible in light of the above teachings. It is therefore to be understood that within the scope of the appended claims, the invention may be practiced otherwise than as specifically described herein.

What is claimed as new and is desired to be secured by Letters Patent of the United States is:

1. A light emission device comprising:
   a plurality of light emitting diodes emitting lights at different wavelengths and stacked in an order such that at least one of said light emitting diodes is disposed closer to a light extracting portion of said light emission device; and
   at least one of said light emitting diodes transmits light through at least one other of said light emitting diodes, at least one of said light emitting diodes being of GaN type, wherein
   said plurality of light emitting diodes includes,
   a red diode having a peak wavelength emission in a red color visible light,
   a blue diode having a peak wavelength emission in a blue color visible light, said blue diode being of GaN type and a green diode having a peak wavelength emission in a green color visible light;

said light emitting diodes are stacked in an order such that said green diode is stacked over said red diode; and said red diode is stacked over said blue diode and light emitted from said red diode is transmitted through said green diode.

2. A light emission device comprising:

a plurality of light emitting diodes emitting lights at different wavelengths and stacked in an order such that at least one of said light emitting diodes is disposed closer to a light extracting portion of said light emission device; and at least one of said light emitting diodes transmits light through at least one other of said light emitting diodes, at least one of said light emitting diodes being of GaN type, wherein:

said plurality of light emitting diodes includes, a red diode having a peak wavelength emission in a red color visible light, a blue diode having a peak wavelength emission in a blue color visible light, and a green diode having a peak wavelength emission in a green color visible light;

each of said red, green, and blue diodes having anode and cathode sides;

said light emitting diodes are stacked such that said green diode is stacked on the anode side of said blue diode and said red diode is stacked on the cathode side of said blue diode; and at least some lights are emitted from each of said red, green, and blue diodes without passing through diodes emitting light of a different color from other of said light emitting diodes.

3. A light emission device comprising:

a plurality of light emitting diodes emitting lights at different wavelengths and stacked in an order such that at least one of said light emitting diodes is disposed closer to a light extracting portion of said light emission device; and at least one of said light emitting diodes transmits light through at least one other of said light emitting diodes, at least one of said light emitting diodes being of GaN type, wherein:

said plurality of light emitting diodes includes, a red diode having a peak wavelength emission in a red color visible light, a blue diode having a peak wavelength emission in a blue color visible light, and a green diode having a peak wavelength emission in a green color visible light;

each of said red, green, and blue diodes having anode and cathode sides;

said light emitting diodes are stacked such that the anode side of said blue diode is stacked on said red diode, and the cathode side of said blue diode is stacked on said green diode; and lights emitted from plural of said red and green diodes are transmitted through said blue diode.

* * * * *